US007825688B1

(12) United States Patent
Snyder et al.

(10) Patent No.: US 7,825,688 B1
(45) Date of Patent: *Nov. 2, 2010

(54) PROGRAMMABLE MICROCONTROLLER ARCHITECTURE(MIXED ANALOG/DIGITAL)

(75) Inventors: Warren Snyder, Snohomish, WA (US); Monte Mar, Issaquah, WA (US)

(73) Assignee: Cypress Semiconductor Corporation, San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/799,439

(22) Filed: Apr. 30, 2007

Related U.S. Application Data

(63) Continuation of application No. 10/803,030, filed on Mar. 16, 2004, now Pat. No. 7,221,187.

(51) Int. Cl.
*H01L 25/00* (2006.01)
*H03K 19/177* (2006.01)
(52) U.S. Cl. .............................. 326/41; 326/39; 326/47
(58) Field of Classification Search ............. 326/39–41, 326/47
See application file for complete search history.

(56) References Cited

U.S. PATENT DOCUMENTS

| | | |
|---|---|---|
| 3,600,690 A | 8/1971 | White |
| 3,725,804 A | 4/1973 | Langan |
| 3,740,588 A | 6/1973 | Stratton et al. |
| 3,805,245 A | 4/1974 | Brooks et al. |
| 3,810,036 A | 5/1974 | Bloedorn |
| 3,831,113 A | 8/1974 | Ahmed |

(Continued)

FOREIGN PATENT DOCUMENTS

DE 19710829 A1 9/1998

(Continued)

OTHER PUBLICATIONS

U.S. Appl. No. 09/909,045, filed Jul. 18, 2001, Snyder.

(Continued)

*Primary Examiner*—Anh Q Tran

(57) ABSTRACT

A microcontroller with analog/digital Programmable System On-a-Chip (PSoC) architecture including multiple digital PSoC blocks and multiple analog PSoC blocks in a communication array having a programmable interconnect structure. The single chip design is implemented by integration of programmable digital and analog circuit blocks that are able to communicate with each other. Robust analog and digital blocks that are flash memory programmable can be utilized to realize complex design applications that otherwise would require multiple chips and/or separate applications. The PSoC architecture includes a novel array having programmable digital blocks that can communicate with programmable analog blocks using a programmable interconnect structure. The programmable analog array contains a complement of Continuous Time (CT) blocks and a complement of Switched Capacitor (SC) blocks that can communicate together. The analog blocks consist of multi-function circuits programmable for one or more different analog functions, and fixed function circuits programmable for a fixed function with variable parameters. The digital blocks include standard multi-function circuits and enhanced circuits having functions not included in the standard digital circuits. The PSoC array is programmed by flash memory and programming allows dynamic reconfiguration. That is, "on-the-fly" reconfiguration of the PSoC blocks is allowed. The programmable analog array with both Continuous Time analog blocks and Switched Capacitor analog blocks are offered on a single chip along with programmable digital blocks. The programmable interconnect structure provides for communication of input/output data between all analog and digital blocks.

20 Claims, 4 Drawing Sheets

U.S. PATENT DOCUMENTS

| | | |
|---|---|---|
| 3,845,328 A | 10/1974 | Hollingsworth |
| 3,940,760 A | 2/1976 | Brokaw |
| 4,061,987 A | 12/1977 | Nagahama |
| 4,134,073 A | 1/1979 | MacGregor |
| 4,138,671 A | 2/1979 | Comer et al. |
| 4,176,258 A | 11/1979 | Jackson |
| 4,250,464 A | 2/1981 | Schade, Jr. |
| 4,272,760 A | 6/1981 | Prazak et al. |
| 4,283,713 A | 8/1981 | Philipp |
| 4,326,135 A | 4/1982 | Jarrett et al. |
| 4,344,067 A | 8/1982 | Lee |
| 4,380,083 A | 4/1983 | Andersson et al. |
| 4,438,404 A | 3/1984 | Philipp |
| 4,475,151 A | 10/1984 | Philipp |
| 4,497,575 A | 2/1985 | Philipp |
| 4,604,363 A | 8/1986 | Newhouse et al. |
| 4,608,502 A | 8/1986 | Dijkmans et al. |
| 4,656,603 A | 4/1987 | Dunn |
| 4,670,838 A | 6/1987 | Kawata |
| 4,689,740 A | 8/1987 | Moelands et al. |
| 4,692,718 A | 9/1987 | Roza et al. |
| 4,701,907 A | 10/1987 | Collins |
| 4,727,541 A | 2/1988 | Mori et al. |
| 4,736,097 A | 4/1988 | Philipp |
| 4,740,966 A | 4/1988 | Goad |
| 4,755,766 A | 7/1988 | Metz |
| 4,773,024 A | 9/1988 | Faggin et al. |
| 4,794,558 A | 12/1988 | Thompson |
| 4,802,103 A | 1/1989 | Faggin et al. |
| 4,802,119 A | 1/1989 | Heene et al. |
| 4,807,183 A | 2/1989 | Kung et al. |
| 4,809,345 A | 2/1989 | Tabata et al. |
| 4,812,684 A | 3/1989 | Yamagiwa et al. |
| 4,813,013 A | 3/1989 | Dunn |
| 4,827,401 A | 5/1989 | Hrustich et al. |
| 4,831,546 A | 5/1989 | Mitsuta et al. |
| 4,833,418 A | 5/1989 | Quintus et al. |
| 4,868,525 A | 9/1989 | Dias |
| 4,876,466 A | 10/1989 | Kondou et al. |
| 4,876,534 A | 10/1989 | Mead et al. |
| 4,878,200 A | 10/1989 | Asghar et al. |
| 4,879,461 A | 11/1989 | Philipp |
| 4,879,688 A | 11/1989 | Turner et al. |
| 4,885,484 A | 12/1989 | Gray |
| 4,907,121 A | 3/1990 | Hrassky |
| 4,935,702 A | 6/1990 | Mead et al. |
| 4,939,637 A | 7/1990 | Pawloski |
| 4,942,540 A | 7/1990 | Black et al. |
| 4,947,169 A | 8/1990 | Smith et al. |
| 4,953,928 A | 9/1990 | Anderson et al. |
| 4,962,342 A | 10/1990 | Mead et al. |
| 4,964,074 A | 10/1990 | Suzuki et al. |
| 4,969,087 A | 11/1990 | Tanagawa et al. |
| 4,970,408 A | 11/1990 | Hanke et al. |
| 4,972,372 A | 11/1990 | Ueno |
| 4,977,381 A | 12/1990 | Main |
| 4,980,652 A | 12/1990 | Tarusawa et al. |
| 4,999,519 A | 3/1991 | Kitsukawa et al. |
| 5,043,674 A | 8/1991 | Bonaccio et al. |
| 5,049,758 A | 9/1991 | Mead et al. |
| 5,050,168 A | 9/1991 | Paterson |
| 5,053,949 A | 10/1991 | Allison et al. |
| 5,055,827 A | 10/1991 | Phillipp |
| 5,059,920 A | 10/1991 | Anderson et al. |
| 5,068,622 A | 11/1991 | Mead et al. |
| 5,073,759 A | 12/1991 | Mead et al. |
| 5,083,044 A | 1/1992 | Mead et al. |
| 5,088,822 A | 2/1992 | Warren |
| 5,095,284 A | 3/1992 | Mead |
| 5,097,305 A | 3/1992 | Mead et al. |
| 5,099,191 A | 3/1992 | Galler et al. |
| 5,107,146 A | 4/1992 | El-Ayat |
| 5,107,149 A | 4/1992 | Platt et al. |
| 5,109,261 A | 4/1992 | Mead et al. |
| 5,119,038 A | 6/1992 | Anderson et al. |
| 5,120,996 A | 6/1992 | Mead et al. |
| 5,122,800 A | 6/1992 | Phillipp |
| 5,126,685 A | 6/1992 | Platt et al. |
| 5,127,103 A | 6/1992 | Hill et al. |
| 5,128,871 A | 7/1992 | Schmitz |
| 5,136,188 A | 8/1992 | Ha et al. |
| 5,140,197 A | 8/1992 | Grider |
| 5,142,247 A | 8/1992 | Lada et al. |
| 5,144,582 A | 9/1992 | Steele |
| 5,146,106 A | 9/1992 | Anderson et al. |
| 5,150,079 A | 9/1992 | Williams et al. |
| 5,155,836 A | 10/1992 | Jordan et al. |
| 5,159,292 A | 10/1992 | Canfield et al. |
| 5,159,335 A | 10/1992 | Veneruso |
| 5,160,899 A | 11/1992 | Anderson et al. |
| 5,161,124 A | 11/1992 | Love |
| 5,165,054 A | 11/1992 | Platt et al. |
| 5,166,562 A | 11/1992 | Allen et al. |
| 5,175,884 A | 12/1992 | Suarez |
| 5,179,531 A | 1/1993 | Yamaki |
| 5,184,061 A | 2/1993 | Lee et al. |
| 5,198,817 A | 3/1993 | Walden et al. |
| 5,200,751 A | 4/1993 | Smith |
| 5,202,687 A * | 4/1993 | Distinti ..................... 341/158 |
| 5,204,549 A | 4/1993 | Platt et al. |
| 5,206,582 A | 4/1993 | Ekstedt et al. |
| 5,220,512 A | 6/1993 | Watkins et al. |
| 5,225,991 A | 7/1993 | Dougherty |
| 5,230,000 A | 7/1993 | Mozingo et al. |
| 5,235,617 A | 8/1993 | Mallard, Jr. |
| 5,241,492 A | 8/1993 | Girardeau, Jr. |
| 5,243,554 A | 9/1993 | Allen et al. |
| 5,245,262 A | 9/1993 | Moody et al. |
| 5,248,843 A | 9/1993 | Billings |
| 5,248,873 A | 9/1993 | Allen et al. |
| 5,258,760 A | 11/1993 | Moody et al. |
| 5,260,592 A | 11/1993 | Mead et al. |
| 5,260,979 A | 11/1993 | Parker et al. |
| 5,270,963 A | 12/1993 | Allen et al. |
| 5,276,407 A | 1/1994 | Mead et al. |
| 5,276,890 A | 1/1994 | Arai |
| 5,280,199 A | 1/1994 | Itakura |
| 5,280,202 A | 1/1994 | Chan et al. |
| 5,289,023 A | 2/1994 | Mead |
| 5,303,329 A | 4/1994 | Mead et al. |
| 5,304,955 A | 4/1994 | Atriss et al. |
| 5,305,017 A | 4/1994 | Gerpheide |
| 5,305,312 A | 4/1994 | Fornek et al. |
| 5,307,381 A | 4/1994 | Ahuja |
| 5,313,618 A | 5/1994 | Pawloski |
| 5,317,202 A | 5/1994 | Waizman |
| 5,319,370 A | 6/1994 | Signore et al. |
| 5,319,771 A | 6/1994 | Takeda |
| 5,321,828 A | 6/1994 | Phillips et al. |
| 5,324,958 A | 6/1994 | Mead et al. |
| 5,325,512 A | 6/1994 | Takahashi |
| 5,329,471 A | 7/1994 | Swoboda et al. |
| 5,331,215 A | 7/1994 | Allen et al. |
| 5,331,315 A | 7/1994 | Crosette |
| 5,331,571 A | 7/1994 | Aronoff et al. |
| 5,334,952 A | 8/1994 | Maddy et al. |
| 5,335,342 A | 8/1994 | Pope et al. |
| 5,336,936 A | 8/1994 | Allen et al. |
| 5,339,213 A | 8/1994 | O'Callaghan |
| 5,339,262 A | 8/1994 | Rostoker et al. |
| 5,341,044 A | 8/1994 | Ahanin et al. |
| 5,341,267 A | 8/1994 | Whitten |
| 5,345,195 A | 9/1994 | Cordoba et al. |
| 5,349,303 A | 9/1994 | Gerpheide |

| | | | | | |
|---|---|---|---|---|---|
| 5,355,097 A | 10/1994 | Scott et al. | 5,552,725 A | 9/1996 | Ray et al. |
| 5,357,626 A | 10/1994 | Johnson et al. | 5,552,748 A | 9/1996 | O'Shaughnessy |
| 5,361,290 A | 11/1994 | Akiyama | 5,554,951 A | 9/1996 | Gough |
| 5,371,524 A | 12/1994 | Herczeg et al. | 5,555,452 A | 9/1996 | Callaway et al. |
| 5,371,860 A | 12/1994 | Mura et al. | 5,555,907 A | 9/1996 | Phillipp |
| 5,371,878 A | 12/1994 | Coker | 5,557,762 A | 9/1996 | Okuaki et al. |
| 5,371,883 A | 12/1994 | Gross et al. | 5,559,502 A | 9/1996 | Schutte |
| 5,374,787 A | 12/1994 | Miller et al. | 5,559,996 A | 9/1996 | Fujioka et al. |
| 5,377,333 A | 12/1994 | Nakagoshi et al. | 5,563,526 A | 10/1996 | Hastings et al. |
| 5,378,935 A | 1/1995 | Korhonen et al. | 5,563,529 A | 10/1996 | Seltzer et al. |
| 5,381,515 A | 1/1995 | Platt et al. | 5,564,010 A | 10/1996 | Henry et al. |
| 5,384,467 A | 1/1995 | Plimon et al. | 5,564,108 A | 10/1996 | Hunsaker et al. |
| 5,384,745 A | 1/1995 | Konishi et al. | 5,565,658 A | 10/1996 | Gerpheide et al. |
| 5,384,910 A | 1/1995 | Torres | 5,566,702 A | 10/1996 | Phillipp |
| 5,390,173 A | 2/1995 | Spinney et al. | 5,572,665 A | 11/1996 | Nakabayashi et al. |
| 5,392,784 A | 2/1995 | Gudaitis | 5,572,719 A | 11/1996 | Biesterfeldt |
| 5,394,522 A | 2/1995 | Sanchez-Frank et al. | 5,574,678 A | 11/1996 | Gorecki |
| 5,396,245 A | 3/1995 | Rempfer | 5,574,852 A | 11/1996 | Bakker et al. |
| 5,398,261 A | 3/1995 | Marbot | 5,574,892 A | 11/1996 | Christensen |
| 5,399,922 A | 3/1995 | Kiani et al. | 5,579,353 A | 11/1996 | Parmenter et al. |
| 5,408,194 A | 4/1995 | Steinbach et al. | 5,587,945 A | 12/1996 | Lin et al. |
| 5,414,308 A | 5/1995 | Lee et al. | 5,587,957 A | 12/1996 | Kowalczyk et al. |
| 5,414,380 A | 5/1995 | Floyd et al. | 5,590,354 A | 12/1996 | Klapproth et al. |
| 5,416,895 A | 5/1995 | Anderson et al. | 5,594,388 A | 1/1997 | O'Shaughnessy et al. |
| 5,422,823 A | 6/1995 | Agrawal et al. | 5,594,734 A | 1/1997 | Worsley et al. |
| 5,424,689 A | 6/1995 | Gillig et al. | 5,594,876 A | 1/1997 | Getzlaff et al. |
| 5,426,378 A | 6/1995 | Ong | 5,594,890 A | 1/1997 | Yamaura et al. |
| 5,426,384 A | 6/1995 | May | 5,600,262 A | 2/1997 | Kolze |
| 5,428,319 A | 6/1995 | Marvin et al. | 5,604,466 A | 2/1997 | Dreps et al. |
| 5,430,395 A | 7/1995 | Ichimaru | 5,608,892 A | 3/1997 | Wakerly |
| 5,430,687 A | 7/1995 | Hung et al. | 5,614,861 A | 3/1997 | Harada |
| 5,430,734 A | 7/1995 | Gilson | 5,625,316 A | 4/1997 | Chambers et al. |
| 5,432,476 A | 7/1995 | Tran | 5,629,857 A | 5/1997 | Brennan |
| 5,438,672 A | 8/1995 | Dey | 5,629,891 A | 5/1997 | LeMoncheck et al. |
| 5,440,305 A | 8/1995 | Signore et al. | 5,630,052 A | 5/1997 | Shah |
| 5,451,887 A | 9/1995 | El-Ayat et al. | 5,630,057 A | 5/1997 | Hait |
| 5,453,904 A | 9/1995 | Higashiyama et al. | 5,630,102 A | 5/1997 | Johnson et al. |
| 5,455,525 A | 10/1995 | Ho et al. | 5,631,577 A | 5/1997 | Freidin et al. |
| 5,455,731 A | 10/1995 | Parkinson | 5,633,766 A | 5/1997 | Hase et al. |
| 5,455,927 A | 10/1995 | Huang | 5,642,295 A | 6/1997 | Smayling |
| 5,457,410 A | 10/1995 | Ting | 5,646,544 A | 7/1997 | Iadanza |
| 5,457,479 A | 10/1995 | Cheng | 5,646,901 A | 7/1997 | Sharpe-Geisler et al. |
| 5,463,591 A | 10/1995 | Aimoto et al. | 5,648,642 A | 7/1997 | Miller et al. |
| 5,479,603 A | 12/1995 | Stone et al. | 5,651,035 A | 7/1997 | Tozun |
| 5,479,643 A | 12/1995 | Bhaskar et al. | 5,663,900 A | 9/1997 | Bhandari et al. |
| 5,479,652 A | 12/1995 | Dreyer et al. | 5,663,965 A | 9/1997 | Seymour |
| 5,481,471 A | 1/1996 | Naglestad | 5,664,199 A | 9/1997 | Kuwahara |
| 5,488,204 A | 1/1996 | Mead et al. | 5,666,480 A | 9/1997 | Leung et al. |
| 5,491,458 A | 2/1996 | McCune | 5,670,915 A | 9/1997 | Cooper et al. |
| 5,493,246 A | 2/1996 | Anderson | 5,673,198 A | 9/1997 | Lawman et al. |
| 5,493,723 A | 2/1996 | Beck et al. | 5,675,825 A | 10/1997 | Dreyer et al. |
| 5,495,077 A | 2/1996 | Miller et al. | 5,677,691 A | 10/1997 | Hosticka et al. |
| 5,495,593 A | 2/1996 | Elmer et al. | 5,680,070 A | 10/1997 | Anderson et al. |
| 5,495,594 A | 2/1996 | MacKenna et al. | 5,682,032 A | 10/1997 | Phillipp |
| 5,497,119 A | 3/1996 | Tedrow et al. | 5,684,434 A | 11/1997 | Mann et al. |
| 5,499,192 A | 3/1996 | Knapp et al. | 5,684,952 A | 11/1997 | Stein |
| 5,500,823 A | 3/1996 | Martin et al. | 5,686,844 A | 11/1997 | Hull et al. |
| 5,517,198 A | 5/1996 | McEwan | 5,687,325 A | 11/1997 | Chang |
| 5,519,854 A | 5/1996 | Watt | 5,689,195 A | 11/1997 | Cliff et al. |
| 5,521,529 A | 5/1996 | Agrawal et al. | 5,689,196 A | 11/1997 | Schutte |
| 5,530,444 A | 6/1996 | Tice et al. | 5,691,664 A | 11/1997 | Anderson et al. |
| 5,530,673 A | 6/1996 | Tobita et al. | 5,691,898 A | 11/1997 | Rosenberg et al. |
| 5,530,813 A | 6/1996 | Paulsen et al. | 5,694,063 A | 12/1997 | Burlison et al. |
| 5,537,057 A | 7/1996 | Leong et al. | 5,696,952 A | 12/1997 | Pontarelli |
| 5,541,878 A | 7/1996 | LeMoncheck et al. | 5,699,024 A | 12/1997 | Manlove et al. |
| 5,542,055 A | 7/1996 | Amini et al. | 5,703,871 A | 12/1997 | Pope et al. |
| 5,543,588 A | 8/1996 | Bisset et al. | 5,706,453 A | 1/1998 | Cheng et al. |
| 5,543,590 A | 8/1996 | Gillespie et al. | 5,708,589 A | 1/1998 | Beauvais |
| 5,543,591 A | 8/1996 | Gillespie et al. | 5,708,798 A | 1/1998 | Lynch et al. |
| 5,544,067 A | 8/1996 | Rostoker et al. | 5,710,906 A | 1/1998 | Ghosh et al. |
| 5,544,311 A | 8/1996 | Harenberg et al. | 5,712,969 A | 1/1998 | Zimmermann et al. |
| 5,546,433 A | 8/1996 | Tran et al. | 5,721,931 A | 2/1998 | Gephardt et al. |
| 5,546,562 A | 8/1996 | Patel | 5,724,009 A | 3/1998 | Collins et al. |

| | | | | | |
|---|---|---|---|---|---|
| 5,727,170 A | 3/1998 | Mitchell et al. | 5,889,936 A | 3/1999 | Chan |
| 5,729,704 A | 3/1998 | Stone et al. | 5,889,988 A | 3/1999 | Held |
| 5,730,165 A | 3/1998 | Phillipp | 5,894,226 A | 4/1999 | Koyama |
| 5,732,277 A | 3/1998 | Kodosky et al. | 5,894,243 A | 4/1999 | Hwang |
| 5,734,272 A | 3/1998 | Belot et al. | 5,894,565 A | 4/1999 | Furtek et al. |
| 5,734,334 A | 3/1998 | Hsieh et al. | 5,895,494 A | 4/1999 | Scalzi et al. |
| 5,737,557 A | 4/1998 | Sullivan | 5,896,068 A | 4/1999 | Moyal |
| 5,737,760 A | 4/1998 | Grimmer et al. | 5,896,330 A | 4/1999 | Gibson |
| 5,745,011 A | 4/1998 | Scott | 5,898,345 A | 4/1999 | Namura et al. |
| 5,748,048 A | 5/1998 | Moyal | 5,900,780 A | 5/1999 | Hirose et al. |
| 5,748,875 A | 5/1998 | Tzori | 5,901,062 A | 5/1999 | Burch et al. |
| 5,752,013 A | 5/1998 | Christensen et al. | 5,903,718 A | 5/1999 | Marik |
| 5,754,552 A | 5/1998 | Allmond et al. | 5,905,398 A | 5/1999 | Todsen et al. |
| 5,754,826 A | 5/1998 | Gamal et al. | 5,909,544 A | 6/1999 | Anderson, II et al. |
| 5,757,368 A | 5/1998 | Gerpheide et al. | 5,911,059 A | 6/1999 | Profit, Jr. |
| 5,758,058 A | 5/1998 | Milburn | 5,914,465 A | 6/1999 | Allen et al. |
| 5,761,128 A | 6/1998 | Watanabe | 5,914,633 A | 6/1999 | Comino et al. |
| 5,763,909 A | 6/1998 | Mead et al. | 5,914,708 A | 6/1999 | LaGrange et al. |
| 5,764,714 A | 6/1998 | Stansell et al. | 5,917,356 A | 6/1999 | Casal et al. |
| 5,767,457 A | 6/1998 | Gerpheide et al. | 5,920,310 A | 7/1999 | Faggin et al. |
| 5,774,704 A | 6/1998 | Williams | 5,923,264 A | 7/1999 | Lavelle et al. |
| 5,777,399 A | 7/1998 | Shibuya | 5,926,566 A | 7/1999 | Wang et al. |
| 5,781,030 A | 7/1998 | Agrawal et al. | 5,929,710 A | 7/1999 | Bien |
| 5,781,747 A | 7/1998 | Kametani | 5,930,148 A | 7/1999 | Bjorksten et al. |
| 5,784,545 A | 7/1998 | Anderson et al. | 5,930,150 A | 7/1999 | Cohen et al. |
| 5,790,957 A | 8/1998 | Heidari | 5,931,959 A | 8/1999 | Kwiat |
| 5,796,183 A | 8/1998 | Hourmand | 5,933,023 A | 8/1999 | Young |
| 5,799,176 A | 8/1998 | Kapusta et al. | 5,933,356 A | 8/1999 | Rostoker et al. |
| 5,802,073 A | 9/1998 | Platt | 5,933,816 A | 8/1999 | Zeanah et al. |
| 5,802,290 A | 9/1998 | Casselman | 5,935,233 A | 8/1999 | Jeddeloh |
| 5,805,792 A | 9/1998 | Swobada et al. | 5,935,266 A | 8/1999 | Thurnhofer et al. |
| 5,805,897 A | 9/1998 | Glowny | 5,939,904 A | 8/1999 | Fetterman et al. |
| 5,808,883 A | 9/1998 | Hawkes | 5,939,949 A | 8/1999 | Olgaard et al. |
| 5,811,987 A | 9/1998 | Ashmore, Jr. et al. | 5,941,991 A | 8/1999 | Kageshima |
| 5,812,698 A | 9/1998 | Platt et al. | 5,942,733 A | 8/1999 | Allen et al. |
| 5,818,254 A | 10/1998 | Agrawal et al. | 5,943,052 A | 8/1999 | Allen et al. |
| 5,818,444 A | 10/1998 | Alimpich et al. | 5,945,878 A | 8/1999 | Westwick et al. |
| 5,819,028 A | 10/1998 | Manghirmalani et al. | 5,949,632 A | 9/1999 | Barreras, Sr. et al. |
| 5,822,387 A | 10/1998 | Mar | 5,952,888 A | 9/1999 | Scott |
| 5,822,531 A | 10/1998 | Gorczyca et al. | 5,956,279 A | 9/1999 | Mo et al. |
| 5,828,693 A | 10/1998 | Mays et al. | 5,959,871 A | 9/1999 | Pierzchala et al. |
| 5,838,583 A | 11/1998 | Varadarajan et al. | 5,963,075 A | 10/1999 | Hiiragizawa |
| 5,841,078 A | 11/1998 | Miller et al. | 5,963,105 A | 10/1999 | Nguyen |
| 5,841,996 A | 11/1998 | Nolan et al. | 5,963,503 A | 10/1999 | Lee |
| 5,844,256 A | 12/1998 | Mead et al. | 5,964,893 A | 10/1999 | Circello et al. |
| 5,844,404 A | 12/1998 | Caser et al. | 5,966,027 A | 10/1999 | Kapusta et al. |
| 5,848,285 A | 12/1998 | Kapusta et al. | 5,966,532 A | 10/1999 | McDonald et al. |
| 5,850,156 A | 12/1998 | Wittman | 5,968,135 A | 10/1999 | Teramoto et al. |
| 5,852,733 A | 12/1998 | Chien et al. | 5,969,513 A | 10/1999 | Clark |
| 5,854,625 A | 12/1998 | Frisch et al. | 5,969,632 A | 10/1999 | Diamant et al. |
| 5,857,109 A | 1/1999 | Taylor | 5,973,368 A | 10/1999 | Pearce et al. |
| 5,861,583 A | 1/1999 | Schediwy et al. | 5,974,235 A | 10/1999 | Nunally et al. |
| 5,861,875 A | 1/1999 | Gerpheide | 5,977,791 A | 11/1999 | Veenstra |
| 5,864,242 A | 1/1999 | Allen et al. | 5,978,584 A | 11/1999 | Nishibata et al. |
| 5,864,392 A | 1/1999 | Winklhofer et al. | 5,978,937 A | 11/1999 | Miyamori et al. |
| 5,867,046 A | 2/1999 | Sugasawa | 5,982,105 A | 11/1999 | Masters |
| 5,867,399 A | 2/1999 | Rostoker et al. | 5,982,229 A | 11/1999 | Wong et al. |
| 5,869,979 A | 2/1999 | Bocchino | 5,982,241 A | 11/1999 | Nguyen et al. |
| 5,870,004 A | 2/1999 | Lu | 5,983,277 A | 11/1999 | Heile et al. |
| 5,870,309 A | 2/1999 | Lawman | 5,986,479 A | 11/1999 | Mohan |
| 5,870,345 A | 2/1999 | Stecker | 5,987,246 A | 11/1999 | Thomsen et al. |
| 5,872,464 A | 2/1999 | Gradinariu | 5,988,902 A | 11/1999 | Holehan |
| 5,874,958 A | 2/1999 | Ludolph | 5,994,939 A | 11/1999 | Johnson et al. |
| 5,875,293 A | 2/1999 | Bell et al. | 5,996,032 A | 11/1999 | Baker |
| 5,877,656 A | 3/1999 | Mann et al. | 5,999,725 A | 12/1999 | Barbier et al. |
| 5,878,425 A | 3/1999 | Redpath | 6,002,268 A | 12/1999 | Sasaki et al. |
| 5,880,411 A | 3/1999 | Gillespie et al. | 6,002,398 A | 12/1999 | Wilson |
| 5,880,598 A | 3/1999 | Duong | 6,003,054 A | 12/1999 | Oshima et al. |
| 5,883,623 A | 3/1999 | Cseri | 6,003,107 A | 12/1999 | Ranson et al. |
| 5,886,582 A | 3/1999 | Stansell | 6,003,133 A | 12/1999 | Moughanni et al. |
| 5,887,189 A | 3/1999 | Birns et al. | 6,005,814 A | 12/1999 | Mulholland et al. |
| 5,889,236 A | 3/1999 | Gillespie et al. | 6,005,904 A | 12/1999 | Knapp et al. |
| 5,889,723 A | 3/1999 | Pascucci | 6,008,685 A | 12/1999 | Kunst |

| | | | | | | |
|---|---|---|---|---|---|---|
| 6,008,703 | A | 12/1999 | Perrott et al. | 6,154,064 | A | 11/2000 | Proebsting |
| 6,009,270 | A | 12/1999 | Mann | 6,157,024 | A | 12/2000 | Chapdelaine et al. |
| 6,009,496 | A | 12/1999 | Tsai | 6,157,270 | A | 12/2000 | Tso |
| 6,011,407 | A | 1/2000 | New | 6,161,199 | A | 12/2000 | Szeto et al. |
| 6,012,835 | A | 1/2000 | Thompson et al. | 6,166,367 | A | 12/2000 | Cho |
| 6,014,135 | A | 1/2000 | Fernandes | 6,166,960 | A | 12/2000 | Marneweck et al. |
| 6,014,509 | A | 1/2000 | Furtek et al. | 6,167,077 | A | 12/2000 | Ducaroir |
| 6,014,723 | A | 1/2000 | Tremblay et al. | 6,167,559 | A | 12/2000 | Furtek et al. |
| 6,016,554 | A | 1/2000 | Skrovan et al. | 6,169,383 | B1 | 1/2001 | Sabin et al. |
| 6,016,563 | A | 1/2000 | Fleisher | 6,172,571 | B1 | 1/2001 | Moyal et al. |
| 6,018,559 | A | 1/2000 | Azegami et al. | 6,173,419 | B1 | 1/2001 | Barnett |
| 6,023,422 | A | 2/2000 | Allen et al. | 6,175,914 | B1 | 1/2001 | Mann |
| 6,023,565 | A | 2/2000 | Lawman et al. | 6,175,949 | B1 | 1/2001 | Gristede et al. |
| 6,026,134 | A | 2/2000 | Duffy et al. | 6,181,163 | B1 | 1/2001 | Agrawal et al. |
| 6,026,501 | A | 2/2000 | Hohl et al. | 6,183,131 | B1 | 2/2001 | Holloway et al. |
| 6,028,271 | A | 2/2000 | Gillespie et al. | 6,185,127 | B1 | 2/2001 | Myers et al. |
| 6,028,959 | A | 2/2000 | Wang et al. | 6,185,450 | B1 | 2/2001 | Seguine et al. |
| 6,031,365 | A | 2/2000 | Sharpe-Geisler | 6,185,522 | B1 | 2/2001 | Bakker |
| 6,032,268 | A | 2/2000 | Swoboda et al. | 6,185,703 | B1 | 2/2001 | Guddat et al. |
| 6,034,538 | A | 3/2000 | Abramovici | 6,185,732 | B1 | 2/2001 | Mann et al. |
| 6,037,807 | A | 3/2000 | Wu et al. | 6,188,228 | B1 | 2/2001 | Philipp |
| 6,038,551 | A | 3/2000 | Barlow et al. | 6,188,241 | B1 | 2/2001 | Gauthier et al. |
| 6,041,406 | A | 3/2000 | Mann | 6,188,381 | B1 | 2/2001 | van der Wal et al. |
| 6,043,695 | A | 3/2000 | O'Sullivan | 6,188,391 | B1 | 2/2001 | Seely et al. |
| 6,043,719 | A | 3/2000 | Lin et al. | 6,188,975 | B1 | 2/2001 | Gay |
| 6,049,223 | A | 4/2000 | Lytle et al. | 6,191,603 | B1 | 2/2001 | Muradali et al. |
| 6,049,225 | A | 4/2000 | Huang et al. | 6,191,660 | B1 | 2/2001 | Mar et al. |
| 6,051,772 | A | 4/2000 | Cameron et al. | 6,191,998 | B1 | 2/2001 | Reddy et al. |
| 6,052,035 | A | 4/2000 | Nolan et al. | 6,192,431 | B1 | 2/2001 | Dabral et al. |
| 6,052,524 | A | 4/2000 | Pauna | 6,198,303 | B1 | 3/2001 | Rangasayee |
| 6,055,584 | A | 4/2000 | Bridges et al. | 6,201,407 | B1 | 3/2001 | Kapusta et al. |
| 6,057,705 | A | 5/2000 | Wojewoda et al. | 6,201,829 | B1 | 3/2001 | Schneider |
| 6,058,263 | A | 5/2000 | Voth | 6,202,044 | B1 | 3/2001 | Tzori |
| 6,058,452 | A | 5/2000 | Rangasayee et al. | 6,204,687 | B1 | 3/2001 | Schultz et al. |
| 6,061,511 | A | 5/2000 | Marantz et al. | 6,205,574 | B1 | 3/2001 | Dellinger et al. |
| 6,066,961 | A | 5/2000 | Lee et al. | 6,208,572 | B1 | 3/2001 | Adams et al. |
| 6,070,003 | A | 5/2000 | Gove et al. | 6,211,708 | B1 | 4/2001 | Kemmer |
| 6,072,803 | A | 6/2000 | Allmond et al. | 6,211,715 | B1 | 4/2001 | Terauchi |
| 6,075,941 | A | 6/2000 | Itoh et al. | 6,211,741 | B1 | 4/2001 | Dalmia |
| 6,079,985 | A | 6/2000 | Wohl et al. | 6,215,352 | B1 | 4/2001 | Sudo |
| 6,081,140 | A | 6/2000 | King | 6,219,729 | B1 | 4/2001 | Keats et al. |
| 6,094,730 | A | 7/2000 | Lopez et al. | 6,222,528 | B1 | 4/2001 | Gerpheide et al. |
| 6,097,211 | A | 8/2000 | Couts-Martin et al. | 6,223,144 | B1 | 4/2001 | Barnett et al. |
| 6,097,432 | A | 8/2000 | Mead et al. | 6,223,147 | B1 | 4/2001 | Bowers |
| 6,101,457 | A | 8/2000 | Barch et al. | 6,223,272 | B1 | 4/2001 | Coehlo et al. |
| 6,101,617 | A | 8/2000 | Burckhartt et al. | RE37,195 | E | 5/2001 | Kean |
| 6,104,217 | A | 8/2000 | Magana | 6,225,866 | B1 | 5/2001 | Kubota et al. |
| 6,104,325 | A | 8/2000 | Liaw et al. | 6,236,242 | B1 | 5/2001 | Hedberg |
| 6,107,769 | A | 8/2000 | Saylor et al. | 6,236,275 | B1 | 5/2001 | Dent |
| 6,107,826 | A | 8/2000 | Young et al. | 6,236,278 | B1 | 5/2001 | Olgaard |
| 6,107,882 | A | 8/2000 | Gabara et al. | 6,236,593 | B1 | 5/2001 | Hong et al. |
| 6,110,223 | A | 8/2000 | Southgate et al. | 6,239,389 | B1 | 5/2001 | Allen et al. |
| 6,111,431 | A | 8/2000 | Estrada | 6,239,798 | B1 | 5/2001 | Ludolph et al. |
| 6,112,264 | A | 8/2000 | Beasley et al. | 6,240,375 | B1 | 5/2001 | Sonoda |
| 6,121,791 | A | 9/2000 | Abbott | 6,246,258 | B1 | 6/2001 | Lesea |
| 6,121,805 | A | 9/2000 | Thamsirianunt et al. | 6,246,410 | B1 | 6/2001 | Bergeron et al. |
| 6,121,965 | A | 9/2000 | Kenney et al. | 6,249,167 | B1 | 6/2001 | Oguchi et al. |
| 6,125,416 | A | 9/2000 | Warren | 6,249,447 | B1 | 6/2001 | Boylan et al. |
| 6,130,548 | A | 10/2000 | Koifman | 6,253,250 | B1 | 6/2001 | Evans et al. |
| 6,130,551 | A | 10/2000 | Agrawal et al. | 6,253,754 | B1 | 7/2001 | Roohparvar |
| 6,130,552 | A | 10/2000 | Jefferson et al. | 6,262,717 | B1 | 7/2001 | Donohue et al. |
| 6,133,773 | A | 10/2000 | Garlepp et al. | 6,263,302 | B1 | 7/2001 | Hellestrand et al. |
| 6,134,181 | A | 10/2000 | Landry | 6,263,339 | B1 | 7/2001 | Hirsch |
| 6,134,516 | A | 10/2000 | Wang et al. | 6,263,484 | B1 | 7/2001 | Yang |
| 6,137,308 | A | 10/2000 | Nayak | 7,171,455 | B1 | 7/2001 | Gupta et al. |
| 6,140,853 | A | 10/2000 | Lo | 6,271,679 | B1 | 8/2001 | McClintock et al. |
| 6,141,376 | A | 10/2000 | Shaw | 6,272,646 | B1 | 8/2001 | Rangasayee |
| 6,141,764 | A | 10/2000 | Ezell | 6,275,117 | B1 | 8/2001 | Abugharbieh et al. |
| 6,144,327 | A | * 11/2000 | Distinti et al. .............. 341/126 | 6,278,568 | B1 | 8/2001 | Cloke et al. |
| 6,148,104 | A | 11/2000 | Wang et al. | 6,280,391 | B1 | 8/2001 | Olson et al. |
| 6,148,441 | A | 11/2000 | Woodward | 6,281,753 | B1 | 8/2001 | Corsi et al. |
| 6,149,299 | A | 11/2000 | Aslan et al. | 6,282,547 | B1 | 8/2001 | Hirsch |
| 6,150,866 | A | 11/2000 | Eto et al. | 6,282,551 | B1 | 8/2001 | Anderson et al. |

| Patent | Type | Date | Inventor |
|---|---|---|---|
| 6,286,127 | B1 | 9/2001 | King et al. |
| 6,288,707 | B1 | 9/2001 | Philipp |
| 6,289,300 | B1 | 9/2001 | Brannick et al. |
| 6,289,478 | B1 | 9/2001 | Kitagaki |
| 6,289,489 | B1 | 9/2001 | Bold et al. |
| 6,292,028 | B1 | 9/2001 | Tomita |
| 6,294,932 | B1 | 9/2001 | Watarai |
| 6,294,962 | B1 | 9/2001 | Mar |
| 6,298,320 | B1 | 10/2001 | Buckmaster et al. |
| 6,304,014 | B1 | 10/2001 | England et al. |
| 6,304,101 | B1 | 10/2001 | Nishihara |
| 6,304,790 | B1 | 10/2001 | Nakamura et al. |
| 6,307,413 | B1 | 10/2001 | Dalmia et al. |
| 6,310,521 | B1 | 10/2001 | Dalmia |
| 6,310,611 | B1 | 10/2001 | Caldwell |
| 6,311,149 | B1 | 10/2001 | Ryan et al. |
| 6,314,530 | B1 | 11/2001 | Mann |
| 6,320,184 | B1 | 11/2001 | Winklhofer et al. |
| 6,320,282 | B1 | 11/2001 | Caldwell |
| 6,321,369 | B1 | 11/2001 | Heile et al. |
| 6,323,846 | B1 | 11/2001 | Westerman et al. |
| 6,324,628 | B1 | 11/2001 | Chan |
| 6,326,859 | B1 | 12/2001 | Goldman et al. |
| 6,332,137 | B1 | 12/2001 | Hori et al. |
| 6,332,201 | B1 | 12/2001 | Chin et al. |
| 6,337,579 | B1 | 1/2002 | Mochida |
| 6,338,109 | B1 | 1/2002 | Snyder et al. |
| 6,339,815 | B1 | 1/2002 | Feng et al. |
| 6,342,907 | B1 | 1/2002 | Petty et al. |
| 6,345,383 | B1 | 2/2002 | Ueki |
| 6,347,395 | B1 | 2/2002 | Payne et al. |
| 6,351,789 | B1 | 2/2002 | Green |
| 6,353,452 | B1 | 3/2002 | Hamada et al. |
| 6,355,980 | B1 | 3/2002 | Callahan |
| 6,356,862 | B2 | 3/2002 | Bailey |
| 6,356,958 | B1 | 3/2002 | Lin |
| 6,356,960 | B1 | 3/2002 | Jones et al. |
| 6,359,950 | B2 | 3/2002 | Gossmann et al. |
| 6,362,697 | B1 | 3/2002 | Pulvirenti |
| 6,366,174 | B1 | 4/2002 | Berry et al. |
| 6,366,300 | B1 | 4/2002 | Ohara et al. |
| 6,366,874 | B1 | 4/2002 | Lee et al. |
| 6,366,878 | B1 | 4/2002 | Grunert |
| 6,369,660 | B1 | 4/2002 | Wei |
| 6,371,878 | B1 | 4/2002 | Bowen |
| 6,373,954 | B1 | 4/2002 | Malcolm et al. |
| 6,374,370 | B1 | 4/2002 | Bockhaus et al. |
| 6,377,009 | B1 | 4/2002 | Philipp |
| 6,377,575 | B1 | 4/2002 | Mullaney et al. |
| 6,377,646 | B1 | 4/2002 | Sha |
| 6,380,811 | B1 | 4/2002 | Zarubinsky et al. |
| 6,380,929 | B1 | 4/2002 | Platt |
| 6,380,931 | B1 | 4/2002 | Gillespie et al. |
| 6,384,947 | B1 | 5/2002 | Ackerman et al. |
| 6,385,742 | B1 | 5/2002 | Kirsh et al. |
| 6,388,109 | B1 | 5/2002 | Schwarz et al. |
| 6,388,464 | B1 | 5/2002 | Lacey et al. |
| 6,396,302 | B2 | 5/2002 | New et al. |
| 6,396,657 | B1 | 5/2002 | Sun et al. |
| 6,397,232 | B1 | 5/2002 | Cheng-Hung et al. |
| 6,404,204 | B1 | 6/2002 | Farruggia et al. |
| 6,404,445 | B1 | 6/2002 | Galea et al. |
| 6,407,953 | B1 | 6/2002 | Cleeves |
| 6,408,432 | B1 | 6/2002 | Herrmann et al. |
| 6,411,665 | B1 | 6/2002 | Chan et al. |
| 6,411,974 | B1 | 6/2002 | Graham et al. |
| 6,414,671 | B1 | 7/2002 | Gillespie et al. |
| 6,421,698 | B1 | 7/2002 | Hong |
| 6,425,109 | B1 | 7/2002 | Choukalos et al. |
| 6,429,882 | B1 | 8/2002 | Abdelnur et al. |
| 6,430,305 | B1 | 8/2002 | Decker |
| 6,433,645 | B1 | 8/2002 | Mann et al. |
| 6,434,187 | B1 | 8/2002 | Beard |
| 6,437,805 | B1 | 8/2002 | Sojoodi et al. |
| 6,438,565 | B1 | 8/2002 | Ammirato et al. |
| 6,438,735 | B1 | 8/2002 | McElvain et al. |
| 6,438,738 | B1 | 8/2002 | Elayda |
| 6,441,073 | B1 | 8/2002 | Tanaka et al. |
| 6,445,211 | B1 | 9/2002 | Saripella |
| 6,449,628 | B1 | 9/2002 | Wasson |
| 6,449,755 | B1 | 9/2002 | Beausang et al. |
| 6,449,761 | B1 | 9/2002 | Greidinger et al. |
| 6,452,437 | B1 | 9/2002 | Takeuchi et al. |
| 6,452,514 | B1 | 9/2002 | Philipp |
| 6,453,175 | B2 | 9/2002 | Mizell et al. |
| 6,453,461 | B1 | 9/2002 | Chaiken |
| 6,456,304 | B1 | 9/2002 | Angiulo et al. |
| 6,457,355 | B1 | 10/2002 | Philipp |
| 6,457,479 | B1 | 10/2002 | Zhuang et al. |
| 6,460,172 | B1 | 10/2002 | Insenser Farre et al. |
| 6,463,488 | B1 | 10/2002 | San Juan |
| 6,466,036 | B1 | 10/2002 | Philipp |
| 6,466,078 | B1 | 10/2002 | Stiff |
| 6,466,898 | B1 | 10/2002 | Chan |
| 6,473,069 | B1 | 10/2002 | Gerpheide |
| 6,473,825 | B1 | 10/2002 | Worley et al. |
| 6,477,691 | B1 | 11/2002 | Bergamashi/Rab et al. |
| 6,480,921 | B1 | 11/2002 | Mansoorian et al. |
| 6,483,343 | B1 | 11/2002 | Faith et al. |
| 6,487,700 | B1 | 11/2002 | Fukushima |
| 6,489,899 | B1 | 12/2002 | Ely et al. |
| 6,490,213 | B1 | 12/2002 | Mu et al. |
| 6,492,834 | B1 | 12/2002 | Lytle et al. |
| 6,496,971 | B1 | 12/2002 | Lesea et al. |
| 6,498,720 | B2 | 12/2002 | Glad |
| 6,499,134 | B1 | 12/2002 | Buffet et al. |
| 6,499,359 | B1 | 12/2002 | Washeleski et al. |
| 6,504,403 | B2 | 1/2003 | Bangs et al. |
| 6,507,215 | B1 | 1/2003 | Piasecki et al. |
| 6,507,857 | B1 | 1/2003 | Yalcinalp |
| 6,509,758 | B2 | 1/2003 | Piasecki et al. |
| 6,512,395 | B1 | 1/2003 | Lacey et al. |
| 6,677,932 | B1 | 1/2003 | Westerman |
| 6,516,428 | B2 | 2/2003 | Wenzel et al. |
| 6,522,128 | B1 | 2/2003 | Ely et al. |
| 6,523,416 | B2 | 2/2003 | Takagi et al. |
| 6,525,593 | B1 | 2/2003 | Mar |
| 6,526,556 | B1 | 2/2003 | Stoica et al. |
| 6,529,791 | B1 | 3/2003 | Takagi |
| 6,530,065 | B1 | 3/2003 | McDonald et al. |
| 6,534,970 | B1 | 3/2003 | Ely et al. |
| 6,535,061 | B2 | 3/2003 | Darmawaskita et al. |
| 6,535,200 | B2 | 3/2003 | Philipp |
| 6,535,946 | B1 | 3/2003 | Bryant et al. |
| 6,536,028 | B1 | 3/2003 | Katsioulas et al. |
| 6,539,534 | B1 | 3/2003 | Bennett |
| 6,542,025 | B1 | 4/2003 | Kutz et al. |
| 6,542,844 | B1 | 4/2003 | Hanna |
| 6,542,845 | B1 | 4/2003 | Grucci et al. |
| 6,552,933 | B2 | 4/2003 | Roohparvar |
| 6,553,057 | B1 | 4/2003 | Sha |
| 6,554,469 | B1 | 4/2003 | Thomson et al. |
| 6,557,164 | B1 | 4/2003 | Faustini |
| 6,559,685 | B2 | 5/2003 | Green |
| 6,560,306 | B1 | 5/2003 | Duffy |
| 6,560,699 | B1 | 5/2003 | Konkle |
| 6,563,391 | B1 | 5/2003 | Mar |
| 6,564,179 | B1 | 5/2003 | Belhaj |
| 6,566,961 | B2 | 5/2003 | Dasgupta et al. |
| 6,567,426 | B1 | 5/2003 | van Hook et al. |
| 6,567,932 | B2 | 5/2003 | Edwards et al. |
| 6,570,557 | B1 | 5/2003 | Westerman et al. |
| 6,571,331 | B2 | 5/2003 | Henry et al. |
| 6,571,373 | B1 | 5/2003 | Devins et al. |
| 6,574,590 | B1 | 6/2003 | Kershaw et al. |
| 6,574,739 | B1 | 6/2003 | Kung et al. |

| | | |
|---|---|---|
| 6,575,373 B1 | 6/2003 | Nakano |
| 6,577,258 B2 | 6/2003 | Ruha et al. |
| 6,578,174 B2 | 6/2003 | Zizzo |
| 6,580,329 B2 | 6/2003 | Sander |
| 6,581,191 B1 | 6/2003 | Schubert et al. |
| 6,587,093 B1 | 7/2003 | Shaw et al. |
| 6,587,995 B1 | 7/2003 | Duboc et al. |
| 6,588,004 B1 | 7/2003 | Southgate et al. |
| 6,590,422 B1 | 7/2003 | Dillon |
| 6,590,517 B1 | 7/2003 | Swanson |
| 6,591,369 B1 | 7/2003 | Edwards et al. |
| 6,592,626 B1 | 7/2003 | Bauchot et al. |
| 6,594,799 B1 | 7/2003 | Robertson et al. |
| 6,597,212 B1 | 7/2003 | Wang et al. |
| 6,597,824 B2 | 7/2003 | Newberg et al. |
| 6,598,178 B1 | 7/2003 | Yee et al. |
| 6,600,346 B1 | 7/2003 | Macaluso |
| 6,600,351 B2 | 7/2003 | Bisanti et al. |
| 6,600,575 B1 | 7/2003 | Kohara |
| 6,601,189 B1 | 7/2003 | Edwards et al. |
| 6,601,236 B1 | 7/2003 | Curtis |
| 6,603,348 B1 | 8/2003 | Preuss et al. |
| 6,604,179 B2 | 8/2003 | Volk et al. |
| 6,606,731 B1 | 8/2003 | Baum et al. |
| 6,608,472 B1 | 8/2003 | Kutz et al. |
| 6,611,220 B1 | 8/2003 | Snyder |
| 6,611,276 B1 | 8/2003 | Muratori et al. |
| 6,611,856 B1 | 8/2003 | Liao et al. |
| 6,611,952 B1 | 8/2003 | Prakash et al. |
| 6,610,936 B2 | 9/2003 | Gillespie et al. |
| 6,613,098 B1 | 9/2003 | Sorge et al. |
| 6,614,260 B1 | 9/2003 | Welch et al. |
| 6,614,320 B1 | 9/2003 | Sullam et al. |
| 6,614,374 B1 | 9/2003 | Gustavsson et al. |
| 6,614,458 B1 | 9/2003 | Lambert et al. |
| 6,615,167 B1 | 9/2003 | Devins et al. |
| 6,617,888 B2 | 9/2003 | Volk |
| 6,618,854 B1 | 9/2003 | Mann |
| 6,621,356 B2 | 9/2003 | Gotz et al. |
| 6,624,640 B2 | 9/2003 | Lund et al. |
| 6,625,765 B1 | 9/2003 | Krishnan |
| 6,628,163 B2 | 9/2003 | Dathe et al. |
| 6,628,311 B1 | 9/2003 | Fang |
| 6,631,508 B1 | 10/2003 | Williams |
| 6,634,008 B1 | 10/2003 | Dole |
| 6,636,096 B2 | 10/2003 | Schaffer et al. |
| 6,637,015 B1 | 10/2003 | Ogami et al. |
| 6,639,586 B2 | 10/2003 | Gerpheide |
| 6,642,857 B1 | 11/2003 | Schediwy et al. |
| 6,643,151 B1 | 11/2003 | Nebrigic et al. |
| 6,643,810 B2 | 11/2003 | Whetsel |
| 6,649,924 B1 | 11/2003 | Philipp et al. |
| 6,650,581 B2 | 11/2003 | Hong et al. |
| 6,658,498 B1 | 12/2003 | Carney et al. |
| 6,658,633 B2 | 12/2003 | Devins et al. |
| 6,661,288 B2 | 12/2003 | Morgan et al. |
| 6,661,410 B2 | 12/2003 | Casebolt et al. |
| 6,661,724 B1 | 12/2003 | Snyder et al. |
| 6,664,978 B1 | 12/2003 | Kekic et al. |
| 6,664,991 B1 | 12/2003 | Chew et al. |
| 6,667,642 B1 | 12/2003 | Moyal |
| 6,667,740 B2 | 12/2003 | Ely et al. |
| 6,670,852 B1 | 12/2003 | Hauck |
| 6,673,308 B2 | 1/2004 | Hino et al. |
| 6,677,814 B2 | 1/2004 | Low et al. |
| 6,678,645 B1 | 1/2004 | Rajsuman et al. |
| 6,678,877 B1 | 1/2004 | Perry et al. |
| 6,680,632 B1 | 1/2004 | Meyers et al. |
| 6,680,731 B2 | 1/2004 | Gerpheide et al. |
| 6,681,280 B1 | 1/2004 | Miyake et al. |
| 6,681,359 B1 | 1/2004 | Au et al. |
| 6,683,462 B2 | 1/2004 | Shimizu |
| 6,683,930 B1 | 1/2004 | Dalmia |
| 6,686,787 B2 | 2/2004 | Ling |
| 6,686,860 B2 | 2/2004 | Gulati et al. |
| 6,690,224 B1 | 2/2004 | Moore |
| 6,691,193 B1 | 2/2004 | Wang et al. |
| 6,691,301 B2 | 2/2004 | Bowen |
| 6,697,754 B1 | 2/2004 | Alexander |
| 6,856,433 B2 | 2/2004 | Hatano et al. |
| 6,701,340 B1 | 3/2004 | Gorecki |
| 6,701,487 B1 | 3/2004 | Ogami et al. |
| 6,701,508 B1 | 3/2004 | Bartz et al. |
| 6,704,381 B1 | 3/2004 | Moyal et al. |
| 6,704,879 B1 | 3/2004 | Parrish |
| 6,704,889 B2 | 3/2004 | Veenstra et al. |
| 6,704,893 B1 | 3/2004 | Bauwens et al. |
| 6,705,511 B1 | 3/2004 | Dames et al. |
| 6,711,226 B1 | 3/2004 | Williams et al. |
| 6,711,731 B2 | 3/2004 | Weiss |
| 6,713,897 B2 | 3/2004 | Caldwell |
| 6,714,066 B2 | 3/2004 | Gorecki et al. |
| 6,714,817 B2 | 3/2004 | Daynes et al. |
| 6,715,132 B1 | 3/2004 | Bartz et al. |
| 6,717,474 B2 | 4/2004 | Chen et al. |
| 6,718,294 B1 | 4/2004 | Bortfeld |
| 6,718,520 B1 | 4/2004 | Merryman et al. |
| 6,718,533 B1 | 4/2004 | Schneider et al. |
| 6,724,220 B1 | 4/2004 | Snyder et al. |
| 6,728,900 B1 | 4/2004 | Meli |
| 6,728,902 B2 | 4/2004 | Kaiser et al. |
| 6,730,863 B1 | 5/2004 | Gerpheide |
| 6,731,552 B2 | 5/2004 | Perner |
| 6,732,068 B2 | 5/2004 | Sample et al. |
| 6,732,347 B1 | 5/2004 | Camilleri et al. |
| 6,738,858 B1 | 5/2004 | Fernald et al. |
| 6,744,323 B1 | 6/2004 | Moyal et al. |
| 6,748,569 B1 | 6/2004 | Brooke et al. |
| 6,750,852 B2 | 6/2004 | Gillespie |
| 6,750,889 B1 | 6/2004 | Livingston et al. |
| 6,754,101 B2 | 6/2004 | Terzioglu et al. |
| 6,754,723 B2 | 6/2004 | Kato |
| 6,754,765 B1 | 6/2004 | Chang et al. |
| 6,754,849 B2 | 6/2004 | Tamura |
| 6,757,882 B2 | 6/2004 | Chen et al. |
| 6,765,407 B1 | 7/2004 | Snyder |
| 6,768,337 B2 | 7/2004 | Kohno et al. |
| 6,768,352 B1 | 7/2004 | Maher et al. |
| 6,769,622 B1 | 8/2004 | Tournemille et al. |
| 6,771,552 B2 | 8/2004 | Fujisawa |
| 6,774,644 B2 | 8/2004 | Eberlein |
| 6,781,456 B2 | 8/2004 | Pradhan |
| 6,782,068 B1 | 8/2004 | Wilson et al. |
| 6,784,821 B1 | 8/2004 | Lee |
| 6,785,881 B1 | 8/2004 | Bartz et al. |
| 6,788,116 B1 | 9/2004 | Cook et al. |
| 6,788,221 B1 | 9/2004 | Ely et al. |
| 6,788,521 B2 | 9/2004 | Nishi |
| 6,791,377 B2 | 9/2004 | Ilchmann et al. |
| 6,792,584 B1 | 9/2004 | Eneboe et al. |
| 6,798,218 B2 | 9/2004 | Kasperkovitz |
| 6,798,299 B1 | 9/2004 | Mar et al. |
| 6,799,198 B1 | 9/2004 | Huboi et al. |
| 6,806,771 B1 | 10/2004 | Hildebrant et al. |
| 6,806,782 B2 | 10/2004 | Motoyoshi et al. |
| 6,809,275 B1 | 10/2004 | Cheng et al. |
| 6,809,566 B1 | 10/2004 | Xin-LeBlanc |
| 6,810,442 B1 | 10/2004 | Lin et al. |
| 6,815,979 B2 | 11/2004 | Ooshita |
| 6,816,544 B1 | 11/2004 | Bailey et al. |
| 6,817,005 B2 | 11/2004 | Mason et al. |
| 6,819,142 B2 | 11/2004 | Viehmann et al. |
| 6,823,282 B1 | 11/2004 | Snyder |
| 6,823,497 B2 | 11/2004 | Schubert et al. |
| 6,825,689 B1 | 11/2004 | Snyder |
| 6,825,869 B2 | 11/2004 | Bang |

| Patent No. | Kind | Date | Inventor |
|---|---|---|---|
| 6,828,824 | B2 | 12/2004 | Betz et al. |
| 6,829,727 | B1 | 12/2004 | Pawloski |
| 6,834,384 | B2 | 12/2004 | Fiorella, II et al. |
| 6,836,169 | B2 | 12/2004 | Richmond et al. |
| 6,839,774 | B1 | 1/2005 | Ahn et al. |
| 6,842,710 | B1 | 1/2005 | Gehring et al. |
| 6,847,203 | B1 | 1/2005 | Conti et al. |
| 6,850,117 | B2 | 2/2005 | Weber et al. |
| 6,850,554 | B1 | 2/2005 | Sha |
| 6,853,598 | B2 | 2/2005 | Chevallier |
| 6,854,067 | B1 | 2/2005 | Kutz et al. |
| 6,859,884 | B1 | 2/2005 | Sullam |
| 6,862,240 | B2 | 3/2005 | Burgan |
| 6,864,710 | B1 | 3/2005 | Lacey et al. |
| 6,865,429 | B1 | 3/2005 | Schneider et al. |
| 6,865,504 | B2 | 3/2005 | Larson et al. |
| 6,868,500 | B1 | 3/2005 | Kutz et al. |
| 6,871,253 | B2 | 3/2005 | Greeff et al. |
| 6,871,331 | B1 | 3/2005 | Bloom et al. |
| 6,873,203 | B1 | 3/2005 | Latham, II et al. |
| 6,873,210 | B2 | 3/2005 | Mulder et al. |
| 6,876,941 | B2 | 4/2005 | Nightingale |
| 6,880,086 | B2 | 4/2005 | Kidder et al. |
| 6,888,453 | B2 | 5/2005 | Lutz et al. |
| 6,888,538 | B2 | 5/2005 | Ely et al. |
| 6,892,310 | B1 | 5/2005 | Kutz et al. |
| 6,892,322 | B1 | 5/2005 | Snyder |
| 6,893,724 | B2 | 5/2005 | Lin et al. |
| 6,894,928 | B2 | 5/2005 | Owen |
| 6,897,390 | B2 | 5/2005 | Caldwell et al. |
| 6,898,703 | B1 | 5/2005 | Ogami et al. |
| 6,900,663 | B1 | 5/2005 | Roper et al. |
| 6,901,563 | B1 | 5/2005 | Ogami et al. |
| 6,903,402 | B2 | 6/2005 | Miyazawa |
| 6,903,613 | B1 | 6/2005 | Mitchell et al. |
| 6,904,570 | B2 | 6/2005 | Foote et al. |
| 6,910,126 | B1 | 6/2005 | Mar et al. |
| 6,911,857 | B1 | 6/2005 | Stiff |
| 6,917,661 | B1 | 7/2005 | Scott et al. |
| 6,922,821 | B1 | 7/2005 | Nemecek |
| 6,924,668 | B2 | 8/2005 | Muller et al. |
| 6,934,674 | B1 | 8/2005 | Douezy et al. |
| 6,937,075 | B2 | 8/2005 | Lim et al. |
| 6,940,356 | B2 | 9/2005 | McDonald et al. |
| 6,941,336 | B1 | 9/2005 | Mar |
| 6,941,538 | B2 | 9/2005 | Hwang et al. |
| 6,944,018 | B2 | 9/2005 | Caldwell |
| 6,949,811 | B2 | 9/2005 | Miyazawa |
| 6,949,984 | B2 | 9/2005 | Siniscalchi |
| 6,950,954 | B1 | 9/2005 | Sullam et al. |
| 6,950,990 | B2 | 9/2005 | Rajarajan et al. |
| 6,952,778 | B1 | 10/2005 | Snyder |
| 6,954,511 | B2 | 10/2005 | Tachimori |
| 6,954,904 | B2 | 10/2005 | White |
| 6,956,419 | B1 | 10/2005 | Mann et al. |
| 6,957,180 | B1 | 10/2005 | Nemecek |
| 6,957,242 | B1 | 10/2005 | Snyder |
| 6,963,233 | B2 | 11/2005 | Puccio et al. |
| 6,963,908 | B1 | 11/2005 | Lynch et al. |
| 6,966,039 | B1 | 11/2005 | Bartz et al. |
| 6,967,511 | B1 | 11/2005 | Sullam |
| 6,967,960 | B1 | 11/2005 | Bross et al. |
| 6,968,346 | B2 | 11/2005 | Hekmatpour |
| 6,969,978 | B2 | 11/2005 | Dening |
| 6,970,844 | B1 | 11/2005 | Bierenbaum |
| 6,971,004 | B1 | 11/2005 | Pleis et al. |
| 6,973,400 | B2 | 12/2005 | Cahill-O'Brien et al. |
| 6,975,123 | B1 | 12/2005 | Malang et al. |
| 6,980,060 | B2 | 12/2005 | Boerstler et al. |
| 6,981,090 | B1 | 12/2005 | Kutz et al. |
| 6,988,192 | B2 | 1/2006 | Snider |
| 6,996,799 | B1 | 2/2006 | Cismas et al. |
| 7,005,933 | B1 | 2/2006 | Shutt |
| 7,009,444 | B1 | 3/2006 | Scott |
| 7,010,773 | B1 | 3/2006 | Bartz et al. |
| 7,015,735 | B2 | 3/2006 | Kimura et al. |
| 7,017,145 | B2 | 3/2006 | Taylor |
| 7,017,409 | B2 | 3/2006 | Zielinski et al. |
| 7,020,854 | B2 | 3/2006 | Killian et al. |
| 7,023,215 | B2 | 4/2006 | Steenwyk |
| 7,023,257 | B1 | 4/2006 | Sullam |
| 7,024,636 | B2 | 4/2006 | Weed |
| 7,024,654 | B2 | 4/2006 | Bersch et al. |
| 7,026,861 | B2 | 4/2006 | Steenwyk |
| 7,030,513 | B2 | 4/2006 | Caldwell |
| 7,030,656 | B2 | 4/2006 | Lo et al. |
| 7,030,688 | B2 | 4/2006 | Dosho et al. |
| 7,030,782 | B2 | 4/2006 | Ely et al. |
| 7,034,603 | B2 | 4/2006 | Brady et al. |
| 7,042,301 | B2 | 5/2006 | Sutardja |
| 7,047,166 | B2 | 5/2006 | Dancea |
| 7,055,035 | B2 | 5/2006 | Allison et al. |
| 7,058,921 | B1 | 6/2006 | Hwang et al. |
| 7,073,158 | B2 | 7/2006 | McCubbrey |
| 7,076,420 | B1 | 7/2006 | Snyder et al. |
| 7,079,166 | B1 | 7/2006 | Hong |
| 7,086,014 | B1 | 8/2006 | Bartz et al. |
| 7,088,166 | B1 | 8/2006 | Reinschmidt et al. |
| 7,089,175 | B1 | 8/2006 | Nemecek et al. |
| 7,091,713 | B2 | 8/2006 | Erdelyi et al. |
| 7,092,980 | B1 | 8/2006 | Mar et al. |
| 7,098,414 | B2 | 8/2006 | Caldwell |
| 7,099,818 | B1 | 8/2006 | Nemecek |
| 7,103,108 | B1 | 9/2006 | Beard |
| 7,109,978 | B2 | 9/2006 | Gillespie et al. |
| 7,117,485 | B2 | 10/2006 | Wilkinson et al. |
| 7,119,550 | B2 | 10/2006 | Kitano et al. |
| 7,119,602 | B2 | 10/2006 | Davis |
| 7,124,376 | B2 | 10/2006 | Zaidi et al. |
| 7,127,630 | B1 | 10/2006 | Snyder |
| 7,129,793 | B2 | 10/2006 | Gramegna |
| 7,129,873 | B2 | 10/2006 | Kawamura |
| 7,132,835 | B1 | 11/2006 | Arcus |
| 7,133,140 | B2 | 11/2006 | Lukacs et al. |
| 7,133,793 | B2 | 11/2006 | Ely et al. |
| 7,138,841 | B1 | 11/2006 | Li |
| 7,138,868 | B2 | 11/2006 | Sanchez et al. |
| 7,139,530 | B2 | 11/2006 | Kusbel |
| 7,141,968 | B2 | 11/2006 | Hibbs et al. |
| 7,141,987 | B2 | 11/2006 | Hibbs et al. |
| 7,149,316 | B1 | 12/2006 | Kutz et al. |
| 7,150,002 | B1 | 12/2006 | Anderson et al. |
| 7,151,528 | B2 | 12/2006 | Taylor et al. |
| 7,152,027 | B2 | 12/2006 | Adreade et al. |
| 7,154,294 | B2 | 12/2006 | Liu et al. |
| 7,161,936 | B1 | 1/2007 | Barrass et al. |
| 7,162,410 | B1 | 1/2007 | Nemecek et al. |
| 7,176,701 | B2 | 2/2007 | Wachi et al. |
| 7,178,096 | B2 | 2/2007 | Rangan et al. |
| 7,180,342 | B1 | 2/2007 | Shutt et al. |
| 7,185,162 | B1 | 2/2007 | Snyder |
| 7,185,321 | B1 | 2/2007 | Roe et al. |
| 7,188,063 | B1 | 3/2007 | Snyder |
| 7,193,901 | B2 | 3/2007 | Ruby et al. |
| 7,200,507 | B2 | 4/2007 | Chen et al. |
| 7,206,733 | B1 | 4/2007 | Nemecek |
| 7,212,189 | B2 | 5/2007 | Shaw et al |
| 7,221,187 | B2 | 5/2007 | Snyder et al. |
| 7,227,389 | B2 | 6/2007 | Gong et al. |
| 7,236,921 | B1 | 6/2007 | Nemecek et al. |
| 7,250,825 | B2 | 7/2007 | Wilson et al. |
| 7,256,588 | B2 | 8/2007 | Howard et al. |
| 7,265,633 | B1 | 9/2007 | Stiff |
| 7,266,768 | B2 | 9/2007 | Ferlitsch et al. |
| 7,281,846 | B2 | 10/2007 | McLeod |
| 7,282,905 | B2 | 10/2007 | Chen et al. |

| | | |
|---|---|---|
| 7,283,151 B2 | 10/2007 | Nihei et al. |
| 7,287,112 B1 | 10/2007 | Pleis et al. |
| 7,288,977 B2 | 10/2007 | Stanley |
| 7,290,244 B2 | 10/2007 | Peck et al. |
| 7,295,049 B1 | 11/2007 | Moyal et al. |
| 7,298,124 B2 | 11/2007 | Kan et al. |
| 7,301,835 B2 | 11/2007 | Joshi et al. |
| 7,305,510 B2 | 12/2007 | Miller |
| 7,307,485 B1 | 12/2007 | Snyder et al. |
| 7,308,608 B1 | 12/2007 | Pleis et al. |
| 7,312,616 B2 | 12/2007 | Snyder |
| 7,323,879 B2 | 1/2008 | Kuo et al. |
| 7,342,405 B2 | 3/2008 | Eldridge et al. |
| 7,358,714 B2 | 4/2008 | Watanabe et al. |
| 7,367,017 B2 | 4/2008 | Maddocks et al. |
| 7,373,437 B2 | 5/2008 | Seigneret et al. |
| 7,376,001 B2 | 5/2008 | Joshi et al. |
| 7,376,904 B2 | 5/2008 | Cifra et al. |
| 7,386,740 B2 | 6/2008 | Kutz et al. |
| 7,400,183 B1 | 7/2008 | Sivadasan et al. |
| 7,406,674 B1 | 7/2008 | Ogami et al. |
| 7,421,251 B2 | 9/2008 | Westwick et al. |
| 7,466,307 B2 | 12/2008 | Trent, Jr. et al. |
| 7,542,533 B2 | 6/2009 | Jasa et al. |
| 7,554,847 B2 | 6/2009 | Lee |
| 7,616,509 B2 | 11/2009 | Qureshi et al. |
| 2001/0002129 A1 | 5/2001 | Zimmerman et al. |
| 2001/0010083 A1 | 7/2001 | Satoh |
| 2001/0038392 A1 | 11/2001 | Humpleman et al. |
| 2001/0043081 A1 | 11/2001 | Rees |
| 2001/0044927 A1 | 11/2001 | Karniewicz |
| 2001/0045861 A1 | 11/2001 | Bloodworth et al. |
| 2001/0047509 A1 | 11/2001 | Mason et al. |
| 2002/0010716 A1 | 1/2002 | McCartney et al. |
| 2002/0016706 A1 | 2/2002 | Cooke et al. |
| 2002/0023110 A1 | 2/2002 | Fortin et al. |
| 2002/0042696 A1 | 4/2002 | Garcia et al. |
| 2002/0052729 A1 | 5/2002 | Kyung et al. |
| 2002/0059543 A1 | 5/2002 | Cheng et al. |
| 2002/0063688 A1 | 5/2002 | Shaw et al. |
| 2002/0065646 A1 | 5/2002 | Waldie et al. |
| 2002/0068989 A1 | 6/2002 | Ebisawa et al. |
| 2002/0073119 A1 | 6/2002 | Richard |
| 2002/0073380 A1 | 6/2002 | Cooke |
| 2002/0080186 A1 | 6/2002 | Frederiksen |
| 2002/0085020 A1 | 7/2002 | Carroll, Jr. |
| 2002/0099863 A1 | 7/2002 | Comeau et al. |
| 2002/0109722 A1 | 8/2002 | Rogers et al. |
| 2002/0116168 A1 | 8/2002 | Kim |
| 2002/0122060 A1 | 9/2002 | Markel |
| 2002/0129334 A1 | 9/2002 | Dane et al. |
| 2002/0133771 A1 | 9/2002 | Barnett |
| 2002/0133794 A1 | 9/2002 | Kanapathippillai et al. |
| 2002/0138516 A1 | 9/2002 | Igra |
| 2002/0121679 A1 | 10/2002 | Bazarjani et al. |
| 2002/0144099 A1 | 10/2002 | Muro, Jr. et al. |
| 2002/0145433 A1 | 10/2002 | Morrise et al. |
| 2002/0152234 A1 | 10/2002 | Estrada et al. |
| 2002/0152449 A1 | 10/2002 | Lin |
| 2002/0156885 A1 | 10/2002 | Thakkar |
| 2002/0156998 A1 | 10/2002 | Casselman |
| 2002/0161802 A1 | 10/2002 | Gabrick et al. |
| 2002/0166100 A1 | 11/2002 | Meding |
| 2002/0174134 A1 | 11/2002 | Goykhman |
| 2002/0174411 A1 | 11/2002 | Feng et al. |
| 2002/0191029 A1 | 12/2002 | Gillespie et al. |
| 2003/0011639 A1 | 1/2003 | Webb |
| 2003/0014447 A1 | 1/2003 | White |
| 2003/0025734 A1 | 2/2003 | Boose et al. |
| 2003/0041235 A1 | 2/2003 | Meyer |
| 2003/0056071 A1 | 3/2003 | Triece et al. |
| 2003/0058469 A1 | 3/2003 | Buis et al. |
| 2003/0061572 A1 | 3/2003 | McClannahan et al. |
| 2003/0062889 A1 | 4/2003 | Ely et al. |
| 2003/0080755 A1 | 5/2003 | Kobayashi |
| 2003/0097640 A1 | 5/2003 | Abrams et al. |
| 2003/0105620 A1 | 6/2003 | Bowen |
| 2003/0126947 A1 | 7/2003 | Margaria |
| 2003/0135842 A1 | 7/2003 | Frey et al. |
| 2003/0149961 A1 | 8/2003 | Kawai et al. |
| 2003/0229482 A1 | 12/2003 | Cook et al. |
| 2004/0018711 A1 | 1/2004 | Madurawe |
| 2004/0054821 A1 | 3/2004 | Warren et al. |
| 2004/0153802 A1 | 8/2004 | Kudo et al. |
| 2004/0205553 A1 | 10/2004 | Hall et al. |
| 2004/0205617 A1 | 10/2004 | Light |
| 2004/0205695 A1 | 10/2004 | Fletcher |
| 2005/0024341 A1 | 2/2005 | Gillespie et al. |
| 2005/0066152 A1 | 3/2005 | Garey |
| 2005/0143968 A9 | 6/2005 | Odom et al. |
| 2005/0240917 A1 | 10/2005 | Wu |
| 2005/0248534 A1 | 11/2005 | Kehlstadt |
| 2005/0280453 A1 | 12/2005 | Hsieh |
| 2006/0015862 A1 | 1/2006 | Odom et al. |
| 2006/0031768 A1 | 2/2006 | Shah et al. |
| 2006/0032680 A1 | 2/2006 | Elias et al. |
| 2006/0097991 A1 | 5/2006 | Hotelling et al. |
| 2006/0273804 A1 | 12/2006 | Delorme et al. |
| 2007/0139074 A1 | 6/2007 | Reblewski |
| 2007/0258458 A1 | 11/2007 | Kapoor |
| 2008/0095213 A1 | 4/2008 | Lin et al. |
| 2008/0186052 A1 | 8/2008 | Needham et al. |
| 2008/0259998 A1 | 10/2008 | Venkataraman et al. |
| 2008/0294806 A1 | 11/2008 | Swindle et al. |
| 2009/0322305 A1 | 12/2009 | De Cremoux |

FOREIGN PATENT DOCUMENTS

| | | |
|---|---|---|
| EP | 0308503 A1 | 3/1989 |
| EP | 0308583 A2 | 3/1989 |
| EP | 368398 A1 | 5/1990 |
| EP | 0450863 A1 | 10/1991 |
| EP | 0450863 A2 | 10/1991 |
| EP | 0499383 A1 | 8/1992 |
| EP | 0499383 A2 | 8/1992 |
| EP | 0369816 A1 | 2/1995 |
| EP | 0369816 A2 | 2/1995 |
| EP | 1170671 A1 | 1/2002 |
| EP | 1205848 A1 | 5/2002 |
| EP | 1191423 A1 | 2/2003 |
| EP | 1191423 A2 | 2/2003 |
| JP | 404083405 A1 | 3/1992 |
| JP | 405055842 A1 | 3/1993 |
| JP | 06021732 A1 | 1/1994 |
| JP | 404095408 A1 | 3/2002 |
| WO | 9532478 A1 | 11/1995 |
| WO | PCT/US96/17305 A1 | 6/1996 |
| WO | PCT/US98/34376 A1 | 8/1998 |
| WO | PCT/US99/09712 A1 | 2/1999 |

OTHER PUBLICATIONS

U.S. Appl. No. 09/909,109, filed Jul. 18, 2001, Snyder.
U.S. Appl. No. 09/909,047, filed Jul. 18, 2001, Mar.
U.S. Appl. No. 10/033,027, filed Oct. 1, 2001, Snyder.
"Digital Configurable Macro Architecture;" Jul. 18, 2001; U.S. Appl. No. 09/909,045; W. Snyder.
"Configuring Digital Functions in a Digital Configurable Macro Architecture"; Jul. 18, 2001; U.S. Appl. No. 09/909,109; W. Snyder.
"A Programmable Analog System Architecture (As Amended)"; Jul. 18, 2001; U.S. Appl. No. 09/909,047; M. Mar.
"Programmable System on a Chip"; Oct. 10, 2001; U.S. Appl. No. 10/033,027; W. Snyder.
USPTO Notice of Allowance for U.S. Appl. No. 10/803,030, dated Jan. 8, 2007; 6 pages.
USPTO Non-Final Rejection for U.S. Appl. No. 10/803,030, dated Jun. 8, 2005; 4 pages.

USPTO Notice of Allowance for U.S. Appl. No. 10/238,966 dated Jan. 27, 2009; 4 pages.
USPTO Non-Final Rejection for U.S. Appl. No. 10/238,966 dated Jun. 30, 2008; 12 pages.
USPTO Non-Final Rejection for U.S. Appl. No. 10/238,966 dated Dec. 26, 2007; 12 pages.
USPTO Final Rejection for U.S. Appl. No. 10/238,966 dated Sep. 27, 2007; 9 pages.
USPTO Non-Final Rejection for U.S. Appl. No. 10/238,966 dated Apr. 19, 2007; 7 pages.
USPTO Non-Final Rejection for U.S. Appl. No. 10/238,966 dated Oct. 20, 2006; 8 pages.
USPTO Non-Final Rejection for U.S. Appl. No. 10/238,966 dated Apr. 6, 2006; 8 pages.
USPTO Notice of Allowance for U.S. Appl. No. 10/033,027 dated Mar. 31, 2009; 7 pages.
USPTO Non-Final Rejection for U.S. Appl. No. 10/033,027 dated Dec. 18, 2008; 5 pages.
USPTO Final Rejection for U.S. Appl. No. 10/033,027 dated Jun. 8, 2007; 8 pages.
USPTO Non-Final Rejection for U.S. Appl. No. 10/033,027 dated Dec. 21, 2006; 31 pages.
USPTO Final Rejection for U.S. Appl. No. 10/033,027 dated Aug. 9, 2006; 6 pages.
USPTO Non-Final Rejection for U.S. Appl. No. 10/033,027 dated Apr. 26, 2006; 26 pages.
USPTO Final Rejection for U.S. Appl. No. 10/033,027 dated Oct. 31, 2005; 24 pages.
USPTO Non-Final Rejection for U.S. Appl. No. 10/033,027 dated Apr. 20, 2005; 20 pages.
USPTO Non-Final Rejection for U.S. Appl. No. 10/033,027 dated Oct. 18, 2004; 17 pages.
USPTO Non-Final Rejection for U.S. Appl. No. 10/001,478 dated Oct. 20, 2008; 18 pages.
USPTO Final Rejection for U.S. Appl. No. 10/001,478 dated Jun. 4, 2008; 18 pages.
USPTO Non-Final Rejection for U.S. Appl. No. 10/001,478 dated Jan. 30, 2008; 19 pages.
USPTO Final Rejection for U.S. Appl. No. 10/001,478 dated Sep. 17, 2007; 15 pages.
USPTO Non-Final Rejection for U.S. Appl. No. 10/001,478 dated Apr. 2, 2007; 17 pages.
USPTO Final Rejection for U.S. Appl. No. 10/001,478 dated Sep. 5, 2006; 19 pages.
USPTO Non-Final Rejection for U.S. Appl. No. 10/001,478 dated Mar. 15, 2006; 19 pages.
USPTO Final Rejection for U.S. Appl. No. 10/001,478 dated Oct. 24, 2005; 15 pages.
USPTO Non-Final Rejection for U.S. Appl. No. 10/001,478 dated May 16, 2005; 13 pages.
USPTO Notice of Allowance for U.S. Appl. No. 10/002,217 dated Jan. 28, 2009; 4 pages.
USPTO Notice of Allowance for U.S. Appl. No. 10/002,217 dated Oct. 14, 2008; 6 pages.
USPTO Notice of Allowance for U.S. Appl. No. 10/002,217 dated Jun. 6, 2008; 7 pages.
USPTO Final Rejection for U.S. Appl. No. 10/002,217 dated Feb. 6, 2008; 10 pages.
USPTO Non-Final Rejection for U.S. Appl. No. 10/002,217 dated Aug. 3, 2007; 10 pages.
USPTO Final Rejection for U.S. Appl. No. 10/002,217 dated Mar. 7, 2007; 12 pages.
USPTO Non-Final Rejection for U.S. Appl. No. 10/002,217 dated Oct. 2, 2006; 21 pages.
USPTO Non-Final Rejection for U.S. Appl. No. 10/002,217 dated Apr. 3, 2006; 12 pages.
USPTO Final Rejection for U.S. Appl. No. 10/002,217 dated Nov. 17, 2005; 17 pages.
USPTO Non-Final Rejection for U.S. Appl. No. 10/002,217 dated May 19, 2005; 15 pages.
USPTO Advisory Action for U.S. Appl. No. 10/001,477 dated Oct. 10, 2008; 3 pages.
"An Analog PPL-Based Clock and Data Recovery Circuit with High Input Jitter Tolerance;" Sun, Reprinted from IEEE Journal of Solid-State Circuits, 1989; 4 pages.
"WP 3.5: An Integrated Time Reference;" Blauschild, Digest of Technical Papers, 1994; 4 pages.
"Micropower CMOS Temperature Sensor with Digital Output;" Bakker et al., IEEE Journal of Solid-State Circuits, 1996; 3 pages.
U.S. Appl. No. 09/964,991: "A Novel Band-Gap Circuit for Providing an Accurate Reference Voltage Compensated for Process State, Process Variations and Temperature," Kutz et al.; filed on Sep. 26, 2001; 25 pages.
U.S. Appl. No. 09/842,966: "Precision Crystal Oscillator Circuit Used in Microcontroller," Mar; filed on Apr. 25, 2001; 28 pages.
USPTO Non-Final Rejection for U.S. Appl. No. 09/975,115 dated Oct. 9, 2008; 34 pages.
USPTO Final Rejection for U.S. Appl. No. 09/975,115 dated May 12, 2008; 33 pages.
USPTO Non-Final Rejection for U.S. Appl. No. 09/975,115 dated Jan. 7, 2008; 30 pages.
USPTO Non-Final Rejection for U.S. Appl. No. 09/975,115 dated Jul. 31, 2007; 28 pages.
USPTO Final Rejection for U.S. Appl. No. 09/975,115 dated Feb. 21, 2007; 25 pages.
USPTO Non-Final Rejection for U.S. Appl. No. 09/975,915 dated Oct. 31, 2006; 19 pages.
USPTO Final Rejection for U.S. Appl. No. 09/975,115 dated Jun. 23, 2006; 20 pages.
USPTO Non-Final Rejection for U.S. Appl. No. 09/975,115 dated Jan. 11, 2006; 15 pages.
USPTO Non-Final Rejection for U.S. Appl. No. 09/975,115 dated Jul. 27, 2005; 11 pages.
USPTO Non-Final Rejection for U.S. Appl. No. 09/975,115 dated Feb. 11, 2005; 86 pages.
USPTO Final Rejection for U.S. Appl. No. 09/975,338 dated Jan. 31, 2008; 21 pages.
USPTO Non-Final Rejection for U.S. Appl. No. 09/975,338 dated Aug. 14, 2007; 19 pages.
USPTO Final Rejection for U.S. Appl. No. 09/975,338 dated Feb. 27, 2007; 23 pages.
USPTO Non-Final Rejection for U.S. Appl. No. 09/975,338 dated Sep. 6, 2006; 11 pages.
USPTO Advisory Action for U.S. Appl. No. 09/975,338 dated May 15, 2006; 4 pages.
USPTO Final Rejection for U.S. Appl. No. 09/975,338 dated Jan. 18, 2006; 12 pages.
USPTO Non-Final Rejection for U.S. Appl. No. 09/975,338 dated Apr. 5, 2005; 13 pages.
USPTO Final Rejection for U.S. Appl. No. 10/008,096 dated Feb. 10, 2005; 15 pages.
USPTO Final Rejection for U.S. Appl. No. 10/008,096 dated Jun. 16, 2008; 23 pages.
USPTO Final Rejection for U.S. Appl. No. 10/008,096 dated Sep. 4, 2007; 19 pages.
USPTO Final Rejection for U.S. Appl. No. 10/008,096 dated Oct. 13, 2006; 17 pages.
USPTO Final Rejection for U.S. Appl. No. 10/008,096 dated Nov. 25, 2005; 17 pages.
USPTO Non-Final Rejection for U.S. Appl. No. 10/008,096 dated Mar. 7, 2007; 19 pages.
USPTO Non-Final Rejection for U.S. Appl. No. 10/008,096 dated Apr. 17, 2006; 18 pages.
USPTO Non-Final Rejection for U.S. Appl. No. 10/008,096 dated Jun. 14, 2004; 24 pages.
USPTO Non-Final Rejection for U.S. Appl. No. 10/008,096 dated Jun. 24, 2005; 15 pages.
USPTO Non-Final Rejection for U.S. Appl. No. 10/008,096 dated Dec. 12, 2007; 14 pages.
USPTO Notice of Allowance for U.S. Appl. No. 10/008,096 dated Dec. 22, 2008; 24 pages.
USPTO Notice of Allowance for U.S. Appl. No. 09/975,105 dated Dec. 4, 2006; 4 pages.
USPTO Final Rejection for U.S. Appl. No. 09/975,105 dated Jul. 13, 2006; 7 pages.

USPTO Non-Final Rejection for U.S. Appl. No. 09/975,105 dated Jan. 19, 2006; 5 pages.
USPTO Non-Final Rejection for U.S. Appl. No. 09/975,105 dated Apr. 19, 2005; 9 pages.
U.S. Appl. No. 09/943,062: "Apparatus and Method for Programmable Power Management in a Programmable Analog Circuit Block;" Mar; filed on Aug. 29, 2001; 46 pages.
U.S. Appl. No. 10/238,966: "Method for Parameterizing a User Module;" Perrin; filed on Sep. 9, 2002; 41 pages.
USPTO Notice of Allowance for U.S. Appl. No. 10/324,455 dated Feb. 12, 2004; 4 pages.
USPTO Non-Final Rejection for U.S. Appl. No. 10/324,455 dated Nov. 6, 2003; 4 pages.
USPTO Non-Final Rejection for U.S. Appl. No. 10/324,455 dated Aug. 21, 2003; 4 pages.
USPTO Notice of Allowance for U.S. Appl. No. 09/998,859 dated Mar. 14, 2005; 6 pages.
USPTO Non-Final Rejection for U.S. Appl. No. 09/998,859 dated Nov. 4, 2004; 6 pages.
USPTO Final Rejection for U.S. Appl. No. 09/998,859 dated Nov. 19, 2003; 5 pages.
USPTO Non-Final Rejection for U.S. Appl. No. 09/998,859 dated May 28, 2003; 6 pages.
USPTO Non-Final Rejection for U.S. Appl. No. 09/998,859 dated May 15, 2003; 6 pages.
USPTO Notice of Allowance for U.S. Appl. No. 09/998,834 dated May 19, 2005; 7 pages.
USPTO Non-Final Rejection for U.S. Appl. No. 09/998,834 dated Sep. 20, 2004; 11 pages.
USPTO Notice of Allowance for U.S. Appl. No. 10/113,065 dated Apr. 6, 2006; 8 pages.
USPTO Final Rejection for U.S. Appl. No. 10/113,065 dated Oct. 26, 2005; 17 pages.
USPTO Non-Final Rejection for U.S. Appl. No. 10/113,065 dated May 20, 2005; 14 pages.
U.S. Appl. No. 09/207,912: "Circuit(s), Architecture and Method(s) for Operating and/or Tuning a Ring Oscillator," Mar; filed on Dec. 9, 1998; 23 pages.
USPTO Notice of Allowance for U.S. Appl. No. 10/001,477 dated May 8, 2009; 6 pages.
From U.S. Appl. No. 10/033,027: Goodenough, F. "Analog Counterparts of FPGAS Ease System Design" Electronic Design, Penton Publishing, Cleveland, OH, US vol. 42, No. 21, Oct. 14, 1994; 10 pages.
From U.S. Appl. No. 10/033,027: Harbaum, T. et al. "Design of a Flexible Coprocessor Unit" Proceedings of the Euromicro Conference, XX XX, Sep. 1999; 10 pages.
USPTO U.S. Appl. No. 09/924,734: "Programmable Microcontroller (PSoC) Architecture (Mixed Analog/Digital)"; Snyder et al., filed on Aug. 7, 2001; 28 pages.
USPTO U.S. Appl. No. 10/011,214: "Method and Circuit for Synchronizing a Write Operation between an On-Chip Microprocessor and an On-Chip Programmable Analog Device Operating at Different Frequencies," Sullam et al., filed on Oct. 25, 2001; 49 pages.
USPTO U.S. Appl. No. 09/935,454: "Method and Apparatus for Local and Global Power Management in a Programmable Analog Circuit," Monte Mar, filed on Aug. 22, 2001; 51 pages.
USPTO U.S. Appl. No. 09/923,461: "Non-Interfering Multiply-Mac (Multiply Accumulate) Circuit," Warren Snyder, filed on Aug. 6, 2001; 25 pages.
USPTO U.S. Appl. No. 09/930,021: "Programmable Methodology and Architecture for a Programmable Analog System"; Mar et al., filed on Aug. 14, 2001; 87 pages.
USPTO U.S. Appl. No. 09/969,311: "Method for Synchronizing and Resetting Clock Signals Supplied to Multiple Programmable Analog Blocks," Bert Sullam, filed on Oct. 1, 2001; 57 pages.
USPTO U.S. Appl. No. 09/875,599: "Method and Apparatus for Programming a Flash Memory," Warren Snyder, filed on Jun. 5, 2001; 23 pages.
USPTO U.S. Appl. No. 09/975,115: "In-System Chip Emulator Architecture," Snyder et al., filed on Oct. 10, 2001; 38 pages.

USPTO U.S. Appl. No. 09/953,423: "A Configurable Input/Output Interface for a Microcontroller," Warren Snyder, filed on Sep. 14, 2001; 28 pages.
USPTO U.S. Appl. No. 09/893,050: "Multiple Use of Microcontroller Pad,"Kutz et al., filed on Jun. 26, 2001; 21 pages.
USPTO U.S. Appl. No. 09/929,891: "Programming Architecture for a Programmable Anaglog System," Mar et al., filed on Aug. 14, 2001; 82 pages.
USPTO U.S. Appl. No. 09/969,313: "Architecture for Synchronizing and Resetting Clock Signals Supplied to Multiple Analog Programmable Analog Blocks," Bert Sullam, filed on Oct. 1, 2001; 50 pages.
USPTO Non-Final Rejection for U.S. Appl. No. 09/994,601 dated Nov. 14, 2006; 15 pages.
USPTO Final Rejection for U.S. Appl. No. 09/994,601 dated Mar. 8, 2006; 11 pages.
USPTO Non-Final Rejection for U.S. Appl. No. 09/994,601 dated Sep. 21, 2005; 12 pages.
USPTO Final Rejection for U.S. Appl. No. 09/994,601 dated Mar. 24, 2005; 10 pages.
Hintz et al.; "Microcontrollers", 1992, McGraw-Hill; 11 pages.
Ganapathy, Gopi, and Narayan, Ram, and Jorden, Glen, and Fernandez, Denzil, and Wang, Ming, and Nishimura, Jim; "Hardware Emulation for Functional Verification of K5", Jun. 1996, 33rd Design Automation Conference Proceedings, Jun. 3-7, 1996; 4 pages.
U.S. Appl. No. 60/243,708 "Advanced Programmable Microcontroller Device"; Oct. 26, 2000; 277 pages.
"Webster's Third New International Dictionary", 1996, G. & C. Merriam Company; 3 pages (including pp. 1328-1329).
USPTO Advisory Action for U.S. Appl. No. 09/998,848 dated Sep. 7, 2005; 3 pages.
USPTO U.S. Appl. No. 09/957,084: "A Crystal-Less Oscillator with Trimmable Analog Current Control for Increased Stability," Mar et al., filed on Sep. 19, 2001; 28 pages.
USPTO U.S. Appl. No. 09/972,319: "Method for Applying Instructions to Microprocessor in Test Mode," Warren Snyder, filed on Oct. 5, 2001; 31 pages.
USPTO U.S. Appl. No. 09/972,003: "Test Architecture for Microcontroller Providing for a Serial Communication Interface," Warren Snyder, filed on Oct. 5, 2001; 32 pages.
U.S. Appl. No. 09/972,133: "Method for Entering Circuit Test Mode;" Snyder; 30 pages.
U.S. Appl. No. 09/973,535: "Architecture for Decimation Algorithm;" Snyder; 26 pages.
USPTO U.S. Appl. No. 09/977,111: "A Frequency Doubler Circuit with Trimmable Current Control," Shutt et al., filed on Oct. 11, 2001; 35 pages.
USPTO U.S. Appl. No. 10/272,231: "Digital Configurable Macro Architecture," Warren Snyder, filed on Oct. 15, 2002, 36 pages.
USPTO U.S. Appl. No. 11/125,554: "A Method for a Efficient Supply to a Microcontroller," Kutz et al., filed on May 9, 2005; 1 page.
USPTO U.S. Appl. No. 09/855,868: "Protecting Access to Microcontroller Memory Blocks," Warren Snyder, filed on May 14, 2001, 28 pages.
USPTO U.S. Appl. No. 09/887,923: "Novel Method and System for Interacting between a Processor and a Power on Reset to Dynamically Control Power States in a Microcontroller," Kutz et al., filed on Jun. 22, 2001; 44 pages.
USPTO U.S. Appl. No. 10/000,383: "System and Method of Providing a Programmable Clock Architecture for an Advanced Microcontroller," Sullam et al., filed on Oct. 24, 2001; 34 pages.
USPTO U.S. Appl. No. 10/001,477: "Breakpoint Control in an In-Circuit Emulation System," Roe et al., filed on Nov. 1, 2001; 43 pages.
USPTO U.S. Appl. No. 10/004,197: "In-Circuit Emulator with Gatekeeper Based Halt Control," Nemecek et al., filed on Nov. 14, 2001; 47 pages.
USPTO U.S. Appl. No. 10/004,039: "In-Circuit Emulator with Gatekeeper for Watchdog Timer," Nemecek et al., filed on Nov. 14, 2001; 46 pages.
USPTO U.S. Appl. No. 10/002,217: "Conditional Branching in an In-Circuit Emulation System," Craig Nemecek, filed on Nov. 1, 2001; 43 pages.

USPTO U.S. Appl. No. 10/001,568: "Combined In-Circuit Emulator and Programmer," Nemecek et al., filed on Nov. 1, 2001; 47 pages.
USPTO U.S. Appl. No. 10/001,478: "In-Circuit Emulator and Pod Synchronized Boot," Nemecek et al., filed on Nov. 1, 2001; 44 pages.
USPTO U.S. Appl. No. 09/887,955: "Novel Power on Reset Circuit for Microcontroller," Kutz et al., filed on Jun. 22, 2001; 42 pages.
USPTO U.S. Appl. No. 09/826,397: "Method and Circuit for Allowing a Microprocessor to Change its Operating Frequency on-the-Fly," Bert Suilam, filed on Apr. 2, 2001; 24 pages.
USPTO U.S. Appl. No. 09/893,048: "A Microcontroller having an On-Chip High Gain Amplifier," Kutz et al., filed on Jun. 26, 2001; 22 pages.
USPTO U.S. Appl. No. 09/912,768: "A Microcontroller having a Dual Mode Relax Oscillator that is Trimmable," James Shutt; filed on Jul. 24, 2001; 33 pages.
USPTO U.S. Appl. No. 09/922,419: "A Power Supply Pump Circuit for a Microcontroller," Kutz et al., filed on Aug. 3, 2001; 38 pages.
USPTO U.S. Appl. No. 09/922,579: "A Method for a Efficient Supply to a Microcontroller," Kutz et al., filed on Aug. 3, 2001; 37 pages.
Bursky, "FPGA Combines Multiple Interfaces and Logic," Electronic Design, vol. 48 No. 20, pp. 74-78 (Oct. 2, 2000); 5 pages.
Anonymous, "Warp Nine Engineering—The IEEE 1284 Experts-F/Port Product Sheet," undated web page found at http://www.fapo.com/fport.htm; printed on Apr. 12, 2005; 2 pages.
Anonymous, "F/Port:Fast Parallel Port for the PC" Installation Manual Release 7.1, circa 1997, available for download from http://www.fapo.com/fport.htm; 25 pages.
Nam et al.; "Fast Development of Source-Level Debugging System Using Hardware Emulation"; IEEE 2000; 4 pages.
Huang et al.; "Iceberg: An Embedded In-Cicuit Emulator Synthesizer for Microcontrollers"; ACM 1999; 6 pages.
Khan et al.; "FPGA Architectures for Asic Hardware Emulators"; IEEE 1993; 5 pages.
Oh et al.; Emulator Environment Based on an FPGA Prototyping Board; IEEE 21-23; Jun. 2000; 6 pages.
Hong et al.; "An FPGA-Based Hardware Emulator for Fast Fault Emulation"; IEEE 1997; 4 pages.
Ching et al.; "An In-Curcuit-Emulator for TMS320C25"; IEEE 1994; 6 pages.
Pasternak; "In-Circuit-Emulation in ASIC Architecture Cor Designs"; IEEE 1989; 4 pages.
Melear; "Using Background Modes for Testing, Debugging and Emulation of Microcontrollers"; IEEE 1997; 8 pages.
Walters, Stephen; "Computer-Aided Prototyping for ASIC-Based Systems", 1991, IEEE Design & Test of Computers; vol. 8, Issue 2; 8 pages.
Anonymous; "JEEN JTAG Embedded Ice Ethernet Interface"; Aug. 1999; Embedded Performance, Inc.; 3 pages.
Sedory; "A Guide to Debug"; 2004; retrieved on May 20, 2005; 7 pages.
"Microsoft Files Summary Judgement Motions"; Feb. 1999; Microsoft PressPass; retrieved on May 20, 2005 from http://www.microsoft.com/presspass/press/1999/feb99/Feb99/Calderapr.asp; 3 pages.
Xerox; "Mesa Debugger Documentation"; Apr. 1979; Xerox Systems Development Department; Version 5.0; 33 pages.
Stallman et al.; "Debugging with the GNU Source-Level Debugger"; Jan. 1994; retrieved on May 2, 2005 from http://www.cs.utah.edu; 4 pages.
Wikipedia.org; "Von Neumann architecture"; retrieved from http://en.wikipedia.org/wiki/Von_Neumann_architecture on Jan. 22, 2007; 4 pages.
Stan Augarten; "The Chip Collection—Introduction—Smithsonian Institute"; "State of the Art"; "The First 256-Bit Static RAM"; retrieved on Nov. 14, 2005 from http://smithsonianchips.si.edu/augarten/p24.htm; 2 pages.
"POD—Piece of Data, Plain Old Documentation, Plain Old Dos . . . "; retrieved on Nov. 14, 2005 from http://www.auditmypc.com/acronym/POD.asp; 2 pages.
USPTO Non-Final Rejection for U.S. Appl. No. 09/989,767 dated Oct. 6, 2004; 15 pages.
USPTO Final Rejection for U.S. Appl. No. 09/989,771 dated Feb. 27, 2007; 8 pages.

USPTO Final Rejection for U.S. Appl. No. 09/989,771 dated Mar. 28, 2006; 9 pages.
USPTO Final Rejection for U.S. Appl. No. 09/989,771 dated Apr. 6, 2005; 7 pages.
USPTO Final Rejection for U.S. Appl. No. 09/989,771 dated Dec. 10, 2008; 12 pages.
USPTO Final Rejection for U.S. Appl. No. 09/989,771 dated Dec. 27, 2007; 15 pages.
USPTO Non-Final Rejection for U.S. Appl. No. 09/989,771 dated May 28, 2008; 14 pages.
USPTO Non-Final Rejection for U.S. Appl. No. 09/989,771 dated Jul. 16, 2007; 14 pages.
USPTO Non-Final Rejection for U.S. Appl. No. 09/989,771 dated Aug. 23, 2006; 7 pages.
USPTO Non-Final Rejection for U.S. Appl. No. 09/989,771 dated Sep. 12, 2005; 7 pages.
USPTO Non-Final Rejection for U.S. Appl. No. 09/989,771 dated Sep. 22, 2004; 7 pages.
USPTO Final Rejection for U.S. Appl. No. 09/989,765 dated Apr. 3, 2007; 12 pages.
USPTO Final Rejection for U.S. Appl. No. 09/989,765 dated Apr. 4, 2008; 16 pages.
USPTO Final Rejection for U.S. Appl. No. 09/989,765 dated Apr. 17, 2006; 12 pages.
USPTO Non-Final Rejection for U.S. Appl. No. 09/989,765 dated Sep. 19, 2007; 14 pages.
USPTO Non-Final Rejection for U.S. Appl. No. 09/989,765 dated Sep. 26, 2008; 17 pages.
USPTO Non-Final Rejection for U.S. Appl. No. 09/989,765 dated Oct. 2, 2006; 13 pages.
USPTO Non-Final Rejection for U.S. Appl. No. 09/989,765 dated Oct. 5, 2005; 9 pages.
USPTO Final Rejection for U.S. Appl. No. 09/989,782 dated Jul. 9, 2008; 10 pages.
USPTO Final Rejection for U.S. Appl. No. 09/989,782 dated Jul. 24, 2007; 9 pages.
USPTO Final Rejection for U.S. Appl. No. 09/989,782 dated Sep. 21, 2006; 10 pages.
USPTO Final Rejection for U.S. Appl. No. 09/989,782 dated Nov. 3, 2005; 11 pages.
USPTO Non-Final Rejection for U.S. Appl. No. 09/989,782 dated Jan. 29, 2007; 9 pages.
USPTO Non-Final Rejection for U.S. Appl. No. 09/989,782 dated Mar. 28, 2006; 8 pages.
USPTO Non-Final Rejection for U.S. Appl. No. 09/989,782 dated Apr. 29, 2005; 11 pages.
USPTO Non-Final Rejection for U.S. Appl. No. 09/989,782 dated Oct. 6, 2004; 11 pages.
USPTO Non-Final Rejection for U.S. Appl. No. 09/989,782 dated Nov. 26, 2008; 10 pages.
USPTO Non-Final Rejection for U.S. Appl. No. 09/989,782 dated Dec. 14, 2007; 8 pages.
USPTO Final Rejection for U.S. Appl. No. 09/989,765 dated Mar. 31, 2009; 18 pages.
USPTO Final Rejection for U.S. Appl. No. 09/989,778 dated Mar. 16, 2009; 26 pages.
"Pod-Wikipedia, the free encyclopedia"; retrieved on Nov. 14, 2005 from http://en.wikipedia.org/wiki/Pod; 3 pages.
"pod-defintion by dict.die.net"; retrieved on Nov. 14, 2005 from http://dict.die.net/pod; 2 pages.
"In-Curcuit Emulators—descriptions of the major ICEs around"; retrieved on Nov. 14, 2005 from http://www.algonet.se/~staffann/developer/emulator.htm; 6 pages.
USPTO U.S. Appl. No. 09/975,104: "Capturing Test/Emulation and Enabling Real-Time Debugging Using FPGA for In-Circuit Emulation," Warren Snyder, filed on Oct. 10, 2001; 35 pages.
USPTO Non-Final Rejection for U.S. Appl. No. 09/989,767 dated Jul. 24, 2008; 21 pages.
Anonymous; "Using Debug"; 1999; Prentice-Hall Publishing; 20 pages.
Harrison et al.; "Xilinx FPGA Design in a Group Environment Using VHDS and Synthesis Tools"; Colloquium on Digital System Design Using Synthesis Techniques; Feb. 15, 1996; 4 pages.

Microsoft Press Computer User's Dictionary; 1998; 3 pages (including p. 18).

Sreeram Duvvuru and Siamak Arya, "Evaluation of a Branch Target Address Cache," 1995; IEEE; 8 pages.

Andrew S. Tanenbaum with contributions from James R. Goodman, "Structured Computer Organization," 1999, Prentice Hall, Fourth Edition; 32 pages.

USPTO U.S. Appl. No. 09/975,338: "Method for Breaking Execution of a Test Code in DUT and Emulator Chip Essentially Simultaneously and Handling Complex Breakpoint Events," Nemecek et al., filed on Oct. 10, 2001; 34 pages.

USPTO U.S. Appl. No. 09/975,030: "Emulator Chip-Board Architecture for Interface," Snyder et al., filed on Oct. 10, 2001; 37 pages.

Wikipedia—Main Page, retrieved on Mar. 8, 2006 from http://en.wikipedia.org/wiki/Main_Page and http://en.wikipedia.org/wiki/Wikipedia:Introduction; 5 pages.

Wikipedia—Processor register, retrieved on Mar. 7, 2006 from http://en.wikipedia.org/wiki/Processor_register; 4 pages.

Jonathan B. Rosenburg, "How Debuggers Work" John Wiley & Sons, Inc. 1996; 259 pages.

Dahl, et al.; "Emulation of the Sparcle Microprocessor with the MIT Virtual Wires Emulation System"; 1994; IEEE; 9 pages.

Bauer et al.; "A Reconfigurable Logic Machine for Fast Event-Driven Simulation"; 1998; Design Automation Conference Proceedings; 8 pages.

USPTO U.S. Appl. No. 09/975,105: "Host FPGA Interface in an In-Circuit Emulation System," Craig Menecek, filed on Oct. 10, 2001; 44 pages.

USPTO Advisory Action for U.S. Appl. No. 09/994,601 dated May 23, 2006; 3 pages.

USPTO Non-Final Rejection for U.S. Appl. No. 09/994,601 dated Jul. 29, 2004; 10 pages.

USPTO Ex Parte Qualyle Action for U.S. Appl. No. 09/992,076 dated Jun. 18, 2007; 6 pages.

USPTO Non-Final Rejection for U.S. Appl. No. 09/989,767 dated Jul. 2, 2007; 22 pages.

USPTO Notice of Allowance for U.S. Appl. No. 09/992,076 dated Mar. 26, 2008; 23 pages.

USPTO Notice of Allowance for U.S. Appl. No. 09/992,076 dated Jul. 29, 2008; 6 pages.

UPSTO Advisory Action for U.S. Appl. No. 09/989,778 dated May 15, 2006; 4 pages.

USPTO Final Rejection for U.S. Appl. No. 09/989,778 dated Jan. 8, 2009; 25 pages.

USPTO Final Rejection for U.S. Appl. No. 09/989,778 dated Feb. 5, 2007; 17 pages.

USPTO Final Rejection for U.S. Appl. No. 09/989,778 dated Feb. 15, 2006; 9 pages.

USPTO Final Rejection for U.S. Appl. No. 09/989,778 dated Dec. 20, 2007; 14 pages.

USPTO Non-Final Rejection for U.S. Appl. No. 09/989,778 dated Mar. 29, 2005; 14 pages.

USPTO Non-Final Rejection for U.S. Appl. No. 09/989,778 dated Jul. 14, 2008; 24 pages.

USPTO Non-Final Rejection for U.S. Appl. No. 09/989,778 dated Jul. 19, 2007; 18 pages.

USPTO Non-Final Rejection for U.S. Appl. No. 09/989,778 dated Sep. 1, 2005; 10 pages.

USPTO Non-Final Rejection for U.S. Appl. No. 09/989,778 dated Sep. 18, 2006; 11 pages.

USPTO Final Rejection for U.S. Appl. No. 09/998,848 dated Jun. 14, 2005; 17 pages.

USPTO Final Rejection for U.S. Appl. No. 09/998,848 dated Jul. 25, 2006; 16 pages.

USPTO Final Rejection for U.S. Appl. No. 09/998,848 dated Aug. 10, 2007; 14 pages.

USPTO Final Rejection for U.S. Appl. No. 09/998,848 dated Nov. 24, 2008; 15 pages.

USPTO Non-Final Rejection for U.S. Appl. No. 09/998,848 dated Jan. 26, 2006; 17 pages.

USPTO Non-Final Rejection for U.S. Appl. No. 09/998,848 dated Jan. 29, 2007; 13 pages.

USPTO Non-Final Rejection for U.S. Appl. No. 09/998,848 dated Feb. 22, 2008; 15 pages.

USPTO Non-Final Rejection for U.S. Appl. No. 09/998,848 dated Dec. 21, 2004; 14 pages.

USPTO Final Rejection for U.S. Appl. No. 09/989,767 dated Jan. 11, 2007; 12 pages.

USPTO Final Rejection for U.S. Appl. No. 09/989,767 dated Jan. 15, 2009; 21 pages.

USPTO Final Rejection for U.S. Appl. No. 09/989,767 dated Mar. 6, 2006; 15 pages.

USPTO Final Rejection for U.S. Appl. No. 09/989,767 dated Apr. 6, 2005; 13 pages.

USPTO Final Rejection for U.S. Appl. No. 09/989,767 dated Dec. 27, 2007; 21 pages.

USPTO Non-Final Rejection for U.S. Appl. No. 09/989,767 dated Jul. 17, 2006; 12 pages.

USPTO Notice of Allowance for U.S. Appl. No. 09/992,076 dated Nov. 13, 2008; 15 pages.

USPTO Final Rejection for U.S. Appl. No. 09/994,601 dated May 18, 2007; 17 pages.

USPTO Notice of Allowance for U.S. Appl. No. 09/992,076 dated Nov. 29, 2007; 8 pages.

USPTO Final Rejection for U.S. Appl. No. 09/992,076 dated Jan. 30, 2007; 32 pages.

USPTO Non-Final Rejection for U.S. Appl. No. 09/992,076 dated Aug. 10, 2006; 19 pages.

USPTO Final Rejection for U.S. Appl. No. 09/992,076 dated Mar. 17, 2006; 16 pages.

USPTO Non-Final Rejection for U.S. Appl. No. 09/992,076 dated Nov. 21, 2005; 29 pages.

USPTO Non-Final Rejection for U.S. Appl. No. 09/992,076 dated Jun. 1, 2005; 20 pages.

USPTO Notice of Allowance for U.S. Appl. No. 09/994,600 dated Nov. 12, 2008; 35 pages.

USPTO Notice of Allowance for U.S. Appl. No. 09/994,600 dated May 14, 2008; 22 pages.

USPTO Final Rejection for U.S. Appl. No. 09/994,600 dated Oct. 17, 2007; 13 pages.

USPTO Non-Final Rejection for U.S. Appl. No. 09/994,600 dated May 15, 2007; 14 pages.

USPTO Final Rejection for U.S. Appl. No. 09/994,600 dated Dec. 8, 2006; 14 pages.

USPTO Non-Final Rejection for U.S. Appl. No. 09/994,600 dated Jul. 17, 2006; 14 pages.

USPTO Final Rejection for U.S. Appl. No. 09/994,600 dated Feb. 13, 2006; 13 pages.

USPTO Non-Final Rejection for U.S. Appl. No. 09/994,600 dated Aug. 23, 2005; 13 pages.

USPTO Final Rejection for U.S. Appl. No. 09/994,600 dated May 4, 2005; 16 pages.

USPTO Non-Final Rejection for U.S. Appl. No. 09/994,600 dated Oct. 21, 2004; 37 pages.

USPTO Notice of Allowance for U.S. Appl. No. 10/001,477 dated Nov. 10, 2008; 7 pages.

USPTO Final Rejection for U.S. Appl. No. 10/001,477 dated Jun. 30, 2008; 19 pages.

USPTO Non-Final Rejection for U.S. Appl. No. 10/001,477 dated Dec. 6, 2007; 17 pages.

USPTO Final Rejection for U.S. Appl. No. 10/001,477 dated Jul. 23, 2007; 19 pages.

USPTO Non-Final Rejection for U.S. Appl. No. 10/001477 dated Jan. 22, 2007; 17 pages.

USPTO Final Rejection for U.S. Appl. No. 10/001,477 dated Aug. 24, 2006; 15 pages.

USPTO Non-Final Rejection for U.S. Appl. No. 10/001,477 dated Mar. 2, 2006; 17 pages.

USPTO Final Rejection for U.S. Appl. No. 10/001,477 dated Oct. 24, 2005; 18 pages.

USPTO Non-Final Rejection for U.S. Appl. No. 10/001,477 dated May 11, 2005; 31 pages.

Ito, Sergio Akira and Carro, Luigi; "A Comparison of Microcontrollers Targeted to FPGA-Based Embedded Applications", Sep. 2000, Proceedings of 13th Symposium on Integrated Circuits and Systems Design, Sep. 18-24, 2000; 6 pages.

Julio Faure et al.; "A Novel Mixed Signal Programmable Device With On-Chip Microprocessor", 1997, IEEE 1997 Custom Integrated Circuits Conference; 4 pages.

Monte Mar, Bert Sullam, Eric Blom; "An architecture for a configurable Mixed-signal device", 2003, IEEE Journal of Solid-State Circuits, vol. 3; 4 pages.

Robinson, Gordon D; "Why 1149.1 (JTAG) Really Works", May 1994, Conference Proceedings Electro/94 International, May 10-12, 1994, Combined Volumes; 6 pages.

USPTO Non-Final Rejection for U.S. Appl. No. 09/994,601 dated Oct. 4, 2007; 20 pages.

"PSoC designer: Integrated development environment, getting started 25-minute tutorial, version 1.0", Cypress Microsystems., Cypress Microsystems, Inc. CMS10006A, Jul. 3, 2001; 25 pages.

"PSoC technology complete changes 8-bit MCU system design", Cypress Microsystems, Inc. retrieved from <http>://www.archive.org/web/20010219005250/http://cypressmicro.com- /t...>, Feb. 19, 2001; 21 pages.

Specks et al., "A Mixed Digital-Analog 16B Microcontroller with 0.5MB Flash Memory, On-Chip Power Supply, Physical Nework Interface, and 40V I/O for Automotive Single-Chip Mechatronics," IEEE, Feb. 9, 2000; 1 page.

Hsieh et al., "Modeling Micro-Controller Peripherals for High-Level Co-Simulation and Synthesis," IEEE, 1997; 4 pages.

USPTO Notice of Allowance for U.S. Appl. No. 09/989,777 dated Nov. 4, 2008; 3 pages.

USPTO Notice of Allowance for U.S. Appl. No. 09/989,777 dated Sep. 15, 2008; 28 pages.

USPTO Notice of Allowance for U.S. Appl. No. 09/989,777 dated Jul. 7, 2008; 23 pages.

USPTO Final Rejection for U.S. Appl. No. 09/989,777 dated Jan. 30, 2008; 14 pages.

USPTO Non-Final Rejection for U.S. Appl. No. 09/989,777 dated Sep. 11, 2007; 18 pages.

USPTO Final Rejection for U.S. Appl. No. 09/989,777 dated Mar. 13, 2007; 24 pages.

USPTO Non-Final Rejection for U.S. Appl. No. 09/989,777 dated Sep. 13, 2006; 18 pages.

USPTO Non-Final Rejection for U.S. Appl. No. 09/989,777 dated Apr. 11, 2006; 21 pages.

USPTO Final Rejection for U.S. Appl. No. 09/989,777 dated Dec. 21, 2005; 29 pages.

USPTO Non-Final Rejection for U.S. Appl. No. 09/989,777 dated Jul. 5, 2005; 36 pages.

USPTO Notice of Allowance for U.S. Appl. No. 09/994,601 dated Dec. 22, 2008; 15 pages.

USPTO Final Rejection for U.S. Appl. No. 09/994,601 dated Apr. 17, 2008; 24 pages.

USPTO U.S. Appl. No. 10/033,027: "Microcontrollable Programmable System on a Chip," Warren Snyder; filed on Oct. 22, 2001; 117 pages.

USPTO U.S. Appl. No. 10/803,030: "Programmable Microcontrollable Architecture (Mixed Analog/Digital)," Snyder et al., filed Mar. 16, 2004; 13 pages.

USPTO Notice of Allowance for U.S. Appl. No. 09/930,021 dated Nov. 26, 2004; 4 pages.

USPTO Final Rejection for U.S. Appl. No. 09/930,021 dated Aug. 31, 2004; 8 pages.

USPTO Non-Final Rejection for U.S. Appl. No. 09/930,021 dated Apr. 26, 2004; 6 pages.

USPTO Miscellaneous Action with SSP for U.S. Appl. No. 09/930,021 dated Oct. 1, 2001; 1 page.

USPTO Notice of Allowance for U.S. Appl. No. 09/953,423 dated Jul. 12, 2004; 6 pages.

USPTO Non-Final Rejection for U.S. Appl. No. 09/953,423 dated Feb. 6, 2004; 5 pages.

USPTO Notice of Allowance for U.S. Appl. No. 09/957,084 dated May 18, 2004; 5 pages.

USPTO Final Rejection for U.S. Appl. No. 09/957,084 dated Jan. 29, 2004; 8 pages.

USPTO Non-Final Rejection for U.S. Appl. No. 09/957,084 dated Aug. 27, 2003; 8 pages.

USPTO Final Rejection for U.S. Appl. No. 09/957,084 dated Apr. 23, 2003; 8 pages.

USPTO Non-Final Rejection for U.S. Appl. No. 09/957,084 dated Aug. 23, 2002; 6 pages.

USPTO Notice of Allowance for U.S. Appl. No. 09/969,313 dated Oct. 4, 2005; 6 pages.

USPTO Non-Final Rejection for U.S. Appl. No. 09/969,313 dated May 6, 2005; 9 pages.

USPTO Requirement for Restriction/Election for U.S. Appl. No. 09/969,313 dated Mar. 18, 2005; 6 pages.

USPTO Notice of Allowance for U.S. Appl. No. 09/969,311 dated Mar. 1, 2005; 4 pages.

USPTO Non-Final Rejection for U.S. Appl. No. 09/969,311 dated Sep. 21, 2004; 4 pages.

USPTO Advisory Action for U.S. Appl. No. 09/969,311 dated Jul. 21, 2003; 2 pages.

USPTO Final Rejection for U.S. Appl. No. 09/969,311 dated Apr. 7, 2003; 7 pages.

USPTO Non-Final Rejection for U.S. Appl. No. 09/969,311 dated Nov. 6, 2002; 8 pages.

USPTO Notice of Allowance for U.S. Appl. No. 09/972,319 dated Dec. 30, 2004;4 pages.

USPTO Non-Final Rejection for U.S. Appl. No. 09/972,319 dated Sep. 16, 2004; 9 pages.

USPTO Notice of Allowance for U.S. No. Appl. 09/972,003 dated Jul. 14, 2004; 4 pages.

USPTO Requirement for Restriction/Election for U.S. No. Appl. 09/972,003 dated May 6, 2004; 4 pages.

USPTO Non-Final Rejection for U.S. Appl. No. 09/972,003 dated Feb. 2, 2004; 10 pages.

USPTO Non-Final Rejection for U.S. Appl. No. 09/972,003 dated Aug. 19, 2003; 11 pages.

USPTO Notice of Allowance for U.S. Appl. No. 09/972,133 dated Jun. 9, 2006; 6 pages.

USPTO Final Rejection for U.S. Appl. No. 09/972,133 dated Mar. 30, 2006; 8 pages.

USPTO Non-Final Rejection for U.S. Appl. No. 09/972,133 dated Nov. 25, 2005; 9 pages.

USPTO Advisory Action for U.S. Appl. No. 09/972,133 dated Aug. 31, 2005; 3 pages.

USPTO Final Rejection for U.S. Appl. No. 09/972,133 dated Jun. 29, 2005; 10 pages.

USPTO Non-Final Rejection for U.S. Appl. No. 09/972,133 dated Mar. 8, 2005; 9 pages.

USPTO Notice of Allowance for U.S. Appl. No. 09/975,104 dated Oct. 19, 2006; 6 pages.

USPTO Non-Final Rejection for U.S. Appl. No. 09/975,104 dated Jun. 16, 2006; 8 pages.

USPTO Final Rejection for U.S. Appl. No. 09/975,104 dated Feb. 15, 2006; 7 pages.

USPTO Non-Final Rejection for U.S. Appl. No. 09/975,104 dated Aug. 16, 2005; 6 pages.

USPTO Non-Final Rejection for U.S. Appl. No. 09/975,104 dated Mar. 21, 2005; 7 pages.

USPTO Notice of Allowance for U.S. Appl. No. 09/975,030 dated Feb. 6, 2006; 7 pages.

USPTO Non-Final Rejection for U.S. Appl. No. 09/975,030 dated Oct. 20, 2005; 7 pages.

USPTO Non-Final Rejection for U.S. Appl. No. 09/975,030 dated Mar. 29, 2005; 13 pages.

USPTO Notice of Allowance for U.S. Appl. No. 09/977,111 dated Sep. 28, 2006; 6 pages.

USPTO Notice of Allowance for U.S. Appl. No. 10/272,231 dated Mar. 8, 2004; 6 pages.

USPTO Final Rejection for U.S. Appl. No. 10/272,231 dated Nov. 5, 2003; 5 pages.

USPTO Non-Final Rejection for U.S. Appl. No. 10/272,231 dated Jul. 14, 2003; 6 pages.

USPTO Notice of Allowance for U.S. Appl. No. 11/125,554 dated Feb. 7, 2008; 4 pages.

USPTO Notice of Allowance for U.S. Appl. No. 11/125,554 dated Apr. 24, 2007; 7 pages.
USPTO Non-Final Rejection for U.S. Appl. No. 11/125,554 dated Dec. 11, 2006; 9 pages.
USPTO Notice of Allowance for U.S. Appl. No. 09/855,868 dated Apr. 25, 2005; 6 pages.
USPTO Non-Final Rejection for U.S. Appl. No. 09/855,868 dated Aug. 26, 2004; 7 pages.
USPTO Notice of Allowance for U.S. Appl. 09/887,923 dated Sep. 27, 2004; 5 pages.
USPTO Non-Final Rejection for U.S. Appl. No. 09/887,923 dated May 25, 2004; 7 pages.
USPTO Notice of Allowance for U.S. Appl. No. 09/875,599 dated Oct. 17, 2006; 4 pages.
USPTO Non-Final Rejection for U.S. Appl. No. 09/875,599 dated May 31, 2006; 18 pages.
USPTO Final Rejection for U.S. Appl. No. 09/875,599 dated Feb. 15, 2006; 18 pages.
USPTO Final Rejection for U.S. Appl. No. 09/875,599 dated Nov. 21, 2005; 16 pages.
USPTO Advisory Action for U.S. Appl. No. 09/875,599 dated Jun. 8, 2005; 3 pages.
USPTO Final Rejection for U.S. Appl. No. 09/875,599 dated Mar. 29, 2005; 20 pages.
USPTO Non-Final Rejection for U.S. Appl. No. 09/875,599 dated Dec. 3, 2004; 16 pages.
USPTO Final Rejection for U.S. Appl. No. 09/875,599 dated Aug. 25, 2004; 17 pages.
USPTO Final Rejection for U.S. Appl. No. 09/875,599 dated Apr. 26, 2004; 15 pages.
USPTO Non-Final Rejection for U.S. Appl. No. 09/875,599 dated Oct. 27, 2003; 13 pages.
USPTO Notice of Allowance for U.S. Appl. No. 10/004,197 dated Feb. 9, 2007; 7 pages.
USPTO Notice of Allowance for U.S. Appl. No. 10/004,197 dated Oct. 6, 2006; 7 pages.
USPTO Non-Final Rejection for U.S. Appl. No. 10/004,197 dated Apr. 3, 2006; 13 pages.
USPTO Final Rejection for U.S. Appl. No. 10/004,197 dated Nov. 23, 2005; 17 pages.
USPTO Non-Final Rejection for U.S. Appl. No. 10/004,197 dated Jun. 6, 2005; 21 pages.
USPTO Notice of Allowance for U.S. Appl. No. 10/004,039 dated Aug. 15, 2006; 7 pages.
USPTO Non-Final Rejection for U.S. Appl. No. 10/004,039 dated Apr. 11, 2006; 14 pages.
USPTO Final Rejection for U.S. Appl. No. 10/004,039 dated Nov. 22, 2005; 19 pages.
USPTO Non-Final Rejection for U.S. Appl. No. 10/004,039 dated Jun. 6, 2005; 17 pages.
USPTO Notice of Allowance for U.S. Appl. No. 10/001,568 dated Mar. 17, 2006; 9 pages.
USPTO Final Rejection for U.S. Appl. No. 10/001,568 dated Oct. 26, 2005 ; 16 pages.
USPTO Non-Final Rejection for U.S. Appl. No. 10/001,568 dated May 19, 2005; 16 pages.
USPTO Notice of Allowance for U.S. Appl. No. 09/887,955 dated Oct. 12, 2004; 5 pages.
USPTO Non-Final Rejection for U.S. Appl. No. 09/887,955 dated May 26, 2004; 5 pages.
USPTO Notice of Allowance for U.S. Appl. No. 09/826,397 dated Oct. 7, 2004; 8 pages.
USPTO Non-Final Rejection for U.S. Appl. No. 09/826,397 dated Apr. 21, 2004; 6 pages.
USPTO Notice of Allowance for U.S. Appl. No. 09/893,048 dated Jul. 25, 2006; 4 pages.
USPTO Non-Final Rejection for U.S. Appl. No. 09/893,048 dated Jan. 12, 2006; 6 pages.
USPTO Non-Final Rejection for U.S. Appl. No. 09/893,048 dated Jul. 27, 2005; 6 pages.
USPTO Non-Final Rejection for U.S. Appl. No. 09/893,048 dated Oct. 6, 2004; 5 pages.
USPTO Notice of Allowance for U.S. Appl. No. 09/893,050 dated Jul. 5, 2005; 6 pages.
USPTO Non-Final Rejection for U.S. Appl. No. 09/893,050 dated Jan. 5, 2005; 13 pages.
USPTO Final Rejection for U.S. Appl. No. 09/893,050 dated Aug. 30, 2004; 13 pages.
USPTO Non-Final Rejection for U.S. Appl. No. 09/893,050 dated Jan. 15, 2004; 9 pages.
USPTO Notice of Allowance for U.S. Appl. No. 09/909,047 dated May 11, 2005; 25 pages.
USPTO Notice of Allowance for U.S. Appl. No. 09/909,047 dated Feb. 15, 2005; 6 pages.
USPTO Non-Final Rejection for U.S. Appl. No. 09/909,047 dated Jul. 6, 2004; 9 pages.
USPTO Notice of Allowance for U.S. Appl. No. 09/912,768 dated Sep. 13, 2005; 5 pages.
USPTO Non-Final Rejection for U.S. Appl. No. 09/912,768 dated Apr. 11, 2005; 14 pages.
USPTO Final Rejection for U.S. Appl. No. 09/912,768 dated Nov. 17, 2004; 13 pages.
USPTO Non-Final Rejection for U.S. Appl. No. 09/912,768 dated Jun. 22, 2004; 11 pages.
USPTO Notice of Allowance for U.S. Appl. No. 09/922,579 dated Dec. 28, 2004; 6 pages.
USPTO Non-Final Rejection for U.S. Appl. No. 09/922,579 dated Aug. 18, 2004; 6 pages.
USPTO Notice of Allowance for U.S. Appl. No. 09/923,461 dated May 12, 2005; 6 pages.
USPTO Non-Final Rejection for U.S. Appl. No. 09/923,461 dated Jul. 16, 2004; 6 pages.
USPTO Notice of Allowance for U.S. Appl. No. 09/929,891 dated Dec. 23, 2005; 4 pages.
USPTO Notice of Allowance for U.S. Appl. No. 09/929,891 dated Jun. 15, 2005; 6 pages.
USPTO Non-Final Rejection for U.S. Appl. No. 09/929,891 dated Sep. 13, 2004; 6 pages.
USPTO Notice of Allowance for U.S. Appl. No. 10/803,030 dated Jan. 8, 2007; 6 pages.
USPTO Non-Final Rejection for U.S. Appl. No. 10/803,030 dated Jun. 8, 2005; 4 pages.
USPTO Notice of Allowance for U.S. Appl. No. 10/011,214 dated Apr. 11, 2005; 4 pages.
USPTO Final Rejection for U.S. Appl. No. 10/011,214 dated Jan. 21, 2005; 8 pages.
USPTO Non-Final Rejection for U.S. Appl. No. 10/011,214 dated Aug. 13, 2004; 10 pages.
Hong et al., "Hierarchial System Test by an IEEE 1149.5 MTM-Bus Slave-Module Interface Core," IEEE, 2000; 14 pages.
Haberl et al., "Self Testable Boards with Standard IEEE 1149.5 Module Test and Maintenance (MTM) Bus Interface," IEEE, 1994; 6 pages.
Varma et al., "A Structured Test Re-Use Methodology for Core-Based System Chips," IEEE, 1998; 9 pages.
Andrews, "Roadmap for Extending IEEE 1149.1 for Hierarchical Control of Locally-Stored, Standardized command Set, Test Programs," IEEE, 1994; 7 pages.
Adham et al., "Preliminary Outline of the IEEE P1500 Scalable Architecture for Testing Embedded Cores," IEEE; 6 pages.
Ghosh et al., "A Low Overhead Design for Testability and Test Generation Technique for Core-based Systems," IEEE, 1997; 10 pages.
Zorian, "Test Requirements for Embedded Core-based Systems and IEEE P1500," IEEE, 1997; 9 pages.
Zorian et al., "Testing Embedded-Core Based System Chips," IEEE, 1998; 14 pages.
Papachristou et al., "Microprocessor Based Testing for Core-Based System on a Chip," IEEE, 1999; 6 pages.
Maroufi et al., "Solving the I/O Bandwidth Problem in System on a Chip Testing," IEEE, 2000; 6 pages.
Marsh, "Smart Tools Illuminate Deeply Embedded Systems," EDN, 2000; 7 pages.
York et al., "On-chip Support Needed for SOC Debug," Electronic Engineering Times, 1999; 2 pages.

Atmel Corporation: AT9OSC Summary: "Secure Microcontrollers for Smart Cards," 1999; 7 pages.
Hwang et al., "Integrated circuit for automatically varying resistance in computer system, has pair of transistors connected in parallel with respective resistors such that resistors are bypassed when corresponding transistors are enabled," Derwent information LTD; 2002; 2 pages.
Morrison, "IBM Eyes Merchant Packaging Services," Jul. 13, 1998; Electronic News <http://www.findarticles.com>; 4 pages.
Charles, Jr. et al., "Wirebonding: Reinventing the Process for MCMs," Apr. 1998; IEEE 7th International Conference on Multichip Modules and High Density Packaging; 3 pages.
Tran et al., "Fine Pitch and Wirebonding and Reliability of Aluminum Capped Copper Bond Pads," May 2000, IEEE Electronic Components and Technology Conference; 8 pages.
Song et al., "A 50% Power Reduction Scheme for CMOS Relaxation Oscillator," IEEE, 1999; 4 pages.
"Electronic Circuit Protector-Circuit Breaker;" IBM Technical Disclosure Bulletin; vol. 36, Issue 8, Aug. 1, 1993; 1 page.
USPTO Final Rejection for U.S. Appl. No. 10/001,478 dated Apr. 20, 2009; 16 pages.
USPTO Notice of Allowance for U.S. Appl. No. 09/994,600 dated Apr. 3, 2009; 5 pages.
USPTO Notice of Allowance for U.S. Appl. No. 09/989,777 dated Mar. 9, 2009; 7 pages.
USPTO Notice of Allowance for U.S. Appl. No. 09/992,076 dated Feb. 27, 2009; 6 pages.
USPTO Non-Final Rejection for U.S. Appl. No. 09/989,771 dated Apr. 30, 2009; 11 pages.
USPTO Notice of Allowance for U.S. Appl. No. 09/989,762 dated Mar. 25, 2009; 7 pages.
USPTO Notice of Allowance for U.S. Appl. No. 09/989,762 dated Oct. 24, 2008; 7 pages.
USPTO U.S. Appl. No. 09/989,815: "A Data Driven Method and System for Monitoring Hardware Resource Usage for Programming an Electric Device," Bartz et al., filed on Nov. 19, 2001; 36 pages.
USPTO Notice of Allowance for U.S. Appl. No. 09/989,762 dated Jun. 2, 2008; 6 pages.
USPTO Notice of Allowance for U.S. Appl. No. 09/989,762 dated Jan. 2, 2008; 6 pages.
USPTO Non-Final Rejection for U.S. Appl. No. 09/989,762 dated Jul. 23, 2007; 15 pages.
USPTO Final Rejection for U.S. Appl. No. 09/989,762 dated Jan. 26, 2007; 13 pages.
USPTO Non-Final Rejection for U.S. Appl. No. 09/989,762 dated Aug. 10, 2006; 18 pages.
USPTO Final Rejection for U.S. Appl. No. 09/989,762 dated Mar. 14, 2006; 19 pages.
USPTO Non-Final Rejection for U.S. Appl. No. 09/989,762 dated Jul. 27, 2005; 15 pages.
USPTO U.S. Appl. No. 09/275,336: "Programmable Oscillator Scheme," Mar et al., filed on Mar. 24, 1999; 25 pages.
USPTO U.S. Appl. No. 09/721,316: "Programmable Oscillator Scheme," Mar et al., filed on Nov. 22, 2000; 26 pages.
USPTO U.S. Appl. No. 10/324,455: "Programmable Oscillator Scheme," Mar et al., filed on Dec. 20, 2002; 23 pages.
USPTO U.S. Appl. No. 09/998,859: "A System and a Method for Checking Lock Step Consistency between in Circuit Emulation and a Microcontroller while Debugging Process is in Progress," Craig Nemecek, filed on Nov. 15, 2001; 33 pages.
USPTO U.S. Appl. No. 09/998,834: "A System and a Method for Communication between and Ice and a Production Microcontroller while in a Halt State," Craig Nemecek, filed on Nov. 15, 2001; 33 pages.
USPTO U.S. Appl. No. 10/113,065: "System and Method for Automatically Matching Components in a Debugging System," Nemecek et al., filed on Mar. 29, 2002; 32 pages.
USPTO U.S. Appl. No. 09/989,574: "Method and System for using a Graphics user Interface for Programming an Electronic Device," Bartz et al., filed on Nov. 19, 2001; 43 pages.
USPTO U.S. Appl. No. 09/989,816: "Datasheet Browsing and Creation with Data-Driven Datasheet Tabs within a Microcontroller Design Tool," Bartz et al., filed on Nov. 19, 2001; 55 pages.

"New Object Domain R3 Beta Now Available (Build 134)!" Mar. 13, 2001; <http://web.archive.org/ web/200100331202605/www.objectdomain.com/domain30/index.html>; 2 pages.
"OMG XML Metadata Interchange (XMI) Specifications" 2000; 17 pages.
Electronic Tools Company; E-Studio User Manuel; 2000; retrieved from http://web.archive.org for site http://e-tools.com on Mar. 23, 2005; 77 pages.
Cover Pages Technology Reports; XML and Electronic Design Automation (EDA); Aug. 2000; retrieved from http://xml.coverpages.org on Mar. 23, 2005; 5 pages.
Microsoft Computer Dictionary "ActiveX" 2002; Microsoft Press; 5th Edition; 3 pages.
Wikipedia "XML" retrieved on Jan. 29, 2007 from http://en.wikipedia.org/wiki/XML; 16 pages.
"VHDL Samples" retrieved on Jan. 29, 2007 from http://www.csee.umbc.edu/help/VHDL/samples/samples.shtml; 10 pages.
Anonymous, "Lotus Notes FAQ— How do you generate unique document numbers?" Sep. 19, 1999; retrieved from www.keysolutions.com on Jul. 9, 2008; 1 page.
Ashok Bindra, "Programmable SoC Delivers A New Level of System Flexibility"; Electronic Design; Nov. 6, 2000; 11 pages.
Cypress MicroSystem, Inc. "Cypress Customer Forums" retrieved from <http://www.cypress.com/forums/messageview>; Nov. 30, 2004; 1 page.
Cypress MicroSystem, Inc. "PsoC Designer: Integrated Development Environment User Guide"; Rev. 1.18; Sep. 8, 2003; 193 pages.
Hamblen, "Rapid Prototyping Using Field-Programmable Logic Devices" Jun. 2000, IEEE; 9 pages.
USPTO Final Rejection for U.S. Appl. No. 09/943,062 dated Apr. 30, 2004; 9 pages.
Snyder et al., "Xilinx's A-to-Z Systems Platform" Cahners Microprocessor, The Insider's Guide to Microprocessor Hardware, Feb. 6, 2001; 6 pages.
"PSoC Technology Completely Changes 8-bit MCU System Design" Cypress MicroSystem, Inc. Feb. 19, 2001; 21 pages.
USPTO Non-Final Rejection for U.S. Appl. No. 09/943,062 dated Dec. 8, 2003; 9 pages.
USPTO Advisory Action for U.S. Appl. No. 09/943,062 dated Sep. 25, 2003; 3 pages.
USPTO Final Rejection for U.S. Appl. No. 09/943,062 dated Jun. 27, 2003; 8 pages.
USPTO Non-Final Rejection for U.S. Appl. No. 09/943,062 dated Jan. 27, 2003; 7 pages.
USPTO Non-Final Rejection for U.S. Appl. No. 09/943,062 dated Sep. 11, 2002; 9 pages.
"PSoC Designer: Integrated Development Environment" User Guide; Revision 1.11; Last Revised Jul. 17, 2001; 109 pages.
Cypress Microsystems, "Cypress Microsystems Unveils Programmable System-on-a-Chip for Embedded Internet, Communications and Consumer Systems;" 2000, <http://www.cypressmicro.com/corporate/CY_Announces_nov_13_2000.html>; 3 pages.
Huang et al., ICEBERG, An Embedded In-Circuit Emulator Synthesizer for Microcontrollers, Proceedings of the 36th Design Automation Conference 1999; 6 pages.
Yoo et al., "Fast Hardware-Software Co-verification by Optimistic Execution of Real Processor," Proceedings of Design, Automation and Test in Europe Conference and Exhibition 2000; 6 pages.
USPTO Advisory Action for U.S. Appl. No. 09/943,062 dated Mar. 27, 2008; 3 pages.
USPTO Final Rejection for U.S. Appl. No. 09/943,062 dated Jan. 18, 2008; 8 pages.
USPTO Non-Final Rejection for U.S. Appl. No. 09/943,062 dated Jun. 22, 2007; 12 pages.
USPTO Miscellaneous Action for U.S. Appl. No. 09/943,062 dated Jan. 30, 2006; 2 pages.
USPTO Notice of Allowance for U.S. Appl. No. 10/113,064 dated Sep. 21, 2006; 7 pages.
USPTO Non-Final Rejection for U.S. Appl. No. 10/113,064 dated Apr. 6, 2005; 19 pages.
USPTO Final Rejection for U.S. Appl. No. 10/113,064 dated Oct. 18, 2005; 22 pages.

USPTO Non-Final Rejection for U.S. Appl. No. 10/113,064 dated Apr. 25, 2005; 15 pages.
USPTO U.S. Appl. No. 10/113,064: "Method and System for Debugging through Supervisory Operating Codes and Self Modifying Codes," Roe et al., filed on Mar. 29, 2002; 36 pages.
USPTO U.S. Appl. No. 10/002,726: "Method and Apparatus for Generating Microcontroller Configuration Information," Ogami et al., filed Oct. 24, 2001; 54 pages.
USPTO Notice of Allowance for U.S. Appl. No. 10/002,726 dated Feb. 6, 2007; 7 pages.
USPTO Non-Final Rejection for U.S. Appl. No. 10/002,726 dated Aug. 28, 2006; 10 pages.
USPTO Final Rejection for U.S. Appl. No. 10/002,726 dated Mar. 27, 2006; 8 pages.
USPTO Final Rejection for U.S. Appl. No. 10/002,726 dated Nov. 30, 2005; 10 pages.
USPTO Non-Final Rejection for U.S. Appl. No. 10/002,726 dated Jun. 10, 2005; 10 pages.
USPTO Non-Final Rejection for U.S. Appl. No. 10/002,726 dated Dec. 13, 2004; 7 pages.
USPTO U.S. Appl. No. 11/818,005: "Techniques for Generating Microcontroller Configuration Information," Ogami et al., filed Jun. 12, 2007; 61 pages.
USPTO Requirement for Restriction/Election for U.S. Appl. No. 11/818,005 dated Jul. 14, 2009; 5 pages.
U.S. Appl. No. 11/322,044 filed Dec. 28, 2005, Stiff, Jonathon.
USPTO U.S. Appl. No. 11/850,260: "Circuit and Method for Improving the Accuracy of a Crystal-less Oscillator Having Dual-Frequency Modes," Wright et al., filed on Sep. 5, 2007; 33 pages.
USPTO Non-Final Rejection for U.S. Appl. No. 11/850,260 dated Mar. 6, 2009; 7 pages.
USPTO Non-Final Rejection for U.S. Appl. No. 111644,100 dated Mar. 9, 2009; 11 pages.
USPTO Advisory Action for U.S. Appl. No. 11/644,100 dated Feb. 9, 2009; 3 pages.
USPTO Final Rejection for U.S. Appl. No. 11/644,100 dated Nov. 18, 2008; 12 pages.
USPTO Non-Final Rejection for U.S. Appl. No. 11/644,100 dated Apr. 14, 2008; 10 pages.
USPTO Notice of Allowance for U.S. Appl. No. 11/415,588 dated Mar. 11, 2008; 6 pages.
USPTO Advisory Action for U.S. Appl. No. 11/415,588 dated Jan. 14, 2008; 3 pages.
USPTO Final Rejection for U.S. Appl. No. 11/415,588 dated Oct. 19, 2007; 8 pages.
USPTO Non-Final Rejection for U.S. Appl. No. 11/415,588 dated Jun. 13, 2007; 8 pages.
USPTO Notice of Allowance for U.S. Appl. No. 12/218,404 dated Mar. 19, 2009; 7 pages.
USPTO Non-Final Rejection for U.S. Appl. No. 12/218,404 dated Sep. 30, 2008; 8 pages.
USPTO U.S. Appl. No. 11/644,100: "Differential-to-single ended signal converter circuit and method," Jonathon Stiff, filed on Dec. 21, 2006; 33 pages.
USPTO U.S. Appl. No. 11/415,588: "Voltage Controlled Oscillator Delay Cell and Method," Sivadasan et al., filed on May 1, 2006; 24 pages.
USPTO U.S. Appl. No. 12/218,404: "Voltage Controlled Oscillator Delay Cell and Method," Sivadasan et al., filed on Jul. 14, 2008; 23 pages.
USPTO Notice of Allowance for U.S. Appl. No. 11/132,894 dated Apr. 26, 2007; 4 pages.
USPTO Non-Final Rejection for U.S. Appl. No. 11/132,894 dated Dec. 19, 2006; 12 pages.
USPTO U.S. Appl. No. 11/132,894: "Open Loop Bandwidth Test Architecture and Method for Phase Locked Loop (PLL)," Jonathon Stiff, filed on May 19, 2005; 38 pages.
USPTO Non-Final Rejection for U.S. Appl. No. 11/322,044 dated May 4, 2009; 18 pages.
USPTO Non-Final Rejection for U.S. Appl. No. 11/322,044 dated Nov. 25, 2008; 15 pages.
USPTO Non-Final Rejector for U.S. Appl. No. 11/322,044 dated Apr. 11, 2008; 11 pages.
USPTO Advisory Action for U.S. Appl. No. 11/322,044 dated Nov. 30, 2007; 2 pages.
USPTO Final Rejection for U.S. Appl. No. 11/322,044 dated Sep. 21, 2007; 14 pages.
USPTO Non-Final Rejection for U.S. Appl. No. 11/322,044 dated Apr. 24, 2007; 13 pages.
USPTO U.S. Appl. No. 11/322,044: "Split charge pump PLL architecture," Jonathon Stiff, filed on Dec. 28, 2005; 19 pages.
USPTO Notice of Allowance for U.S. Appl. No. 10/305,589 dated Feb. 4, 2005; 5 pages.
USPTO Final Rejection for U.S. Appl. No. 10/305,589 dated Oct. 21, 2004; 7 pages.
USPTO Non-Final Rejection for U.S. Appl. No. 10/305,589 dated Oct. 7, 2003; 6 pages.
USPTO U.S. Appl. No. 10/305,589: "Current Controlled Delay Circuit," Jonathon Stiff, filed on Nov. 26, 2002; 18 pages.
USPTO U.S. Appl. No. 09/849,164: "Reduced Static Phase Error CMOS PLL Charge Pump," Jonathon Stiff, filed on May 4, 2001; 30 pages.
Maneatis, "Low-Jitter Process-Independent DLL and PLL Based on Self-Biased Techniques," IEEE Journal of Solid-State Circuits, vol. 31, No. 11, Nov. 1996; 10 pages.
Larsson, "A 2-1600-MHz CMOS Clock Recovery PLL with Low-V dd Capability," IEEE Journal of Solid-State Circuits, vol. 34, No. 12, Dec. 1999; 10 pages.
USPTO Notice of Allowance for U.S. Appl. No. 10/327,217 dated Aug. 12, 2004; 6 pages.
USPTO Non-Final Rejection for U.S. Appl. No. 10/327,217 dated Apr. 30, 2004; 5 pages.
USPTO Miscellaneous Action for U.S. Appl. No. 10/327,217 dated Feb. 10, 2004; 1 page.
USPTO U.S. Appl. No. 10/327,217: "Single Ended Clock Signal Generator Having a Differential Output," Richmond et al., filed on Dec. 20, 2002; 27 pages.
USPTO Notice of Allowance for U.S. Appl. No. 10/871,582 dated Mar. 30, 2006; 6 pages.
USPTO Final Rejection for U.S. Appl. No. 10/871,582 dated Feb. 1, 2006; 5 pages.
USPTO Non-Final Rejection for U.S. Appl. No. 10/871,582 dated Sep. 7, 2005; 7 pages.
USPTO U.S. Appl. No. 10/871,582: "LVDS Input Circuit with Extended Common Mode Range," Reinschmidt et al., filed on Jun. 17, 2004; 25 pages.
USPTO Notice of Allowance for U.S. Appl. No. 09/404,891 dated Mar. 4, 2005; 6 pages.
USPTO Final Rejection for U.S. Appl. No. 09/404,891 dated Dec. 8, 2004; 7 pages.
USPTO Non-Final Rejection for U.S. Appl. No. 09/404,891 dated Jun. 25, 2004; 6 pages.
USPTO Non-Final Rejection for U.S. Appl. No. 09/404,891 dated Jan. 5, 2004; 5 pages.
USPTO Non-Final Rejection for U.S. Appl. No. 09/404,891 dated Jul. 10, 2003; 6 pages.
USPTO Non-Final Rejection for U.S. Appl. No. 09/404,891 dated Mar. 5, 2003; 6 pages.
USPTO Non-Final Rejection for U.S. Appl. No. 09/404,891 dated Oct. 11, 2002; 5 pages.
USPTO U.S. Appl. No. 09/404,891: "Method, Architecture and Circuitry for Controlling Pulse Width in a Phase and/or Frequency Detector," Scott et al., filed on Sep. 24, 1999; 17 pages.
USPTO Notice of Allowance for U.S. Appl. No. 10/226,911 dated Aug. 20, 2004; 4 pages.
USPTO Non-Final Rejection for U.S. Appl. No. 10/226,911 dated Mar. 19, 2004; 6 pages.
USPTO U.S. Appl. No. 10/226,911: "Calibration of Integrated Circuit Time Constants," Gehring et al.; filed on Aug. 22, 2002; 32 pages.
USPTO Notice of Allowance for U.S. Appl. No. 09/943,149 dated Jan. 12, 2004; 7 pages.
USPTO Non-Final Rejection for U.S. Appl. No. 09/943,149 dated Aug. 28, 2003; 9 pages.
USPTO Final Rejection for U.S. Appl. No. 09/943,149 dated May 7, 2003; 10 pages.

USPTO Non-Final Rejection for U.S. Appl. No. 09/943,149 dated Nov. 20, 2002; 7 pages.
USPTO U.S. Appl. No. 09/943,149: "Method for Phase Locking in a Phase Lock Loop," Moyal et al., filed on Aug. 30, 2001; 21 pages.
Durham et al., "Integrated Continuous-Time Balanced Filters for 16-bit DSP Interfaces," IEEE, 1993: 6 pages.
Durham et al., "Circuit Architectures for High Linearity Monolithic Continuous-Time Filtering," IEEE, 1992; 7 pages.
Durham et al., "High-Linearity Conitnuous-Time Filter in 5-V VLSI CMOS," IEEE, 1992; 8 pages.
USPTO U.S. Appl. No. 09/047,595: "Roving Range Control to Limit Receive PLL Frequency of Operation," Paul H. Scott, filed on Mar. 29, 1998; 35 pages.
USPTO U.S. Appl. No. 09/216,460: "Circuit and Method for Controlling an Output of a Ring Oscillator," Abugharbieh et al., filed on Dec. 18, 1998; 21 pages.
USPTO U.S. Appl. No. 09/471,914: "Reference-Free Clock Generator and Data Recovery PLL," Dalmia et al., filed on Dec. 23, 1999; 32 pages.
USPTO U.S. Appl. No. 09/471,576: "Reference-Free Clock Generation and Data Recovery PLL," Kamal Dalmia, filed on Dec. 23, 1999; 30 pages.
USPTO U.S. Appl. No. 10/083,442: "Method/Architecture for a Low Gain PLL with Wide Frequency Range," Meyers et al., filed on Feb. 26, 2002; 28 pages.
USPTO U.S. Appl. No. 09/470,665: "Digital Phase/Frequency Detector, and Clock Generator and Data Recovery PLL Containing the Same," Kama! Dalmia, fired on Dec. 23, 1999; 26 pages.
USPTO U.S. Appl. No. 09/893,161: "Architecture of a PLL with Dynamic Frequency Control on a PLD," Michael T. Moore, filed on Jun. 27, 2001; 32 pages.
USPTO U.S. Appl. No. 09/608,753: "PLL Lockout Watchdog," Wilson at al., filed on Aug. 24, 2004; 24 pages.
USPTO U.S. Appl. No. 09/398,956: "Frequency Acquisition Rate Control in Phase Lock Loop Circuits," Moyal at al., filed on Sep. 17, 1999; 35 pages.
USPTO U.S. Appl. No. 09/747,262: "Linearized Digital Phase-Locked Loop," Williams et al., filed on Dec. 22, 2000; 9 pages.
USPTO U.S. Appl. No. 09/981,448: "Oscillator Tuning Method," Lane T. Hauck, filed on Oct. 17, 2001; 28 pages.
USPTO U.S. Appl. No. 09/538,989: "Memory Based Phase Locked Loop," Rengarajan S. Krishnan, filed on Mar. 30, 2000; 27 pages.
USPTO U.S. Appl. No. 09/048,905: "Programmable Clock Generator," Mann et al., filed on Mar. 26, 1998; 42 pages.
USPTO U.S. Appl. No. 08/865,342: "Programmable Clock Generator," Mann at al., filed on May 29, 1997; 41 pages.
USPTO Notice of Allowance for U.S. Appl. No. 10/293,392 dated Mar. 10, 2004; 6 pages.
USPTO Non-Final Rejection for U.S. Appl. No. 10/293,392 dated Oct. 16, 2003; 6 pages.
USPTO U.S. Appl. No. 10/293,392: "Low Voltage Receiver Circuit and Method for Shifting the Differential Input Signals of the Receiver Depending on a Common Mode Voltage of the input Signals," Maher et al., filed on Nov. 13, 2002; 20 pages.
USPTO Notice of Allowance for U.S. Appl. No. 10/288,003 dated Jan. 14, 2005; 6 pages.
USPTO Final Rejection for U.S. Appl. No. 10/288,003 dated Oct. 6, 2004; 6 pages.
USPTO Non-Final Rejection for U.S. Appl. No. 10/288,003 dated Apr. 7, 2004; 9 pages.
USPTO U.S. Appl. No. 10/288,003: "Low Voltage Differential Signal Driver Circuit and Method," Roper et al., filed on Nov. 4, 2002; 30 pages.
USPTO Notice of Allowance for U.S. Appl. No. 09/989,777 dated Jun. 9, 2009; 7 pages.
USPTO Advisory Action for U.S. Appl. No. 11/200,619 dated May 11, 2009; 3 pages.
USPTO Final Rejection for U.S. Appl. No. 11/200,619 dated Mar. 3, 2009; 14 pages.
USPTO Non-Final Rejection for U.S. Appl. No. 11/200,619 dated Aug. 27, 2008; 13 pages.

USPTO U.S. Appl. No. 11/200,619: "Providing hardware independence to automate code generation of processing device firmware," Snyder et al., filed on Aug. 10, 2005; 41 pages.
USPTO Notice of Allowance for U.S. Appl. No. 11/201,922 dated Apr. 9, 2009; 4 pages.
USPTO Non-Final Rejection for U.S. Appl. No. 11/201,922 dated Oct. 21, 2006; 12 pages.
USPTO Final Rejection for U.S. Appl. No. 11/201,922 dated Apr. 30, 2008; 10 pages.
USPTO Non-Final Rejection for U.S. Appl. No. 11/201,922 dated Oct. 15, 2007; 10 pages.
USPTO U.S. Appl. No. 11/201,922: "Design model for a hardware device-independent method of defining embedded firmware for programmable systems," McDonald et al., filed on Aug. 10, 2005; 31 pages.
USPTO Non-Final Rejection for U.S. Appl. No. 11/201,627 dated Dec. 12, 2008; 17 pages.
USPTO Final Rejection for U.S. Appl. No. 11/201,627 dated Apr. 29, 2008; 21 pages.
USPTO Non-Final Rejection for U.S. Appl. No. 11/201,627 dated Nov. 16, 2007; 16 pages.
USPTO U.S. Appl. No. 11/201,627: "Method and an apparatus to design a processing system using a graphical user interface," Ogami et al., filed on Aug. 10, 2005; 37 pages.
USPTO Notice of Allowance for U.S. Appl. No. 09/989,808 dated Feb. 13, 2006; 4 pages.
USPTO Non-Final Rejection for U.S. Appl. No. 09/989,808 dated Oct. 19, 2005; 8 pages.
USPTO Non-Final Rejection for U.S. Appl. No. 09/989,808 dated Apr. 14, 2005; 8 pages.
USPTO U.S. Appl. No. 09/989,808: "Automatic generation of application program interfaces, source code, interrupts, and data sheets for microcontroller programming," Bartz et al., filed on Nov. 19, 2001; 67 pages.
USPTO Notice of Allowance for U.S. Appl. No. 10/109,979 dated Mar. 14, 2006; 6 pages.
USPTO Non-Final Rejection for U.S. Appl. No. 10/109,979 dated Jun. 30, 2005; 6 pages.
USPTO U.S. Appl. No. 10/109,979: "Graphical user interface with logic unifying functions," Anderson et al., filed on Mar. 29, 2002; 100 pages.
USPTO U.S. Appl. No. 09/989,781: "System and method for decoupling and iterating resources associated with a module," Ogami et al., filed on Nov. 19, 2001; 40 pages.
USPTO U.S. Appl. No. 09/989,775: "User defined names for registers in memory banks derived from configurations," Ogami et al., filed on Nov. 19, 2001; 29 pages.
USPTO Notice of Allowance for U.S. Appl. No. 09/989,819 dated Jan. 11, 2005; 7 pages.
USPTO Non-Final Rejection for U.S. Appl. No. 09/989,819 dated Jul. 13, 2004; 4 pages.
USPTO Miscellaneous Action for U.S. Appl. No. 09/989,819 dated Dec. 14, 2001; 1 page.
USPTO U.S. Appl. No. 09/989,819: "System and method for creating a boot file utilizing a boot template," Ogami et al., filed on Nov. 19, 2001; 43 pages.
USPTO Notice of Allowance for U.S. Appl. No. 09/989,761 dated Jan. 14, 2005; 6 pages.
USPTO Final Rejection for U.S. Appl. No. 09/989,761 dated Aug. 26, 2004; 7 pages.
USPTO Non-Final Rejection for U.S. Appl. No. 09/989,761 dated Mar. 10, 2004; 6 pages.
USPTO Final Rejection for U.S. Appl. No. 09/989,761 dated Oct. 3, 2003; 7 pages.
USPTO Non-Final Rejection for U.S. Appl. No. 09/989,761 dated Apr. 18, 2003. ; 5 pages.
USPTO U.S. Appl. No. 09/989,761: "Storing of global parameter defaults and using them over two or more design projects," Ogami et al., filed on Nov. 19, 2001; 37 pages.
Wang, et al. "Synthesizing Operating System Based Device Drivers in Embedded Systems," 2003, ACM; 8 pages.

Lutovac et al. "Symbolic Computation of Digital Filter Transfer Function Using MATLAB," Proceedings of 23rd International Conference on Microelectronics (MIEL 2002), vol. 2 NIS, Yugoslavia; 4 pages.

Nouta et al. "Design and FPGA-Implementation of Wave Digital Bandpass Filters with Arbitrary Amplitude Transfer Characteristics," Proceedings of IEEE International Symposium on Industrial Electronics; 1998, vol. 2; 5 pages.

Xilinx, Virtex-II Pro Platform FPGA Developer's Kit, "How Data2BRAM Fits in with Hardware and Software Flows," Chapter 2: Using Data2BRAM; Jan. 2003 Release; 2 pages.

PCT Preliminary Report on Patentability (Chapter 1 of the Patent Cooperation Treaty), PCT/US2005/028793, filed Aug. 12, 2005, mailed Dec. 21, 2007; 2 pages.

PCT Written Opinion of the International Searching Authority for PCT/US2005/028793, filed Aug. 12, 2005, mailed Nov. 19, 2007; 7 pages.

PCT International Search Report of the International Searching Authority for PCT/US05/28793, filed Aug. 12, 2005, mailed Nov. 19, 2007; 5 pages.

International Search Report and Written Opinion of the International Searching Authority for PCT/US05/28898, filed Aug. 12, 2005, mailed Mar. 6, 2007; 6 pages.

Burogs et al., "Power Converter Analysis and Design using Matlab: A Transfer Function Approach," Proceedings of IEEE International Symposium on Industrial Electronics 1998, vol. 2; 6 pages.

Efstathiou, "Analog Electronics: Basic Circuits of Operational Amplifiers," <http://web.archive.org/web/20021231045232> Dec. 31, 2002, version, retrieved from the Internet Archives; 10 pages.

PCT International Search Report for PCT/US05/28791, filed Aug. 12, 2005, mailed Mar. 31, 2008; 4 pages.

PCT international Written Opinion for PCT/US05/28791, filed Aug. 12, 2005, mailed Mar. 31, 2008; 8 pages.

Kory Hopkins, "Definition;" Jan. 16, 1997; <http://www.cs.sfu.ca/cs/people/GradStudent.html>; 1 page.

Ebeling et al., "Validating VLSI Circuit Layout by Wirelist Comparison:" Sept. 1983; in proceedings of the IEEE International Conference on Computer Aided Design (ICCAD-83); 2 pages.

"The Gemini Netlist Comparison Project;" <http://www.cs.washington.edu/research/projects/lis/www/gemini/gemini.html> larry@cs.washington.edu; 2 pages.

Ohlrich et al., "Sub-Gemini: Identifying Subcircuits using a Fast Subgraph Isomorphism Algorithm;" Jun. 1993; in proceedings of the 30th IEEE/ACM Design Automation Conference; 7 pages Ebling, "Gemini II: A Second Generation Layout Validation Program:" 1988; in proceedings of the IEEE International Conference on Computer Aided Design (ICCAD-88); 4 pages.

USPTO U.S. Appl. No. 12/132,527: "System and Method for Performing Next Placements and Pruning of Disallowed Placements for Programming an Integrated Circuit;" Ogami et al., filed on Jun. 3, 2008; 44 pages.

USPTO U.S. Appl. No. 12/356,468: "System and Method for Dynamically Generating a Configuration Datasheet," Anderson et al.; filed on Jan. 20, 2009; 27 pages.

International Search Report from the International Search Authority for International U.S. Appl. No. PCT/US08/60680 dated Aug. 15, 2008; 4 pages.

USPTO Notice of Allowance for U.S. Appl. No. 09/475,879 dated Oct. 22, 2004; 7 pages.

USPTO Advisory Action for U.S. Appl. No. 09/475,879 dated Mar. 4, 2002; 3 pages.

USPTO Advisory Action for U.S. Appl. No. 09/475,879 dated Dec. 31, 2001; 3 pages.

USPTO Final Rejection for U.S. Appl. No. 09/475,879 dated Oct. 11, 2001; 10 pages.

USPTO Non-Final Rejection for U.S. Appl. No. 09/475,879 dated Mar. 8, 2001; 6 pages.

USPTO U.S. Appl. No. 09/475,879: "Programmable Logic Device," Lacey et al.; filed on Dec. 30, 1999; 50 pages.

USPTO U.S. Appl. No. 09/475,808: "Configurable Memory for Programmable Logic Circuits," Lacey et al., filed on Dec. 30, 1999; 24 pages.

USPTO Non-Final Rejection for U.S. Appl. No. 09/475,808 dated Jun. 6, 2001; 8 pages.

USPTO Notice of Allowance for U.S. Appl. No. 09/475,808 dated Nov. 6, 2001; 8 pages.

USPTO U.S. Appl. No. 10/137,497: "Reconfigurable Testing System and Method," Pleis et al.; filed on May 1, 2002; 40 pages.

USPTO Non-Final Rejection for U.S. Appl. No. 10/137,497 dated Nov. 5, 2004; 17 pages.

USPTO Final Rejection for U.S. Appl. No. 10/137,497 dated May 5, 2005; 13 pages.

USPTO Non-Final Rejection for U.S. Appl. No. 10/137,497 dated Sep. 22, 2005; 21 pages.

USPTO Final Rejection for U.S. Appl. No. 10/137,497 dated Mar. 13, 2006; 15 pages.

USPTO Non-Final Rejection for U.S. Appl. No. 10/137,497 dated Aug. 2, 2006; 21 pages.

USPTO Notice of Allowance for U.S. Appl. No. 10/137,497 dated Jan. 24, 2007; 12 pages.

USPTO Notice of Allowance for U.S. Appl. No. 10/137,497 dated Jul. 20, 2007; 4 pages.

U.S. Appl. No. 10/653,050; "Method and System for Programming a Memory Device," Snyder at al.; filed on Aug. 29, 2003; 69 pages.

USPTO Non-Final Rejection for U.S. Appl. No. 10/653,050 dated Apr. 6, 2004; 7 pages.

USPTO Notice of Allowance for U.S. Appl. No. 10/653,050 dated Jul. 29, 2004; 3 pages.

U.S. Appl. No. 10/172,670: "Method and System for Programming a Memory Device," Snyder at al.; filed on Jun. 13, 2002; 66 pages.

U.S. Appl. No. 11/986,338: Reconfigurable Testing System and Method, Pleis et al., filed on Nov. 20, 2007; 41 pages.

USPTO Notice of Allowance for U.S. Appl. No. 11/965,291 dated May 5, 2009; 7 pages.

USPTO Non-Final Rejection for U.S. Appl. No. 11/965,291 dated Dec. 17, 2008; 8 pages.

U.S. Appl. No. 11/965,291: "Universal Digital Block Interconnection and Channel Routing," Snyder et al., filed on Dec. 27, 2007; 31 pages.

USPTO Notice of Allowance for U.S. Appl. No. 11/986,338 dated May 7, 2009; 1 page.

USPTO U.S. Appl. No. 11/273,708: "Capacitance Sensor Using Relaxation Oscillators," Snyder et al., filed on Nov. 14, 2005; 33 pages.

USPTO Non-Final Rejection for U.S. Appl. No. 11/273,708 dated Mar. 19, 2007; 16 pages.

USPTO Final Rejection for U.S. Appl. No. 11/273,708 dated Jul. 5, 2007; 8 pages.

USPTO Notice of Allowance for U.S. Appl. No. 11/273,708 dated Aug. 9, 2007; 4 pages.

USPTO U.S. Appl. No. 11/337,272: "Successive Approximate Capacitance Measurement Circuit;" Warren Snyder, filed on Jan. 20, 2006 29 pages.

USPTO Requirement for Restriction/Election for U.S. Appl. No. 11/337,272 dated Sep. 11, 2006; 5 pages.

USPTO Non-Final Rejection for U.S. Appl. No. 11/337,272 dated Oct. 24, 2006; 9 pages.

USPTO Final Rejection for U.S. Appl. No. 11/337,272 dated Feb. 2, 2007; 11 pages.

USPTO Advisory Action for U.S. Appl. No. 11/337,272 dated Apr. 3, 2007; 3 pages.

USPTO Non-Final Rejection for U.S. Appl. No. 11/337,272 dated May 17, 2007; 11 pages.

USPTO Notice of Allowance for U.S. Appl. No. 11/337,272 dated Aug. 15, 2007; 9 pages.

USPTO U.S. Appl. No. 11/983,291: "Successive Approximate Capacitance Measurement Circuit," Warren Snyder, filed on Nov. 7, 2007; 26 pages.

USPTO Non-Final Rejection for U.S. Appl. 11/983,291 dated Mar. 9, 2009; 9 pages.

USPTO U.S. Appl. 11/698,660: "Configurable Bus," Kutz et al., filed on Jan. 25, 2007; 35 pages.

USPTO Non-Final Rejection for U.S. Appl. No. 11/698,660 dated Dec. 2, 2008; 12 pages.

USPTO Final Rejection for U.S. Appl. No. 11/698,660 dated May 28, 2009; 12 pages.
USPTO U.S. Appl. No. 11/709,866: "Input/Output Multiplexer Bus," Dennis Seguin°, filed on Feb. 21, 2007; 33 pages.
USPTO Non-Final Rejection for U.S. Appl. 11/709,866 dated Nov. 7, 2008; 14 pages.
USPTO Notice of Allowance for U.S. Appl. No. 11/709,866 dated Apr. 7, 2009; 8 pages.
Sedra et al., "Microelectronic Circuits," 3rd Edition, Oxford University Press; 20 pages.
Van Ess, David; "Simulating a 555 Timer with PSoC," Cypress Semiconductor Corporation, Application Note AN2286, May 19, 2005; 10 pages.
Cypress Semiconductor Corporation, "FAN Controller CG6457AM and CG6462AM," PSoC Mixed Signal Array Preliminary Data Sheet; May 24, 2005; 25 pages.
Cypress Semiconductor Corporation, "PSoC Mixed-Signal Controllers," Production Description; <http://www.cypress.com/portal/server>; retrieved on Sep. 27, 2005; 2 pages.
Cypress Semiconductor Corporation, "CY8C21x34 Data Sheet," CSR User Module, CSR V.1.0; Oct. 6, 2005; 36 pages.
Chapweske, Adam; "The PS/2 Mouse Interface," Ps/2 Mouse Interfacing, 2001; 11 pages.
Cypress Semiconductor Corporation, "Cypress Introduces PSoC(TM)-Based Capacitive Touch Sensor Solution," Cypress Press Release; May 31, 2005; <http://www.cypress.com/portal/server>; retrieved on Feb. 5, 2007; 4 pages.
Seguine, Ryan; "Layout Guidelines for PSoC CapSense," Cypress Semiconductor Corporation, Application Note AN2292; Jul. 22, 2005; 13 pages.
Lee, Mark; "EMC Design Considerations for PSoC CapSense Applications," Cypress Semiconductor Corporation, Application Note AN2318; Sep. 16, 2005; 6 pages.
Cypress Semiconductor Corporation, "Release Notes srn017," Jan. 24, 2007; 3 pages.
Cypress Semiconductor Corporation, "PSoC CY8C20x34 Technical Reference Manual (TRM)," PSoC CY8C20x34 TRM, Version 1.0, 2006; 220 pages.
USPTO U.S. Appl. No. 11/166,622: "Touch wake for electronic devices," Beard et al., filed on Jun. 23, 2005; 22 pages.
International Written Opinion of the international Searching Authority for International Application No. PCT/US2006/09572 dated Jan. 10, 2008 5 pages.
International Search Report for International Application No. PCT/US2006/09572 dated Jan. 10, 2008; 2 pages.
USPTO Notice of Allowance for U.S. Appl. No. 10/024,093 dated Sep. 10, 2002; 7 pages.
USPTO U.S. Appl. No. 10/024,093: "Configurable Memory for Programmable Logic Circuits," Lacey et al., filed on Dec. 18, 2001; 25 pages.
USPTO U.S. Appl. No. 11/088,028: "Method and Circuit for Rapid Alignment of Signals," Moyal et al., filed on Nov. 13, 2007; 34 pages.
USPT Notice of Allowance for U.S. Appl. No. 11/088,028 dated Jul. 2, 2007; 6 pages.
USPT Notice of Allowance for U.S. Appl. No. 11/088,028 dated Jan. 26, 2007; 6 pages.
USPT Non-Final Rejection for U.S. Appl. No. 11/088,028 dated Jun. 16, 2006; 8 pages.
USPTO U.S. Appl. No. 11/985,340: "Method and Circuit for Rapid Alignment of Signals," Moyal et al., filed on Nov. 13, 2007; 34 pages.
USPTO Notice of Allowance for U.S. Appl. No. 11/985,340 dated Jun. 2, 2009; 7 pages.
USPTO Requirement for Restriction for U.S. Appl. No. 11/985,340 dated Mar. 16, 2009; 7 pages.
USPTO Non-Final Rejection for U.S. Appl. No. 11/865,672 dated Jul. 17, 2009; 6 pages.
USPTO Non-Final Rejection for U.S. Appl. No. 11/859,547 dated Oct. 1, 2009; 9 pages.
USPTO Non-Final Rejection for U.S. Appl. No. 11/967,243 dated Sep. 17, 2009; 9 pages.
USPTO Non-Final Rejection for U.S. Appl. No. 11/967,240 dated Jun. 10, 2009; 7 pages.

USPTO Non-Final Rejection for U.S. Appl. No. 11/8571947 dated Mar. 30, 2009; 18 pages.
USPTO Non-Final Rejection or U.S. Appl. No. 12/104,672 dated Aug. 26, 2009; 11 pages.
USPTO Non-Final Rejection for U.S. Appl. No. 12/060,128 dated Apr. 29, 2009; 11 pages.
International Search Report of the International Searching Authority for International Application No. PCT/US08/60695 dated Jul. 22, 2009; 3 pages.
Written Opinion of the International Searching Authority for International Application No. PCT/US08/60695 dated Jul. 22, 2009; 6 pages.
Azim et al., "A Custom DSP Chip to Implement a Robot Motion Controller Proceedings of the IEEE Custom Integrated Circuits Conference," May 1988, pp. 8.7A-8.7,5; 6 pages.
Catthoor et al., "Architectural Strategies for an Application-Specific Synchronous Multiprocessor Environment," IEEE transactions on Acoustics, Speech, and Signal Processing; vol. 36, No, 2, Feb. 1988, pp. 265-284; 20 pages.
International Search Report of the International Searching Authority for International Application No. PCT/US08/60696 dated Sep. 22, 2008; 2 pages.
International Search Report of the International Searching Authority for International Application No. PCT/US08/60698 dated Sep. 5, 2008; 2 pages.
Shahbahrami et al., "Matrix Register File and Extended Subwords: Two Techniques for Embedded Media Processors," ACM, May 2005; 9 pages.
Jung et al., "A Register File with Transposed Access Mode," 2000, IEEE; 2 pages.
International Search Report of the International Searching Authority for International Application No. PCT/US08/60681 dated Sep. 12, 2008; 2 pages.
Written Opinion of the International Searching Authority for International Application No. PCT/US08/60681 dated Sep. 12, 2008; 4 pages.
USPTO Notice of Allowance for U.S. Appl. No. 11/965,677 dated Sep. 10, 2009; 6 pages.
USPTO Non-Final Rejection for U.S. Appl. No. 11/965,677 dated Mar. 10, 2009; 10 pages.
Written Opinion of the International Searching Authority for International Application No. PCT/US08/60696 dated Sep. 22, 2008; 4 pages.
USPTO Notice of Allowance for U.S. Appl. No. 10/238,966 dated Aug. 5, 2009; 5 pages.
USPTO Notice of Allowance for U.S. Appl. No. 10/033,027 dated Sep. 2, 2009; 4 pages.
USPTO Non-Final Rejection for U.S. Appl. No. 10/001,478 dated Aug. 4, 2009; 17 pages.
USPTO Advisory Action for U.S. Appl. No. 10/001,478 dated Jun. 30, 2009; 3 pages.
USPTO Notice of Allowance for U.S. Appl. No. 10/002,217 dated Sep. 17, 2009; 6 pages.
USPOT Notice of Allowance for U.S. Appl. No. 10/002,217 dated Jun. 8, 2009; 8 pages.
USPTO Notice of Allowance for U.S. Appl. No. 10/001,477 dated Dec. 4, 2009; 7 pages.
USPTO Notice of Allowance for U.S. Appl. No. 10/001,477 dated Aug. 26, 2009; 6 pages.
USPTO Ex Parte Quayle Action for U.S. Appl. No. 09/975,115 dated Aug. 20, 2009; 7 pages.
USPTO Non-Final Rejection for U.S. Appl. No. 09/994,601 dated Jul. 9, 2009; 11 pages.
USPTO Non-Final Rejection for U.S. Appl. No. 11/818,005 dated Nov. 23, 2009; 8 pages.
USPTO Advisory Action for U.S. Appl. No. 09/989,778 dated Jun. 17, 2009; 3 pages.
USPTO Notice of Allowance for U.S. Appl. No. 09/994,600 dated Aug. 25, 2009; 4 pages.
USPTO Notice of Allowance for U.S. Appl. No. 09/989,762 dated Oct. 30, 2009; 6 pages.
USPTO Notice of Allowance for U.S. Appl. No. 09/989,762 dated Jul. 16, 2009; 6 pages.

USPTO Non-Final Rejection for U.S. Appl. No. 09/998,848 dated May 12, 2009; 16 pages.
USPTO Non-Final Rejection for U.S. Appl. No. 09/989,767 dated May 12, 2009; 21 pages.
USPTO Final Rejection for U.S. Appl. No. 09/989,771 dated Nov. 25, 2009; 12 pages.
USPTO Notice of Allowance for U.S. Appl. No. 09/989,765 dated Sep. 3, 2009; 7 pages.
USPTO Non-Final Rejection for U.S. Appl. No. 09/989,782 dated Oct. 27, 2009; 9 pages.
USPTO Final Rejection for U.S. Appl. No. 09/989,782 dated May 15, 2009; 10 pages.
USPTO Notice of Allowance for U.S. Appl. No. 11/986,338 dated Oct. 19, 2009 4 pages.
USPTO Notice of Allowance for U.S. Appl. No. 09/989,777 dated Aug. 6, 2009; 8 pages.
USPTO Notice of Allowance for U.S. Appl. No. 10/008,096 dated Oct. 21, 2009; 6 pages.
USPTO Notice of Allowance for U.S. Appl. No. 10/008,096 dated Jun. 5, 2009; 12 pages.
USPTO Notice of Allowance for U.S. Appl. No. 11/985,340 dated Nov. 9, 2009; 7 pages.
USPTO Advisory Action for U.S. Appl. No. 11/201,627 dated Sep. 21, 2009; 3 pages.
USPTO Final Rejection for U.S. Appl. No. 11/201,627 dated Jul. 7, 2009; 19 pages.
USPTO Miscellaneous Action for U.S. Appl. No. 11/201,922 dated Oct. 1, 2009; 2 pages.
USPTO Non-Final Rejection for U.S. Appl. No. 11/200,619 dated Jun. 17, 2009; 12 pages.
USPTO Non-Final Rejection for U.S. Appl. No. 11/166,622 dated Sep. 29, 2009; 11 pages.
USPTO Advisory Action for U.S. Appl. No. 11/166,622 dated May 27, 2009; 3 pages.
USPTO Final Rejection for U.S. Appl. No. 11/166,622 dated Mar. 10, 2009; 11 pages.
USPTO Notice of Allowance for U.S. Appl. No. 12/218,404 dated Nov. 3, 2009; 8 pages.
USPTO Notice of Allowance for U.S. Appl. No. 12/218,404 dated Jul. 10, 2009; 7 pages.
USPTO Notice of Allowance for U.S. Appl. No. 11/709,866 dated Aug. 4, 2009; 7 pages.
USPTO Non-Final Rejection for U.S. Appl. No. 11/698,660 dated Oct. 7, 2009; 12 pages.
USPTO Advisory Action for U.S. Appl. No. 11/698,660 dated Jul. 31, 2009; 3 pages.
USPTO Notice of Allowance for U.S. Appl. No. 11/983,291 dated Oct. 22, 2009; 7 pages.
USPTO Final Rejection for U.S. Appl. No. 11/983,291 dated Aug. 12, 2009; 10 pages.
USPTO Final Rejection for U.S. Appl. No. 11/322,044 dated Oct. 19, 2009; 10 pages.
USPTO Final Rejection for U.S. Appl. No. 11/644,100 dated Aug. 19, 2009; 12 pages.
USPTO Advisory Action for U.S. Appl. No. 11/850,260 dated Nov. 2, 2009; 3 pages.
USPTO Final Rejection for U.S. Appl. No. 11/850,260 dated Aug. 21, 2009; 9 pages.
USPTO Final Rejection for U.S. Appl. No. 09/989,767 dated Dec. 7, 2009; 22 pages.
USPTO Final Rejection for U.S. Appl. No. 11/698,660 dated Feb. 16, 2010; 14 pages.
USPTO Notice of Allowance for U.S. Appl. No. 09/989,765 dated Dec. 22, 2009; 8 pages.
USPTO Notice of Allowance for U.S. Appl. No. 09/994,600 dated Jan. 4, 2010; 4 pages.
USPTO Notice of Allowance for U.S. Appl. No. 101002,217 dated Jan. 11, 2010; 7 pages.
USPTO Notice of Allowance for U.S. Appl. No. 09/989,777 dated Jan. 15, 2010; 8 pages.
USPTO Notice of Allowance for U.S. Appl. No. 11/965,291 dated Jan. 13, 2010; 4 pages.
USPTO Notice of Allowance for U.S. Appl. No. 09/975,115 dated Jan. 29, 2010; 9 pages.
USPTO Notice of Allowance for U.S. Appl. No. 10/238,966 dated Feb. 1, 2010; 4 pages.
USPTO Final Rejection for U.S. Appl. No. 09/994,601 dated Jan. 5, 2010; 13 pages.
USPTO Non-Final Rejection for U.S. Appl. No. 09/998,848 dated Dec. 10, 2009; 16 pages.
USPTO Notice of Allowance for U.S. Appl. No. 10/008,096 dated Feb. 1, 2010; 6 pages.
USPTO Non-Final Rejection for U.S. Appl. No. 11/201,627 dated Dec. 24, 2009; 22 pages.
USPTO Final Rejection for U.S. Appl. No. 11/200,619 dated Jan. 4, 2010; 18 pages.
USPTO Non-Final Rejection for U.S. Appl. No. 11/644,100 dated Dec. 16, 2009; 13 pages.
USPTO Non-Final Rejection for U.S. Appl. No. 11/850,260 dated Jan. 14, 2010; 8 pages.
USPTO Notice of Allowance for U.S. Appl. No. 10/033,027 dated Feb. 18, 2010; 4 pages.
USPTO Notice of Allowance for U.S. Appl. No. 09/989,762 dated Feb. 22, 2010; 7 pages.
USPTO Notice of Allowance for U.S. Appl. No. 11/986,338 dated Feb. 16, 2010; 4 pages.
USPTO Non-Final Rejection for U.S. Appl. No. 12/136,557 dated Mar. 15, 2010; 10 pages.
USPTO Notice of Allowance for U.S. Appl. No. 11/965,677 dated Feb. 12, 2010; 4 pages.
USPTO Notice of Allowance for U.S. Appl. No. 11/985,340 dated Feb. 19, 2010; 8 pages.
USPTO Notice of Allowance for U.S. Appl. No. 12/218,404 dated Feb. 16, 2010; 7 pages.
USPTO Notice of Allowance for U.S. Appl. No. 11/709,866 dated Feb. 16, 2010; 7 pages.
USPTO Non-Final Rejection for U.S. Appl. No. 10/133,581 dated Aug. 12, 2005; 12 pages.
USPTO Notice of Allowance for U.S. Appl. No. 10/133,581 dated Mar. 5, 2010; 9 pages.
USPTO Non-Final Rejection for U.S. Appl. No. 10/133,581 dated Sep. 1, 2009; 18 pages.
USPTO Final Rejection for U.S. Appl. No. 10/133,581 dated May 11, 2009; 21 pages.
USPTO Non-Final Rejection for U.S. Appl. No. 10/133,581 dated Nov. 26, 2008; 20 pages.
USPTO Final Rejection for U.S. Appl. No. 10/133,581 dated Jun. 11, 2008; 14 pages.
USPTO Non-Final Rejection for U.S. Appl. No. 10/133,581 dated Nov. 27, 2007; 15 pages.
USPTO Final Rejection for U.S. Appl. No. 10/133,581 dated Jul. 13, 2007; 15 pages.
USPTO Non-Final Rejection for U.S. Appl. No. 10/133,581 dated Jan. 10, 2007; 14 pages.
USPTO Final Rejection for U.S. Appl. No. 10/133,581 dated Aug. 10, 2006; 13 pages.
USPTO Non-Final Rejection for U.S. Appl. No. 10/133,581 dated Feb. 24, 2006; 11 pages.
USPTO Notice of Allowance for U.S. Appl. No. 10/001,477 dated Mar. 23, 2010; 6 pages.
USPTO Notice of Allowance for U.S. Appl. No. 09/989,765 dated Mar. 31, 2010; 8 pages.
USPTO Notice of Allowance for U.S. Appl. No. 12/104,672 dated Jan. 11, 2010; 7 pages.
USPTO Notice of Allowance for U.S. Appl. No. 10/256,829 dated May 10, 2010; 4 pages.
USPTO Non-Final Rejection for U.S. Appl. No. 10/256,829 dated Oct. 26, 2009; 8 pages.
USPTO Final Rejection for U.S. Appl. No. 10/256,829 dated Jun. 23, 2009; 8 pages.
USPTO Non-Final Rejection for U.S. Appl. No. 10/256,829 dated Jan. 7, 2009; 7 pages.
USPTO Non-Final Rejection for U.S. Appl. No. 10/256,829 dated Jun. 26, 2008; 11 pages.

USPTO Notice of Allowance for U.S. Appl. No. 10/256,829 dated Oct. 29, 2007; 6 pages.
USPTO Final Rejection for U.S. Appl. No. 10/256,829 dated Jun. 1, 2007; 16 pages.
USPTO Non-Final Rejection for U.S. Appl. No. 10/256,829 dated Nov. 2, 2006; 13 pages.
USPTO Non-Final Rejection for U.S. Appl. No. 10/256,829 dated May 3, 2006; 16 pages.
USPTO Final Rejection for U.S. Appl. No. 10/256,829 dated Jan. 27, 2006; 24 pages.
USPTO Non-Final Rejection for U.S. Appl. No. 10/256,829 dated Jul. 28, 2005; 14 pages.
USPTO Notice of Allowance for U.S. Appl. No. 09/989,817 dated May 9, 2005; 6 pages.
USPTO Non-Final Rejection for U.S. Appl. No. 09/989,817 dated Jan. 12, 2005; 5 pages.
USPTO Non-Final Rejection for U.S. Appl. No. 09/989,817 dated Jun. 8, 2004; 7 pages.
USPTO Notice of Allowance for U.S. Appl. No. 10/327,207 dated Jun. 11, 2007; 4 pages.
USPTO Notice of Allowance for U.S. Appl. No. 10/327,207 dated Dec. 26, 2006; 5 pages.
USPTO Non-Final Rejection for U.S. Appl. No. 10/327,207 dated Jul. 21, 2006; 12 pages.
USPTO Final Rejection for U.S. Appl. No. 10/327,207 dated Mar. 2, 2006; 13 pages.
USPTO Non-Final Rejection for U.S. Appl. No. 10/327,207 dated Sep. 20, 2005; 11 pages.
USPTO Miscellaneous Action for U.S. Appl. No. 10/327,207 dated May 13, 2003; 1 page.
USPTO Notice of Allowance for U.S. Appl. No. 09/989,570 dated May 19, 2005; 4 pages.
USPTO Non-Final Rejection for U.S. Appl. No. 09/989,570 dated Jan. 26, 2005; 9 pages.
USPTO Notice of Allowance for U.S. Appl. No. 09/989,570 dated Sep. 10, 2004; 8 pages.
USPTO Non-Final Rejection for U.S. Appl. No. 09/989,570 dated Mar. 25, 2004; 8 pages.
USPTO Non-Final Rejection for U.S. Appl. No. 09/989,570 dated Oct. 7, 2003; 6 pages.
USPTO Advisory Action for U.S. Appl. No. 09/989,570 dated Aug. 14, 2003; 3 pages.
USPTO Final Rejection for U.S. Appl. No. 09/989,570 dated May 30, 2003; 9 pages.
USPTO Non-Final Rejection for U.S. Appl. No. 09/989,570 dated Jan. 2, 2003; 7 pages.
USPTO Notice of Allowance for U.S. Appl. No. 09/989,571 dated Sep. 13, 2005; 6 pages.
USPTO Non-Final Rejection for U.S. Appl. No. 09/989,571 dated May 23, 2005; 8 pages.
USPTO Final Rejection for U.S. Appl. No. 09/989,571 dated Jan. 26, 2005; 11 pages.
USPTO Non-Final Rejection for U.S. Appl. No. 09/989,571 dated Jul. 12, 2004; 9 pages.
M. Moods Mano, "Computer System Architecture," 1982, Prentice-Hall, 2nd Edition, pp. 261-264 and 435-440; 14 pages.
Dirk Killat, "A One-Chip Solution for Electronic Ballasts in Fluorescent Lamps," Power Electronics, <http://powerelectronics.com/mag/power_onechip_solution_electronic/>, dated Mar. 1, 2004, accessed Sep. 13, 2005; 4 pages.
Fred Eady, "PSoC 101," Circuit Cellar, August 2004, accessed Sep. 13, 2005, <http://www.circuitcellar.com/library/print/0804/eady169/2.htm>; 4 pages.
U.S. Appl. No. 12/058,586: "System and Method for Monitoring a Target Device," Ogami et al., filed on Mar. 28, 2008; 41 pages.
U.S. Appl. No. 12/058,534: "System and Method for Controlling a Target Device," Ogami et al., filed on Mar. 28, 2008; 40 pages.
U.S. Appl. No. 12/004,833: "Systems and Methods for Dynamically Reconfiguring a Programmable System on a Chip," Ogami et al., filed on Dec. 21, 2007; 40 pages.
U.S. Appl. No. 12/058,569: "Configuration of Programmable IC Design Elements," Best et al., filed on Mar. 28, 2008; 19 pages.

U.S. Appl. No. 12/057,149: "Power Management Architecture, Method and Configuration System," Kenneth Ogami, filed on Mar. 27, 2008; 34 pages.
U.S. Appl. No. 12/765,400: "Autonomous Control in a Programmable System," Sullam et al., filed on Apr. 22, 2010; 30 pages.
International Search Report for International Application No. PCT/US10/33626 mailed Jun. 24, 2010; 3 pages.
The Written Opinion of the International Search Report for International Application No. PCT/US10/33626 mailed Jun. 24, 2010; 5 pages.
USPTO Non-Final Rejection for U.S. Appl. No. 12/060,176 dated Mar. 30, 2010; 22 pages.
John Mangino, "Using DMA with High Performance Peripherals to Maximize System Performance," 2007, Texas Instruments, pp. 1-23; 23 pages.
Balough et al., "White Paper: Comparing IP Integration Approaches for FPGA Implementation," Feb. 2007, Version 1.1, Altera, pp. 1-7; 7 pages.
A.F. Harvey, "DMA Fundamentals on Various PC Platforms," 2001, 2004, National Instruments Corporation, pp. 1-19; 19 pages.
Vixel, "InSpeed SOC 320 Embedded Storage Switch," 2003, Vixel, pp. 1-5; 5 pages.
USPTO Notice of Allowance for U.S. Appl. No. 09/943,062 dated Jun. 29, 2010; 4 pages.
USPTO Miscellaneous Action for U.S. Appl. No. 10/113,581 dated Jun. 23, 2010; 6 pages.
USPTO Miscellaneous Action for U.S. Appl. No. 10/001,478 dated Feb. 23, 2010; 5 pages.
USPTO Notice of Allowance for U.S. Appl. No. 10/001,478 dated Jun. 2, 2010; 11 pages.
USPTO Notice of Allowance for U.S. Appl. No. 11/985,340 dated Jun. 9, 2010; 8 pages.
USPTO Notice of Allowance for U.S. Appl. No. 11/850,260 dated Jul. 2, 2010; 8 pages.
USPTO Notice of Allowance for U.S. Appl. No. 12/060,128 dated Oct. 19, 2009; 8 pages.
USPTO Non-Final Rejection for U.S. Appl. No. 09/975,338 dated Apr. 30, 2010; 2 pages.
USPTO Advisory Action for U.S. Appl. No. 11/818,005 dated Jul. 30, 2010; 3 pages.
USPTO Non-Final Rejection for U.S. Appl. No. 12/132,527 dated Apr. 29, 2010; 7 pages.
USPTO Advisory Action for U.S. Appl. No. 11/201,627 dated Aug. 5, 2010; 3 pages.
USPTO Final Rejection for U.S. Appl. No. 11/201,627 dated May 24, 2010; 26 pages.
USPTO Non-Final Rejection for U.S. Appl. No. 11/166,622 dated Jun. 22, 2010; 11 pages.
USPTO Final Rejection for U.S. Appl. No. 11/166,622 dated Mar. 18, 2010; 12 pages.
USPTO Non-Final Rejection for U.S. Appl. No. 11/698,660 dated May 21, 2010; 15 pages.
USPTO Advisory Action for U.S. Appl. No. 11/644,100 dated Jul. 21, 2010; 3 pages.
USPTO Final Rejection for U.S. Appl. No. 11/644,100 dated May 19, 2010; 13 pages.
USPTO Final Rejection for U.S. Appl. No. 11/865,672 dated Dec. 30, 2009; 6 pages.
USPTO Final Rejection for U.S. Appl. No. 11/857,947 dated Oct. 14, 2009; 22 pages.
USPTO Non-Final Rejection for U.S. Appl. No. 11/857,947 dated Feb. 3, 2010; 23 pages.

USPTO Non-Final Rejection for U.S. Appl. No. 11/857,947 dated Jul. 21, 2010; 15 pages.

USPTO Non-Final Rejection for U.S. Appl. No. 12/058,569 dated Aug. 2, 2010; 9 pages.

USPTO Final Rejection for U.S. Appl. No. 11/968,145 dated Aug. 2, 2010; 6 pages.

USPTO Non-Final Rejection for U.S. Appl. No. 11/968,145 dated Mar. 4, 2010; 11 pages.

USPTO Non-Final Rejection for U.S. Appl. No. 12/104,678 dated Jul. 2, 2010; 8 pages.

* cited by examiner

PROGRAMMABLE MICROCONTROLLER ARCHITECTURE(MIXED ANALOG/DIGITAL)

This application is a Continuation of U.S. patent application Ser. No. 10/803,030, filed Mar. 16,2004, "PROGRAMMABLE MICROCONTROLLER ARCHITECTURE (MIXED ANALOG/DIGITAL)" by Snyder, et al. now U.S. Pat. No. 7,221,187

RELATED U.S. APPLICATION

This application claims priority to the copending provisional U.S. patent application Ser. No. 60/243,798, entitled "Advanced Programmable Microcontroller Device," with filing date Oct. 26, 2000, and assigned to the assignee of the present application.

FIELD OF THE INVENTION

The present invention relates to the field of microcontrollers. More particularly, the present invention relates to the integration of programmable analog circuits and programmable digital circuits on a single semiconductor chip.

RELATED ART

Microcontrollers may have embedded processors, memories and special function analog and digital circuits. Typical analog circuits found in prior art microcontrollers include Continuous Time (CT) amplifiers having preset functions with given functional parameters. For instance, a CT analog amplifier might be configured as a fixed function circuit, such as a voltage amplifier, in which certain parameters, such as gain or bandwidth might be altered by programming.

Switched Capacitor (SC) analog circuits are also frequently incorporated into microcontroller designs. SC analog circuits in prior art are somewhat more versatile than CT analog circuits in that it might be possible to alter both the circuit function as well as the parameters of the circuit function by programming. However, both CT and SC analog circuits found in current microcontrollers generally require programming before utilization, and neither can be dynamically programmed (programmed "on-the-fly").

In the conventional art, general purpose digital circuits are frequently included in a microcontroller implementation. Such digital circuits are pre-programmed to realize certain digital functions such as logical operations, arithmetical functions, counting, etc. These digital circuits are generally in the form of a Programmed Logic Array (PLA) or FPGA. Furthermore, such digital circuits that require pre-programming are generally not dynamically programmable (programmable "on-the-fly"). The main difficulty here is in the generality of such a digital circuit, which requires an excessive amount of digital logic, which in turn occupies a large area on a semiconductor chip as well as an increased cost of manufacturing.

Several other design considerations related to microcontroller utilization either go unaddressed, or require separate functionalities to enable them. For instance, existing designs do not offer a programmable analog circuit array with both CT analog circuits and SC analog circuits on the same semiconductor chip with a programmable array of digital circuits. As a result, realization of a function requiring complex communication between analog circuits and digital circuits often requires the use of multiple semiconductor chips. Further, existing microcontroller realizations generally require pre-programming and cannot be dynamically programmed.

What is needed is a method and/or system which can be dynamically programmed to complete a complex communication interface between analog circuits and digital circuits in order to realize a desired microcontroller circuit function. What is also needed is a method and/or system that can utilize both CT and SC analog circuits implemented along with digital circuits on a single semiconductor chip. Further, what is needed is a method and/or system in which the functions and/or function parameters of the analog circuits and the digital circuits can be reconfigured by dynamic programming (programming "on-the-fly"). Further still, what is needed is a circuit and/or system in which a reduction of the digital logic implemented to realize a dynamically programmable digital circuit results in a reduction in required semiconductor chip area.

SUMMARY OF THE INVENTION

Accordingly, the present invention provides a microcontroller consisting of programmable analog blocks and programmable digital blocks interconnected with a programmable interconnect structure fabricated on a single semiconductor chip. Programmable System On-a-Chip (PSoC) architecture offers an excellent analog and digital interface that solves many design needs. The present design provides the complex communication interface between digital and analog blocks that can be reconfigured on-the-fly. The programmable analog array with both Continuous Time (CT) analog blocks and Switched Capacitor (SC) analog blocks are realized on the same semiconductor chip with programmable digital blocks.

A microcontroller with analog/digital Programmable System On-a-Chip (PSoC) architecture including multiple digital PSoC blocks and multiple analog PSoC blocks in a communication array having a programmable interconnect structure is described. The single chip design is implemented by integration of programmable digital and analog circuit blocks that are able to communicate with each other. Robust analog and digital blocks that are flash memory programmable can be utilized to realize complex design applications that otherwise would require multiple chips and/or separate applications. The PSoC architecture includes a novel array having programmable digital blocks that can communicate with programmable analog blocks using a programmable interconnect structure. The programmable analog array contains a complement of Continuous Time (CT) blocks and a complement of Switched Capacitor (SC) blocks that can communicate together. The analog blocks consist of multiblocks that can communicate together. The analog blocks consist of multi-function circuits programmable for one or more different analog functions, and fixed function circuits programmable for a fixed function with variable parameters. The digital blocks include standard multi-function circuits and enhanced circuits having functions not included in the standard digital circuits. The PSoC array is programmed by flash memory and programming allows dynamic reconfiguration. That is, "on-the-fly" reconfiguration of the PSoC blocks is allowed. The programmable analog array with both Continuous Time analog blocks and Switched Capacitor analog blocks are offered on a single chip along with programmable digital blocks. The programmable interconnect structure provides for communication of input/output data between all analog and digital blocks.

More specifically, a first embodiment of the present invention includes a number of programmable analog circuit blocks configured to provide various analog functions, and a number of programmable digital circuit blocks configured to provide various digital functions. A programmable interconnect structure comprising a routing matrix and an independent bus provides coupling between analog circuit blocks, digital circuit blocks and external devices. Flash memory is used to program the interconnect structure as well as the analog circuit blocks and the digital circuit blocks. Programming can be accomplished dynamically to reconfigure any of the programmable blocks or the interconnect structure.

A complement of Continuous Time (CT) analog circuit blocks and a complement of Switched Capacitor (SC) analog circuit blocks are configured to communicate with one another as well as with external devices by means of the interconnect structure. Dynamic or "on-the-fly" programming of the interconnect structure is used to direct data between both analog circuit blocks and digital circuit blocks as well as any external devices coupled to the semiconductor chip. A number of the analog circuit blocks are multi-function circuits that can be reconfigured by dynamic programming ("on-the-fly" programming) to perform a number of differing functions. Some of the analog circuit blocks are capable of only a single function, but dynamic or "on-the-fly" programming can reconfigure the parameters of the function. Standard digital circuit blocks are configured to perform various digital operations including logical decisions and arithmetical computations. Enhanced digital circuit blocks are configured similarly to the standard digital circuit blocks and have additional digital functions available. Both standard and enhanced digital circuit blocks are reconfigurable by dynamic or "on-the-fly" programming.

DETAILED DESCRIPTION OF THE INVENTION

Figure 1:
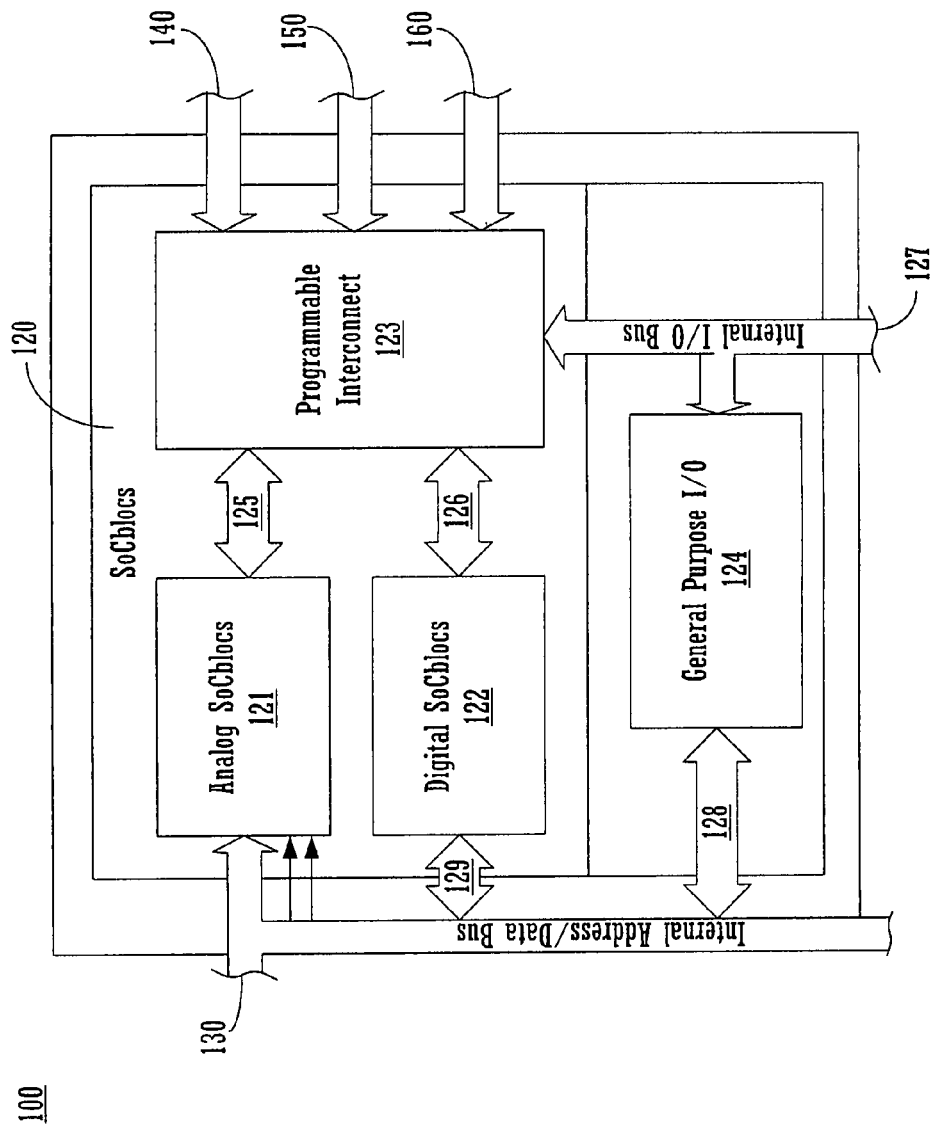
FIG. 1 is a block diagram illustrating the architecture of the Programmable System On-a-Chip (PsoC) according to the present invention.

Reference will now be made in detail to the preferred embodiments of the invention, PSoC architecture (mixed analog/digital), examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be obvious to one of ordinary skill in the art that the present invention may be practiced without these specific details. In other instances, well-known methods, procedures, components, and circuits have not been described in detail so as not to unnecessarily obscure aspects of the present invention.

NOTATION AND NOMENCLATURE

Some portions of the detailed descriptions which follow may be presented in terms of procedures, logic blocks, processing, and other symbolic representations of operations on data bits within a microcontroller, or other electronic device. These descriptions and representations are used by those skilled in the electronic arts to most effectively convey the substance of their work to others skilled in the art. A procedure, logic block, process, etc., is here, and generally, conceived to be a self-consistent sequence of steps or instructions leading to a desired result. The steps are those requiring physical manipulations of physical quantities. Usually, though not necessarily, these quantities take the form of electrical, electronic, or magnetic signals capable of being stored, transferred, combined, compared, and otherwise manipulated in an electronic system. It has proven convenient at times, principally for reasons of common usage, to refer to these signals as bits, bytes, values, elements, symbols, characters, terms, numbers, streams, or the like.

It should be borne in mind, however, that all of these and similar terms are to be associated with the appropriate physical quantities and are merely convenient labels applied to these quantities. Unless specifically stated otherwise as apparent from the following discussions, it is appreciated that throughout the present invention, discussions utilizing terms such as "adjusting," "ascertaining," "calculating," "changing," "commanding," "communicating," "conducting," "controlling," "determining," "dividing," "executing," "forming," "generating," "intercommunicating," "monitoring," "multiplexing," "performing," "programming," "registering," "repeating," "sensing," "setting," "supplying," or the like, refer to the action and processes of microcontrollers, or similar intelligent electronic and/or microelectronic devices, that manipulate(s) and transform(s) data and signals represented as physical (electronic and electrical) quantities within the devices' registers and subcomponents into other data and signals similarly represented as physical quantities within the device subcomponents and registers and other such information storage, transmission or display capabilities.

Exemplary Circuits and Systems

Exemplary Microcontroller

The present invention provides an on-chip integration of programmable digital and analog circuit blocks in a microcontroller that are able to communicate with each other. FIG. 1 is a block diagram 100 illustrating the Programmable System On-a-Chip (PsoC) architecture composed of programmable analog blocks 121 that can communicate with programmable digital blocks 122 by means of a programmable interconnect structure 123 and a General Purpose I/O 124. This novel architecture allows a single chip solution to numerous complex activities that would otherwise require multiple chips or separate applications. The dashed line 120 encloses the four major components 121, 122, 123 and 124 constructed on the single semiconductor chip. An important aspect of the present invention is the integration of both programmable analog circuits and programmable digital circuits on the same semiconductor chip.

The Analog System on a Chip Block (SoCbloc) 121 is coupled 125 to the Programmable Interconnect 124, and it is also coupled to the Internal Address/Data Bus 130. In one embodiment of the present invention, the Analog SoCbloc 121 consists of four Analog Continuous Time (ACT) amplifiers, four type 1 Switched Capacitor (SC1) amplifiers and four type 2 Switched Capacitor (SC2) amplifiers, all of which are dynamically programmable. Dynamic programming allows for "on-the-fly" modification of analog amplifier fixed function parameters such as gain, bandwidth and frequency response. In addition, dynamic programming can be used to change the function of certain analog amplifiers, such as causing an amplifier function to change from simple voltage amplification to digital-to-analog conversion.

The Digital SoCbloc 122 is coupled 126 to the Programmable Interconnect 124 and it is also coupled 129 to the Internal Address/Data Bus 130. In one embodiment of the present invention, the Digital SoCbloc 122 consists of four Standard Multi-Function (MFBs) digital circuits and four Enhanced Multi-Function (MFBe) digital circuits, all of which are dynamically programmable. Dynamic programming allows for "on-the-fly" modification of digital circuit parameters as well as functions. For instance, programming a digital circuit to perform a logical operation, and reprogramming at a later time to perform a digital counting operation.

The Programmable Interconnect 123 is dynamically programmable and can be used to couple any analog amplifier to any digital circuit. The Programmable Interconnect 123 is also used to route data between the Internal I/O Bus 127 and the Internal Address/Data Bus 130 as well as the General Purpose I/O unit 124 which is coupled 128 to the Internal Address/Data Bus 130. Analog Clock signals 140, Interrupt Controller signals 150 and System Clock signals 160 are connected via the Programmable Interconnect 123 for signal routing as well as dynamic programming of Analog SoCblocks 121 and Digital SoCblocs 122.

Exemplary Hardware Routing Resources

Figure 2:
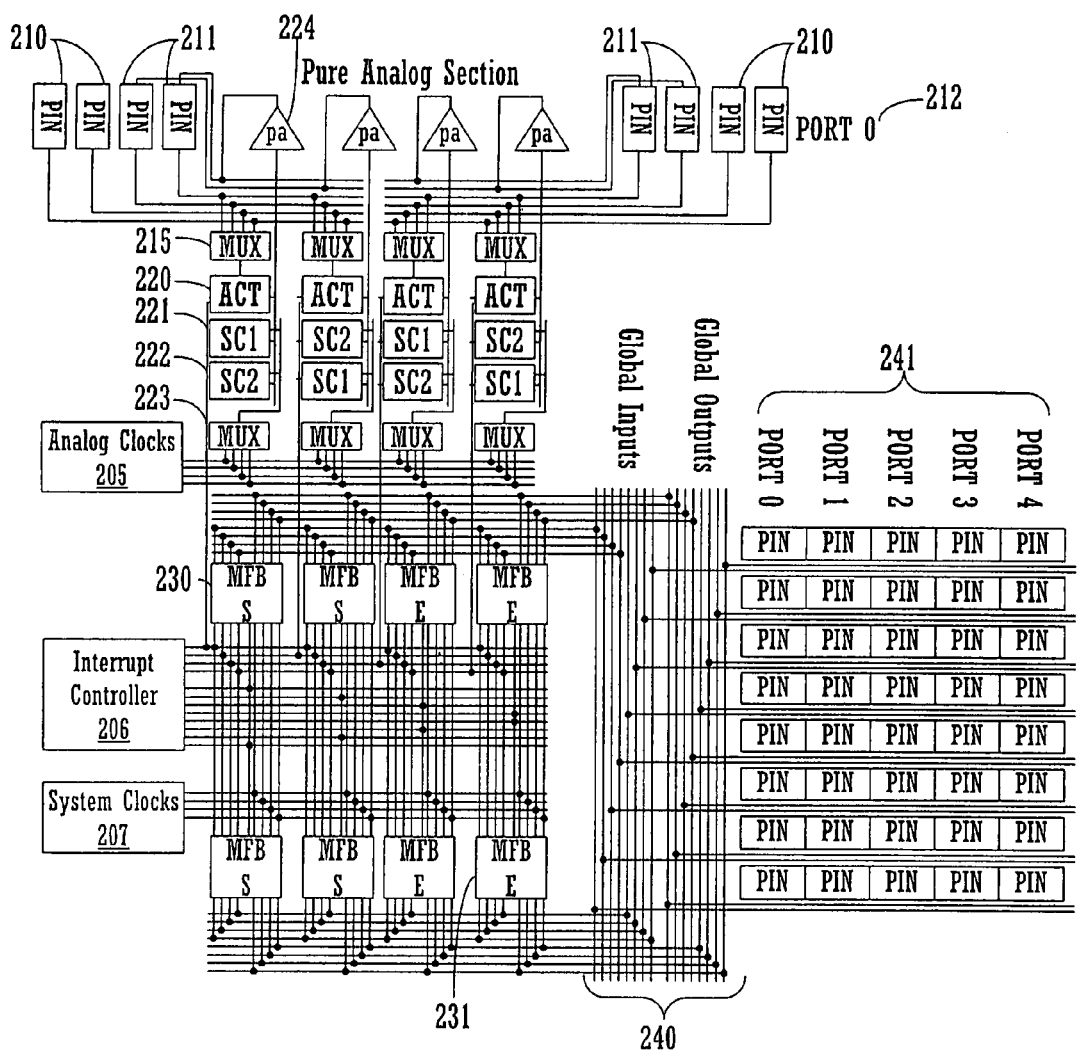
FIG. 2 illustrates one embodiment of the hardware routing resources of the Programmable System On-a-Chip (PsoC) architecture according to the present invention.

FIG. 2 illustrates one embodiment of the hardware routing resources 200 of the Programmable System On-a-Chip (PsoC) architecture according to the present invention. Twelve analog amplifier circuits, four ACT circuits 220, four SC1 circuits 221 and four SC2 circuits 222, correspond to the Analog SoCblocs 121 illustrated in FIG. 1. Analog signals are coupled to the semiconductor chip at port 0, 212, which consists of four input pins 210 and four output pins 211.

An analog signal is coupled between port 0, 212, via a MUX 215 to an analog amplifier ACT 220, SC1, 221 or SC2, 222. These four MUX circuits 215 are contained within the Programmable Interrupt 123 illustrated in FIG. 1. An analog output signal from an analog amplifier ACT 220, SC1, 221 or SC2, 222 can be coupled through a power amplifier pa 224 to an output pin 211 in port 0, 212. The four power amplifiers pa 224 are contained within the General Purpose I/O 124 illustrated in FIG. 1.

The Analog Clocks 205 controlling MUX 223 and MUX 215 provide analog signal routing to interconnect numerous combinations of ACT 220, and SC1, 221 and SC2, 222 analog amplifier circuits. The four MUX circuits 223 are also contained within the Programmable Interrupt 123 illustrated in FIG. 1. Various interconnect combinations can be used to realize numerous complex analog functions, such as signal amplification, signal filtering, signal filter parameters such as the number and location of poles, and so on.

The analog output signal from any analog amplifier ACT 220, SC1, 221 or SC2, 222 is also made available as an input to any one of eight digital circuits, four MFBs 230 and four MFBe 231, under control of the Interrupt Controller 206. These eight digital circuits correspond to the Digital SoCblocs 122 illustrated in FIG. 1. Similarly, a digital output from any one of the eight digital circuits, four MFBs 230 and four MFBe 231, can be presented under control of the Interrupt Controller 206 as an input to any one of the twelve analog amplifiers ACT 220, SC1, 221 or SC2, 222.

The Interrupt Controller 206 and the System Clocks 207 couple digital signals between any one of the eight digital circuits, four MFBs 230 and four MFBe 231, and the Internal I/O Bus 240 which is illustrated 127 in FIG. 1. Digital signals are coupled to the semiconductor chip by means of forty (40) individual pins which form ports 0 through 4, 241.

Exemplary Digital/Analog Function

Figure 3:
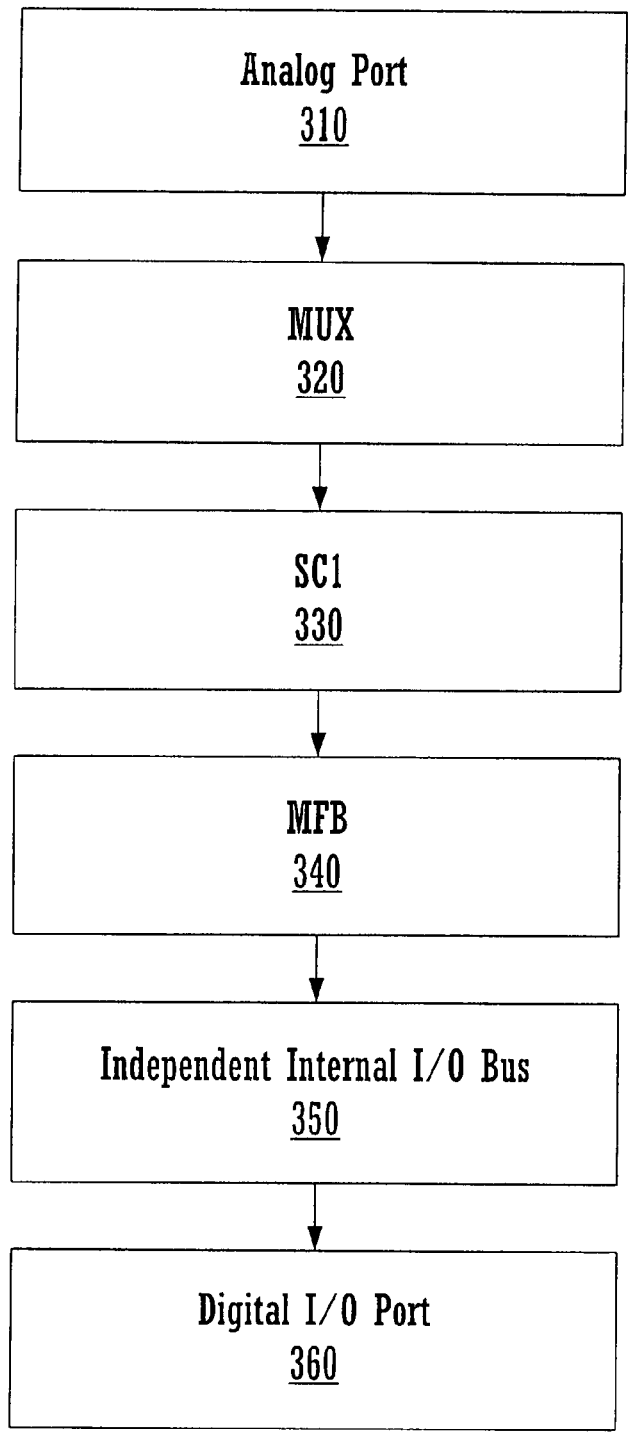
FIG. 3 is a flow chart illustrating steps in a combined digital/analog operation possible with the Programmable System On-a-Chip (PsoC) according to the present invention.

FIG. 3 is a flow chart illustrating steps 300 in a combined analog/digital operation possible with the Programmable System On-a-Chip (PsoC) according to the present invention. Component reference numbers used are as assigned in FIG. 2. An analog signal to be digitized is presented in step 310 at one of the pins of the analog port 0, 210 in FIG. 2. Under control of the Analog Clock 205, the analog input signal is coupled in step 320 via a MUX 215 to the input of an SC1 amplifier 221 configured as an integrator with an internal comparator. In step 330, the output of the SC1 amplifier 221 is represented as a digital input signal which is applied to two MFBs 230 configured as an eight bit digital counter. Under the control of the Interrupt Controller 206 and System Clocks 207, the two MFBs 230 accumulate and store the digital conversion of the analog input signal in step 340. The resulting digital data is then coupled in step 350 via the Independent Internal I/O Bus 240 to a digital output port such as port 0, 241 in FIG. 2.

Exemplary Digital Function

Figure 4:
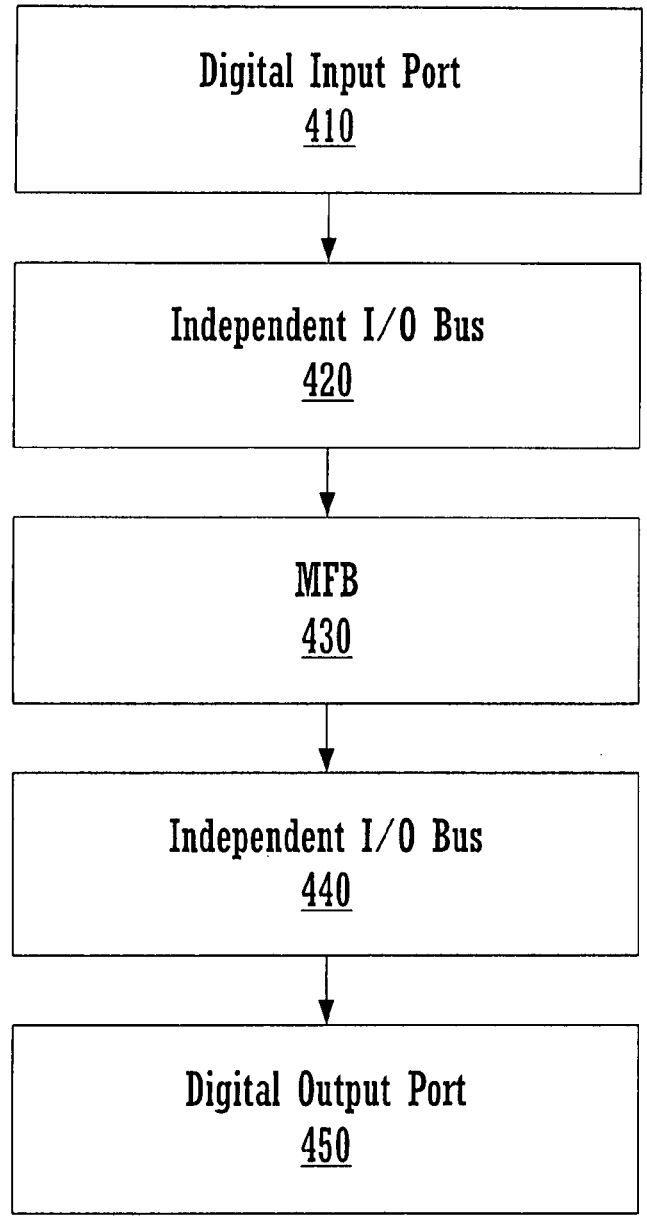
FIG. 4 is a flow chart illustrating steps in a digital operation possible with the Programmable System On-a-Chip (PsoC) according to the present invention.

FIG. 4 is a flow chart illustrating steps 400 in a digital operation possible with the Programmable System On-a-Chip (PsoC) according to the present invention. Component reference numbers used are as assigned in FIG. 2. In the present example, a series of pulses taken from an external device are to be counted and a signal is to be coupled to an output device when the count is found to be equal to a preset value. In step 410, the external series of pulses is coupled to a predetermined port and pin, such as pin 1 of port 0, 241 in FIG. 2. In step 420, the Independent Internal I/O Bus 240 is used to couple the input signal to an MFB 230. Under control of the Interrupt Controller 206 and the System Clocks 207, the MFB 230 counts pulses in sequence and compares the count to a stored preselected count. When the accumulated count equals the stored count, the MFB generates a signal which is coupled in step 450 to a preselected output port and pin by the Independent Internal I/O Bus 240. It is to be appreciated that a series of pulses taken from an external device that are not satisfactory digital signals could be entered as an analog signal which is then routed through an analog amplifier ACT 220, SC1 221 or SC2 222 in order to produce a digital signal that is then routed to a designated MFB 230.

The preferred embodiment of the present invention, PSoC architecture (mixed analog/digital), is thus described. While the present invention has been described in particular embodiments, it should be appreciated that the present invention should not be construed as limited by such embodiments, but rather construed according to the below claims.

What is claimed is:

1. A circuit comprising:
    a plurality of circuit blocks, wherein at least one of the circuit blocks is an analog circuit block and at least one of the circuit blocks is a digital circuit block;
    a bus coupling analog input/output data and digital input/output data for the plurality circuit blocks; and
    a clock controlling the coupling of the analog input/output data and the digital input output data to the bus.

2. A circuit according to claim 1 further comprising:
    a programmable interconnect structure coupled to the plurality of circuit blocks.

3. A circuit according to claim 2 wherein the programmable interconnect structure is configured to dynamically reconfigure the plurality of circuit blocks to implement one of a plurality of functions.

4. A circuit according to claim 1 wherein the circuit comprises a single integrated circuit semiconductor chip.

5. A circuit according to claim 1 wherein the at least one analog circuit block comprises a continuous time analog circuit.

6. A circuit according to claim 1 wherein the at least one analog circuit block comprises a switched capacitor analog circuit.

7. A microcontroller comprising:
a plurality of programmable analog circuit blocks;
a plurality of programmable digital circuit blocks;
a programmable interconnect coupling the analog circuit blocks and the digital circuit blocks; and
a bus coupling analog input/output data and digital input/output data for the analog circuit blocks and the digital circuit block.

8. A microcontroller according to claim 7 wherein one of the digital circuit blocks is configured to implement logical operations.

9. A microcontroller according to claim 7 wherein one of the digital circuit blocks is configured to implement computational operations.

10. A microcontroller according to claim 7 wherein the programmable interconnect structure and the programmable analog circuit blocks and the plurality of programmable digital circuit blocks are constructed on a semiconductor chip.

11. A microcontroller according to claim 7 wherein the programmable analog circuit blocks comprise at least one continuous time analog circuit block.

12. A microcontroller according to claim 7 wherein the programmable analog circuit blocks comprise at least one switched capacitor analog circuit block.

13. A microcontroller according to claim 7 wherein the programmable digital circuit blocks comprise at least one digital multi-function circuit block having a first set of digital functions and at least one digital multi-function circuit block having a second set of digital functions different from the first set.

14. A method of providing a dynamically programmable analog/digital communication interface circuit, comprising:
configuring a plurality of programmable analog circuit blocks to implement at least one of a plurality of analog functions,
configuring a plurality of programmable digital circuit blocks to implement at least one of a plurality of digital functions; and
configuring a routing matrix to couple analog data and digital data between the programmable analog circuit blocks and the programmable digital circuit blocks.

15. The method according to claim 14 wherein flash memory is used to program the routing matrix and the plurality of programmable analog circuit blocks and the plurality of programmable digital circuit blocks and to enable dynamic circuit reconfiguration.

16. The method according to claim 14 wherein the programmable analog circuit blocks comprise at least one continuous time analog circuit and at least one switched capacitor analog circuit.

17. The method according to claim 14 wherein the programmable digital circuit blocks comprise at least one standard digital multi-function circuit having a first set of digital functions and at least one enhanced digital multi-function circuit having at least one function differing from the first set of digital functions.

18. The method according to claim 14 wherein the programmable analog circuit blocks comprise at least one multi-function circuit programmable for at least one of the plurality of analog functions and at least one fixed function circuit programmable for a fixed function with at least one of a number of different parameters.

19. The method according to claim 14 wherein the plurality of digital functions comprises logical operations.

20. The method according to claim 14 wherein the plurality of digital functions comprises computational operations.

* * * * *